(12) United States Patent
Du

(10) Patent No.: US 7,602,184 B2
(45) Date of Patent: Oct. 13, 2009

(54) MAGNETIC RESONANCE SPECTROSCOPIC IMAGING WITH SHORT ECHO TIMES

(75) Inventor: Jiang Du, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 12/112,957

(22) Filed: Apr. 30, 2008

(65) Prior Publication Data

US 2009/0009167 A1     Jan. 8, 2009

Related U.S. Application Data

(60) Provisional application No. 60/914,825, filed on Apr. 30, 2007.

(51) Int. Cl.
    *G01V 3/00* (2006.01)
(52) U.S. Cl. .................................. 324/309; 324/307
(58) Field of Classification Search ......... 324/300–322; 600/410–435
See application file for complete search history.

(56) References Cited

U.S. PATENT DOCUMENTS

| 4,581,581 | A  | * | 4/1986  | Pelc .............................. 324/309 |
| 4,706,026 | A  | * | 11/1987 | Pelc et al. .................... 324/309 |
| 4,751,462 | A  | * | 6/1988  | Glover et al. ................ 324/309 |
| 6,983,182 | B2 | * | 1/2006  | Mistretta ..................... 600/425 |
| 7,358,730 | B2 | * | 4/2008  | Mistretta et al. ............ 324/307 |
| 7,408,347 | B2 | * | 8/2008  | Mistretta et al. ............ 324/307 |
| 2003/0013953 | A1 | * | 1/2003 | Mistretta ..................... 600/425 |
| 2007/0167729 | A1 | * | 7/2007 | Mistretta et al. ............ 600/410 |
| 2007/0255129 | A1 |   | 11/2007 | Du et al. |
| 2007/0255130 | A1 |   | 11/2007 | Du |
| 2008/0045833 | A1 | * | 2/2008  | Defreitas et al. ............ 600/429 |

OTHER PUBLICATIONS

Burr, D.B., "Anatomy and physiology of the mineralized tissues: role in the pathogenesis of osteoarthrosis," Osteoarthritis and Cartilage 12: S20-30 (2004).

Bydder, G.M., "New Approaches to Magnetic Resonance Imaging of Intervertebral Discs, Tendons, Ligaments and Menisci," Spine 27(12):1264-1268 (2003).

Donohue, J.M. et al., "The effects of indirect blunt trauma on adult canine articular cartilage," J Bone Joint Surg Am 65-A: 948-957 (1983).

(Continued)

*Primary Examiner*—Brij B. Shrivastav
*Assistant Examiner*—Dixomara Vargas
(74) *Attorney, Agent, or Firm*—Fish & Richardson P.C.

(57) ABSTRACT

Radio frequency (rf) pulses are applied to a sample to produce magnetic resonance (MR) echo signals from the sample at multiple different echo times. Magnetic field gradients are applied to the sample to select for acquisition components of each MR echo signal. The selected components correspond to groups of radial projections in k-space. Each group is associated with one of the echo times. Each group defines a different set of projection angles in the k-space, and the groups are interleaved to reduce streak artifacts in spectroscopic images associated with a resonance frequency. Images of the sample are generated based on acquired MR signals. In some implementations, an echo time of eight microseconds or less is included in the multiple different echo times.

30 Claims, 34 Drawing Sheets

OTHER PUBLICATIONS

Dreher, W and D. Leibfritz, "A new method for fast proton spectroscopic imaging: spectroscopic GREASE," Magn Reson Med 44:668-672 (2000).

Du, J. et al., "Imaging of the deep radial and calcified layers of the cartilage using ultrashort TE (UTE) sequence at 3T," In: Proceedings of the 15th Annual Meeting of ISMRM (International Society for Magnetic Resonance in Medicine), Berlin, Germany, 2007, p. 3809.

Duyn, J.H. and C.T.W. Moonen, "Fast proton spectroscopic imaging of human brain using multiple spin-echoes," Magn Reson Med 30: 409-414 (1993).

Erickson, S.J. et al., "Effect of tendon orientation on MR imaging signal intensity: a manifestation of the 'Magic Angle' phenomenon," Radiology 181:389-392 (1991).

Erickson, S.J. et al., The 'magic angle' effect: background physics and clinical relevance. Radiology 188:23-25 (1993).

Ferguson, V.L., et al., "Nanomechanical properties and mineral concentration in articular calcified cartilage and subchondral bone," J Anat 203:191-202 (2003).

Fullerton, G.D. et al., "Orientation of tendons in the magnetic field and its effect on T2 relaxation time," Radiology 155:433-435 (1985).

Fullerton, G.D. and A. Rahal, "Collagen structure: the molecular source of the tendon magic angle effect," J Magn Reson Imaging 25:345-361 (2007).

Gatehouse, P.D. et al. "Contrast-enhanced MRI of the menisci of the knee using ultrashort echo time (UTE) pulse sequences: imaging of the red and white zone," The British Journal of Radiology 77:641-647 (2004).

Goodwin, D.W. et al., "Micro-Imaging of Articular Cartilage: T2, Proton Density, and the Magic Angle Effect," Acad Radiology 5:790-798 (1998).

Guilfoyle, D.N. et al., PEEP—A Rapid Chemical Shift Imaging Method. Magn Reson Med 10:282-287 (1989).

Haase, A. and D. Matthaei, "Spectroscopic FLASH NMR imaging (SPLASH imaging)," J Magn Reson 71:550-553 (1987).

Henkelman, R.M. et al., "Anisotropy of NMR properties of Tissues," Magn Reson Med 32:592-601 (1994).

Hiba, B. et al., "Out-and-In Spiral Spectroscopic imaging in Rat Brain at 7 T," Magn Reson Med; 50:1127-1133 (2003).

Li, B. et al., "The electron miscroscope appearance of the subchondral bone plate in the human femoral head in osteoarthritis and osteoporosis," J Anat 195:101-110 (1999).

Martel-Pelletier, J., "Pathophysiology of osteoarthritis," Osteoarthritis Cartilage 12:S31-S33 (2004).

Muir, P et al., "Role of endochondral ossification of articular cartilage and functional adaptation of the subchondral plate in the development of fatigue microcracking of joints," Bone 38:342-349 (2006).

Park, H.W. et al., "Fast gradient-echo chemical-shift imaging," Magn Reson Med 7:340-345 (1988).

Pauly, J. et al., "Slice-Selective Excitation for Very Short $T_2$ Species," Proc. Society of Magnetic Resonance in Medicine, Book of Abstracts, vol. 1, Eight Annual Meeting and Exhibition, Aug. 12-18, 1989, Amsterdam, The Netherlands, 1989, p. 28.

Robson, M.D. et al., "Magnetic resonance imaging of the Achilles tendon using ultrashort TE (UTE) pulse sequences," Clinical Radiology 59: 727-735 (2004).

Rubenstein, J.D., et al., "Effects of collagen orientation on MR imaging characteristics of bovine articular cartilage," Radiology 188:219-226 (1993).

Song, H.K. et al., "Dynamic MRI with projection reconstruction and KWIC processing for simultaneous high spatial and temporal resolution," Magn Reson Med 52:815-824 (2004).

Squires, G.R. et al., "The pathobiology of focal lesion development in aging human articular cartilage and molecular matrix changes characteristic of osteoarthritis," Arthritis Rheum 48(5):1261-1270 (2003).

Xia, Y, et al., "Origin of cartilage laminae in MRI," J Magn Reson Imaging 7:887-894 (1997).

Alley et al., "Gradient characterization using a Fourier-transform technique," Magn. Reson. Med. 39: 581-587 (1998).

Amann, M. et al., "Three-dimensional spiral MR imaging: application to renal multiphase contrast-enhanced angiography," Magn. Reson. Med. 48: 290-296 (2002).

Barger, A.V. et al., "Time-resolved contrast-enhanced imaging with isotropic resolution and broad coverage using an undersampled 3D projection trajectory,". Magn Reson Med. 48:297-305 (2002).

Bergin, C.J. et al., "Lung parenchyma: projection reconstruction MR imaging," Radiology 179:777-781 (1991).

Bothakur, A. et al., "NMR studies of exchangeable hydrogen in bone," In: Proceedings of the 6th Annual Meeting of ISMRM, Sydney, Australia, p. 1804 (1998).

Brittain, J.H. et al., "Ultra-Short TE imaging with single-digit (8 microsecond) TE," In: Proceedings of the 12th Annual Meeting of ISMRM, Kyoto, Japan, 2004, p. 629.

Brossmann, J et al., "Short echo time projection reconstruction MR imaging of cartilage: comparison with fat-suppressed spoiled GRASS and magnetization transfer contrast MR imaging," Radiology 203(2):501-507 (1997).

Brown, T.R. et al., "NMR chemical shift imaging in three dimensions," Proc Natl Acad Sci USA 79:3523-3526 (1982).

Cho, G. "Detection of hydroxyl ions in bone mineral by solid-state NMR spectroscopy," Science 300:1123-1127 (2003).

Conolly, S. et al., "Variable-rate selective excitation," J Magn Reson 78:440-458 (1988).

De Graaf, A.A. et al., "QUALITY: Quantification Improvement by Converting Lineshapes to the Lorentzian Type," Magn Reson Med 13:343-357 (1990).

Du et al., "Time-resolved Three-dimensional Pulmonary MR Angiography Using a Spiral-TRICKS sequence," Proc. Int. Soc. Mag. Reson. Med. 14:3635 (2006).

Du, J. et al., "Contrast Enhanced Peripheral Magnetic Resonance Angiography Using Time-Resolved Vastly Undersampled Isotropic Projection Reconstruction," J. Magnetic Resonance Imaging, 20:894-900 (2004).

Du, J. et al., "Time-resolved, undersampled projection reconstruction imaging for high resolution CE-MRA of the distal runoff vessels," Magn Reson Med 48:516-522 (2002).

Du, J. et al., "Time-resolved undersampled projection reconstruction Magnetic Resonance imaging of the peripheral vessels using multi-echo acquisition," Magn. Reson. Med. 53: 730-734 (2005).

Du , J. et al., "Multi-echo ultrashort TE (UTE) imaging and T2 mapping of knee cartilage," In: Proceedings of the 14th Annual Meeting of Int. Soc. Mag. Reson. Med., Seattle, USA, 2006, p. 57.

Du, J. et al., "Ultrashort Echo Time Spectroscopic Imaging (UTESI) of Cortical Bone," Magnetic Resonance in Medicine 58: 1001-1009 (2007).

Du, J. et al., "Ultrashort TE Spectroscopic Imaging (UTESI): Application to the Imaging of Short T2 Relaxation Tissues in the Musculoskeletal System," Journal of Magnetic Resonance Imaging, *submitted for publication on Nov. 9, 2007, currently in press*, 74 pages.

Du, J. et al., "Ultrashort TE (UTE) Spectroscopic Imaging of Cortical Bone Using a Variable TE Acquisition and Sliding Window Reconstruction," Proc. Intl. Soc. Mag. Reson. Med. 15: 421 (2007), Joint Annual Meeting ISMRM-ESMRMB, May 19-25, 2007, Berlin, Germany.

Du, J. et al., "Spectroscopic Imaging of the Knee Using an Interleaved Ultrashort TE(UTE) Sequence," Proc. Intl. Soc. Mag. Reson. Med. 15: 1240 (2007), Joint Annual Meeting ISMRM-ESMRMB, May 19-25, 2007, Berlin, Germany.

Du, J. et al., "Ultrashort TE Imaging of the Short T2 components in White Matter Using Half Pulse Excitation and Spiral Sampling," Proc. Intl. Soc. Mag. Reson. Med. 14: 334 (2006).

Duyn, J.H. et al., "Simple correction method for k-space trajectory deviations in MRI," J Magn Reson 132:150-153 (1998).

Fantazinni P., R.J.S. Brown RJS, and C. Ganavaglia, "NMR relaxation in trabecular and cortical bone," Abstracts 15th International Bone Densitometry Workshop, Monterey, Jul. 22-26, 2002 in *Calcified Tissue International*, vol. 71, No. 3, Sep. 2002, p. 275.

Gatehouse, P.D. and G.M. Bydder, "Magnetic resonance imaging of short $T_2$ components in tissue,". Clin Radiol 58:1-19 (2003).

Gatehouse, P.D. et al., "Magnetic resonance imaging of the knee with ultrashort TE pulse sequences," Magn Reson Imaging 22:1061-1067 (2004).

Glover, G.H., "Simple analytic spiral k-space algorithm," Magn. Reson. Med. 42: 412-415 (1999).

Gold, G.E. et al., "MR spectroscopic imaging of collagen: tendons and knee menisci," Magn Reson Med 34:647-654 (1995).

Gold, G.E. et al., "MR imaging of articular cartilage of the knee: new methods using ultrashort Tes," AJR 1998; 170:1223-1226 (May 1998).

Gold et al., "Short Echo Time MR Spectroscopic Imaging of the Lung Parenchyma," Journal of Magnetic Resonance Imaging 15: 679-684 (2002).

Gurney, P. et al. "Long-T2 suppressed Ultra Short-TE 3DPR Imaging," Proc. Intl. Soc. Mag. Reson. Med. 13:787 (2005).

Henkelman, R.M. et al., "Magnetization transfer in MRI: a review," NMR in Biomed 14:57-64 (2001).

Herlihy, A.H. et al., "MRI visualization of wood samples with ultrashort TE sequences," Proc. Intl. Soc. Magn. Reson. Med. 13: 2355 (2005).

Jehenson, P. et al., "Analytical method for the compensation of Eddy-current effects induced by pulsed magnetic field gradient in NMR systems,". J Magn Reson 90:264-278 (1990).

Josan, S, et al., "Double Half RF Pulse for Reduced Sensitivity to Linear Eddy Currents in Ultrashort T2 Imaging," Proc. Intl. Soc. Mag. Reson. Med. 14: 3004 (2006).

Joseph, P.M. and J. Whitley, "Experimental simulation evaluation of ECG-gated heart scans with a small number of views," Med Phys 10(4):444-449 (Jul./Aug. 1983).

Kaye, E. et al., "Consistency of Signal Intensity and R2 in Frozen Porcine Kidney and Liver," Proc. Intl. Soc. Mag. Reson. Med. 14: 1423 (2006).

King, K. et al., "Optimized gradient waveforms for spiral scanning," Magn. Reson. Med. 34: 156-160 (1995).

Korosec, F.R. et al., "Time-resolved contract-enhanced 3D MR angiography," Magn. Reson. Med. 36: 345-351 (1996).

Larkman, D.J., "Parallelised sequences," European Society for Magnetic Resonance in Medicine and Biology (ESMRMB Teaching Syllabus 2005) http://www.esmrmb.org/html/img/pool/07_Larkman.pdf.

Larson, P.E. et al., "Using Adiabatic Inversion Pulses to Suppress Long-$T_2$ Species in Ultra-short Echo Time (UTE) Imaging," Proc. Intl. Soc. Mag. Reson. Med. 13: 786 (2005).

Larson, P.E. et al., "Designing long-$T_2$ suppression pulses for ultrashort echo time imaging," Magn Reson Med 56:94-103 (2006).

Lee, J.H. et al., "Fast 3D imaging using variable-density spiral trajectories with applications to limb perfusion," Magn. Reson. Med. 50: 1276-1285 (2003).

Lu, A. et al., "Improved slice excitation for ultra-short TE imaging to B0 and linear eddy current correction," In: Proc. Intl. Soc. Mag. Reson. Med. 14: 2381 (2006).

Lustig, M. et al., "Fast Spiral Fourier Transform For Iterative MR Image Reconstruction," IEEE International Symposium on Biomedical Imaging: Nano to Macro, 2004, pp. 784-787 (Apr. 15-18, 2004).

Maudsley, A.A. et al., "Spatially resolved high resolution spectroscopy by 'four-dimensional' NMR," J Magn Reson 51:147-152 (1983).

Meyer, C.H., "Fast spiral coronary artery imaging," Magn Reson Med 28: 202-213 (1992).

Mierisova, S. and M. Ala-Korpela, "MR spectroscopic quantification: a review of frequency domain methods," NMR in Biomed 14:247-259 (2001).

Mistretta, C.A., "Highly constrained backprojection for time-resolved MRI," Magn Reson Med 55:30-40 (2006).

Mistretta, C.A. et al., "3D Time-Resolved Contrast-Enhanced MR DSA: Advantages and Tradeoffs," Magn. Reson. Med. 40: 571-581 (1998).

Noll, N.C. et al., "Deblurring for non-2D Fourier transform magnetic resonance imaging," Magn Reson Med 25:319-333 (1992).

Panting, J.R. et al., "Abnormal Subendocardial Perfusion in Cardiac Syndrome X Detectedby Cardiovascular Magnetic Resonance Imaging," The New England Journal of Medicine 346: 1948-1953 (2002).

Pauly, J. et al., "Suppression of long T2 components for short T2 imaging," In: Proceedings of the $10^{th}$ annual meeting of SMRI, New York, USA 1992, Abstract No. 330., p. 145.

Peters, D.C. et al., "Undersampled projection reconstruction applied to MR angiography," Magn Reson Med 43:91-101 (2000).

Rahmer, J. et al., "Three-dimensionial radial ultrashort echo-time imaging with $T_2$ adapted sampling," Magn Reson Med 55:1075-1082 (2006).

Reichert, I.L.H., "Magnetic resonance imaging of periosteum with Ultrashort TE pulse sequences," J Magn Reson Imaging 19:99-107 (2004).

Reichert, I.L.H., et al., "Magnetic resonance imaging of cortical bone with ultrashort TE pulse sequences," Magn Reson Imag 23: 611-618 (2005).

Robson, M.D. et al., "Magnetic resonance: an introduction to Ultrashort TE (UTE) imaging," J Comput Assist Tomogr 2003;27(6):825-846 (2003).

Robson, M.D. et al., "Ultrashort TE chemical shift imaging (UTE-CSI)," Magn Reson Med 53:267-274 (2005).

Sartoris, D.J., "Quantitative bone mineral analysis," Chapter 18 In: *Bone and Joint Imaging*, D. Resnick, editor. Philadelphia: WB Saunders; 1996. p. 154-164.

Schroeder, C. et al., "Slice Excitation for Ultrashort TE Imaging," Proc. Intl. Soc. Mag. Reson. Med. 11: 628 (2004).

Schroeder, C. et al., "Scan Time Reduction for Ultrashort TE Imaging at 3T," Proc. Intl. Soc. Mag. Reson. Med. 11: 630 (2004).

Silver, M.S. et al., "Highly selective $\pi/2$ and $\pi$ pulse generation," J Magn Reson 59:347-351 (1984).

Song, H.K. and F.W. Wehrli, Variable TE gradient and spin echo sequence for in vivo MR microscopy of short $T_2$ species. Magn Reson Med 39:251-258 (1998).

Stoyanova, R. et al., "Application of principal-component analysis for NMR spectral quantification," J Magn Reson Series A 115:265-269 (1995).

Sussman, M.S. et al., "Design of practical $T_2$-selective RF excitation (TELEX) pulses," Magn Reson Med 40:890-899 (1998).

Takahashi, A.M., "Ultrashort TE (UTE) imaging at 8 μsec with 3D vastly undersampled isotropic projection reconstruction (VIPR)," Proc. Intl. Soc. Mag. Reson. Med. 13: 2405 (2005).

Techawiboonwong, A. et al., "Quantification of bone-water concentration in a 3T whole-body imager using solid-state imaging," In: Proceedings of the $14^{th}$ Annual Meeting of ISMRM, Seattle, USA, 2006, p. 3620.

Vasnawala et al., "MR imaging of knee cartilage with FEMR," Skeletal Radiol 31: 574-580 (2002).

Vigen, K.K., "Undersampled Projection-Reconstruction Imaging for Time-Resolved Contract-Enhancing Imaging," Magn. Reson. 43: 170-176 (2000).

Waldman et al., "MRI of the brain with ultrashort echo-time pulse sequences," Neuroradiology 45: 887-892 (2003).

Wanspaura, J.P. et al. "Temperature mapping of frozen tissue using Eddy current compensated half excitation RF pulses," Magn Reson Med 46:985-992 (2001).

Wehrli, F.W. and M.A. Fernandez-Seara, "Nuclear magnetic resonance studies of bone water," Annals of Biomed Engineering 33:79-86 (2005).

Wehrli, F.W. Et al., "Quantitative MRI for the assessment of bone structure and function," NMR in Biomed 19:731-764 (2006).

Ying K. et al., "Echo-time reduction for submillimeter resolution imaging with a 3D phase encode time reduced acquisition method," Magn Reson Med 33:82-87 (1995).

Yudilevich, E. and H. Stark, "Spiral sampling: theory and an application to magnetic resonance imaging," Journal of Optical Society of America A 5(4): 542-553 (Apr. 1988).

Zhu, H. et al., "High Temporal and Spatial Resolution 4D MRA Using Spiral Data Sampling and Sliding Window Reconstruction," Magn Reson Med 52: 14-18 (2004).

* cited by examiner

MAGNETIC RESONANCE SPECTROSCOPIC IMAGING WITH SHORT ECHO TIMES

CROSS-REFERENCE TO RELATED APPLICATIONS

This application is related to and claims the benefit of co-pending provisional application Ser. No. 60/914,825, entitled "ULTRASHORT ECHO TIME (UTE) SPECTROSCOPIC IMAGING OF TISSUES WITH SHORT TRANSVERSE RELAXATION TIME (T2), filed Apr. 30, 2007, which is incorporated herein by reference.

BACKGROUND

This application relates to magnetic resonance imaging (MRI). Imaging through MRI techniques is well known and has been widely applied in imaging applications in medical, biological and other fields. A typical MRI technique produces an image of an object under examination by manipulating the magnetic spins in the object and processing measured responses from the magnetic spins. An MRI system may include hardware to generate different magnetic fields for imaging, including a static magnetic field along a z-direction to polarize a portion of the magnetic spins, magnetic field gradients (e.g., along mutually orthogonal x, y, or z directions), and RF magnetic fields to manipulate the spins.

SUMMARY

In one general aspect, radio frequency (rf) pulses are applied to a sample to produce magnetic resonance (MR) echo signals from the sample at multiple different echo times. Magnetic field gradients are applied to the sample to select for acquisition components of each of the MR echo signals. The selected components correspond to groups of radial projections in k-space. Each group is associated with one of the echo times. Each group defines a different set of projection angles in the k-space, and the groups are interleaved to reduce streak artifacts in spectroscopic images associated with a resonance frequency. Temporal images of the sample are generated based on acquired MR signals. The temporal image associated with a given echo time is based at least in part on low frequency data from the group of radial projections associated with the given echo time and high frequency data from at least one other group of radial projections.

In one general aspect, an article comprising a machine-readable medium stores instructions for causing a magnetic resonance imaging apparatus to perform operations. The operations include applying to the sample a pulse sequence comprising rf pulses and magnetic field gradients to produce magnetic resonance echo signals at multiple echo times. The operations include acquiring MR data that includes groups of radial projections defined in k-space. Each group includes radial projections acquired at a different one of the echo times, and the groups are interleaved to reduce streak artifacts in spectroscopic images associated with a resonance frequency. The operations include generating temporal and spectroscopic images of the sample based on the acquired data.

In one general aspect, a magnetic resonance imaging (MRI) system includes a means for applying rf pluses to produce a plurality of MR echo signals from the sample, a means for applying magnetic field gradients to select components of the MR echo signals for acquisition, a means for acquiring the selected MR echo signal components from the sample, and a means for generating images of the sample based on the acquired MR signals.

In one general aspect, an MRI system includes an rf module, a gradient module, and a processor. The rf module acquires MR echo signals from a sample and generates rf pulses configured to produce a plurality of MR echo signals from the sample. The gradient module applies to the sample magnetic field gradients to select for acquisition components of each of the MR echo signals. The processor generates images of the sample based on the acquired magnetic resonance signals.

Implementations may include one or more of the following features. Spectroscopic images of the sample are generated based on the temporal images. Each spectroscopic image is associated with one of multiple different temporal frequencies. Generating a plurality of spectroscopic images of the sample includes Fourier transforming at least a portion of the temporal images. A first subset of the spectroscopic images associated with temporal frequencies far from the resonance frequency include streak artifacts. A second set of the spectroscopic images associated with temporal frequencies near the resonance frequency are substantially free of streak artifacts. The image associated with the given echo time is generated based additionally on high spatial frequency components of the group associated with the given echo time. At least one additional rf pulse is applied to the sample to suppress a signal from nuclear spins in the sample having a first transverse relaxation rate. Acquiring the selected magnetic resonance signals includes acquiring a magnetic resonance signal generated by nuclear spins in the sample having a second transverse relaxation rate faster than the first transverse relaxation rate. The selected magnetic resonance signals are acquired according to a radial ramp sampling algorithm. An rf half pulse is applied during a slice selection gradient, and the rf half pulse is applied again during the slice selection gradient with an inverted polarity. The rf pulse produces a magnetic resonance echo signal from the sample at an echo time of less than ten microseconds after the end of the rf pulse. The projection angles defined by each group are uniformly distributed in the spatial frequency domain from zero radians to $2\pi$ radians. For the given echo time, each group of radial projections associated with the given echo time includes a plurality of data points that sparsely sample the spatial frequency domain. A physical feature of the sample defines a Nyquist sampling criterion for imaging the feature, and the data points sample the spatial frequency domain below the Nyquist sampling criterion. Each of the radial projections comprises a plurality of data points ranging from a first radius in a low spatial frequency region of the k-space to a second radius in a high spatial frequency region of the k-space. The image associated with the given echo time is based at least in part on all of the data points in a first group of radial projections associated with the given echo time and a subset of the data points in a second group of radial projections associated with an echo time other than the given echo time. The subset of data points includes data points ranging from a third radius in the k-space to the second radius. The third radius represents a higher spatial frequency than the first radius and a lower spatial frequency than the second radius. The first group defines projection angles uniformly distributed from zero radians to $2\pi$ radians. The second group defines projection angles uniformly distributed from zero radians to $2\pi$ radians. A tornado filter reduces or suppresses streak artifacts in the images. Each radial projection includes a radial half projection defining a projection angle through the domain from proximate a radial origin of the domain to a radial perimeter of the domain. The rf module implements fast switching between an rf signal transmit mode and an rf signal receive mode.

The details of one or more implementations are set forth in the accompanying drawings and the description below. Other features will be apparent from the description and drawings, and from the claims.

DESCRIPTION OF DRAWINGS

FIGS. 16A-16C are plots illustrating data for assessing T2* values based on a set of MR images of rubber bands, wherein FIGS. 16A and 16B illustrate data in the time domain and FIG. 16C illustrates data in the frequency domain.

FIGS. 17A and 17B are plots illustrating data for assessing T2* values based on a set of MR images of cortical bone, wherein FIG. 17A illustrates data in the frequency domain and FIG. 17B illustrates data in the time domain.

FIGS. 29A-29D are plots illustrating data for assessing T2 values based on a set of MR images of a human knee, wherein FIGS. 29A and 29B illustrate data in the frequency domain and FIGS. 29C and 29D illustrate data in the time domain.

Like reference symbols in the various drawings indicate like elements.

DETAILED DESCRIPTION

Figure 1A:
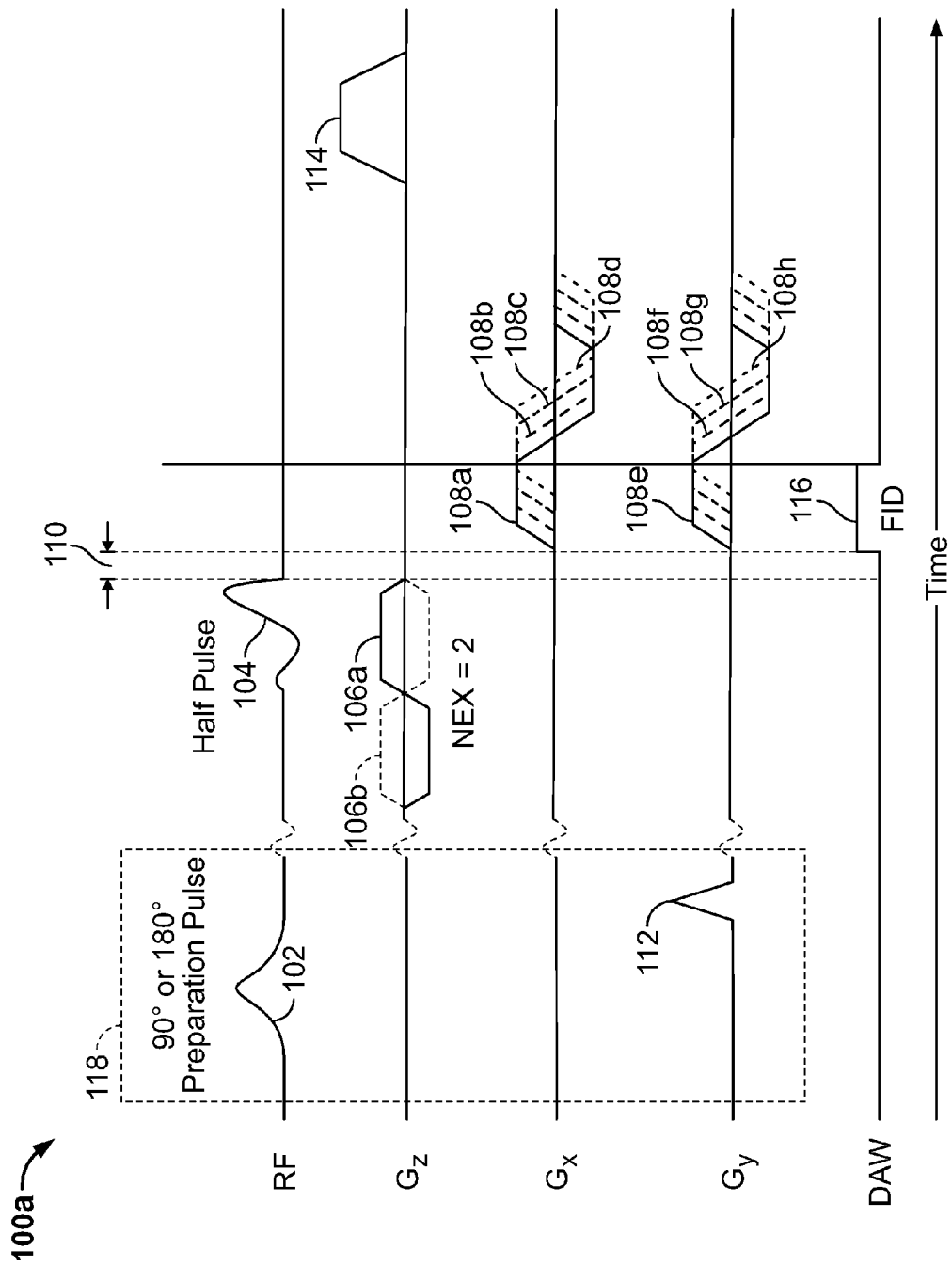
FIGS. 1A-1C are diagrams illustrating example data acquisition schemes for generating magnetic resonance (MR) images with short echo times.

This application describes systems, apparatus and techniques for magnetic resonance imaging (MRI) of materials using short echo times (TEs). For example, magnetic resonance echoes having ultrashort echo times (e.g., 8 µs, 10 µs, 100 µs, 1 ms and/or others) can be generated, acquired, and/or processed in order to image materials that exhibit fast transverse relaxation (i.e., materials having short T2 and/or T2*). Materials that exhibit fast transverse relaxation rates have short T2 values, for example, ranging from approximately 0.1 to 10 milliseconds. Examples of materials that exhibit fast transverse relaxation rates (and accordingly have short T2 values) include cortical bone, deep radial and calcified layers of articular cartilage, menisci, ligaments, tendons, enthuses, and other tissues. In some cases, high resolution images can be generated in a time-efficient manner, for example, in a scan time useful in clinical settings. In some cases, the k-space is sparsely sampled, and data processing methods are used to suppress streak artifacts in the images. In some cases, spectroscopic images are generated and streak artifacts are substantially reduced at frequencies near the resonance frequency. In some cases, streak artifacts are shifted to high and/or low frequencies, away from the resonance frequency. Magnetic resonance spectroscopy can provide information on the amount of signal produced by species with fast transverse relaxation rates, information on the amount of signal produced by species with short transverse relaxation rates, and/or information on other properties of a tissue. Example tissue properties include T2*, bulk magnetic susceptibility effects, proton density, and others. In some implementations, highly undersampled interleaved projection reconstruction with UTE acquisition at progressively increasing TEs provides high spatial resolution spectroscopic imaging of short T2* tissues. Suppression of long T2* signals from fat and muscle can improve contrast visualization of short T2* tissue.

In some implementations, an ultrashort echo time (UTE) data acquisition sequence combines half pulse excitation, radial ramp sampling, variable-rate selective excitation (VERSE), and fast transmit/receive (T/R) switching. The UTE data acquisition sequence allows detection of signals from tissues with very short T2. In the example, multiple images are acquired, and each image is associated with a different TE. A number of projections (e.g., 2025 radial half projections) are interleaved into multiple groups (e.g., forty-five groups, each group having forty-five half projections), with each group associated with a different TE and uniformly covering the k-space. For example, in order to uniformly cover the k-space, the polar angles defined by the radial projections in each group are uniformly distributed from zero to $2\pi$ radians in the k-space. Each highly undersampled interleaved projection is used to reconstruction images using view sharing to suppress streak artifacts.

Short T2 tissues such as cortical bone typically have much lower mobile water proton density, thus much lower signal as compared to fat and muscle. Long T2 signal suppression improves the contrast and dynamic range. Two different approaches for long T2 signal suppression can be used: 1) a long adiabatic 90° pulse followed by gradient dephasing to suppress long T2 fat and muscle signals; and 2) a long adiabatic 180° inversion pulse to invert the long T2 magnetization. Image acquisition follows a time delay (T1) for the magnetization of inverted long T2 components to reach the null point. In some cases, a multi-echo variable TE UTE acquisition improves the spectral resolution and reduces the scan time. For example, two or more echoes can be acquired per repetition time (TR), with projections interleaved.

Figure 1B:
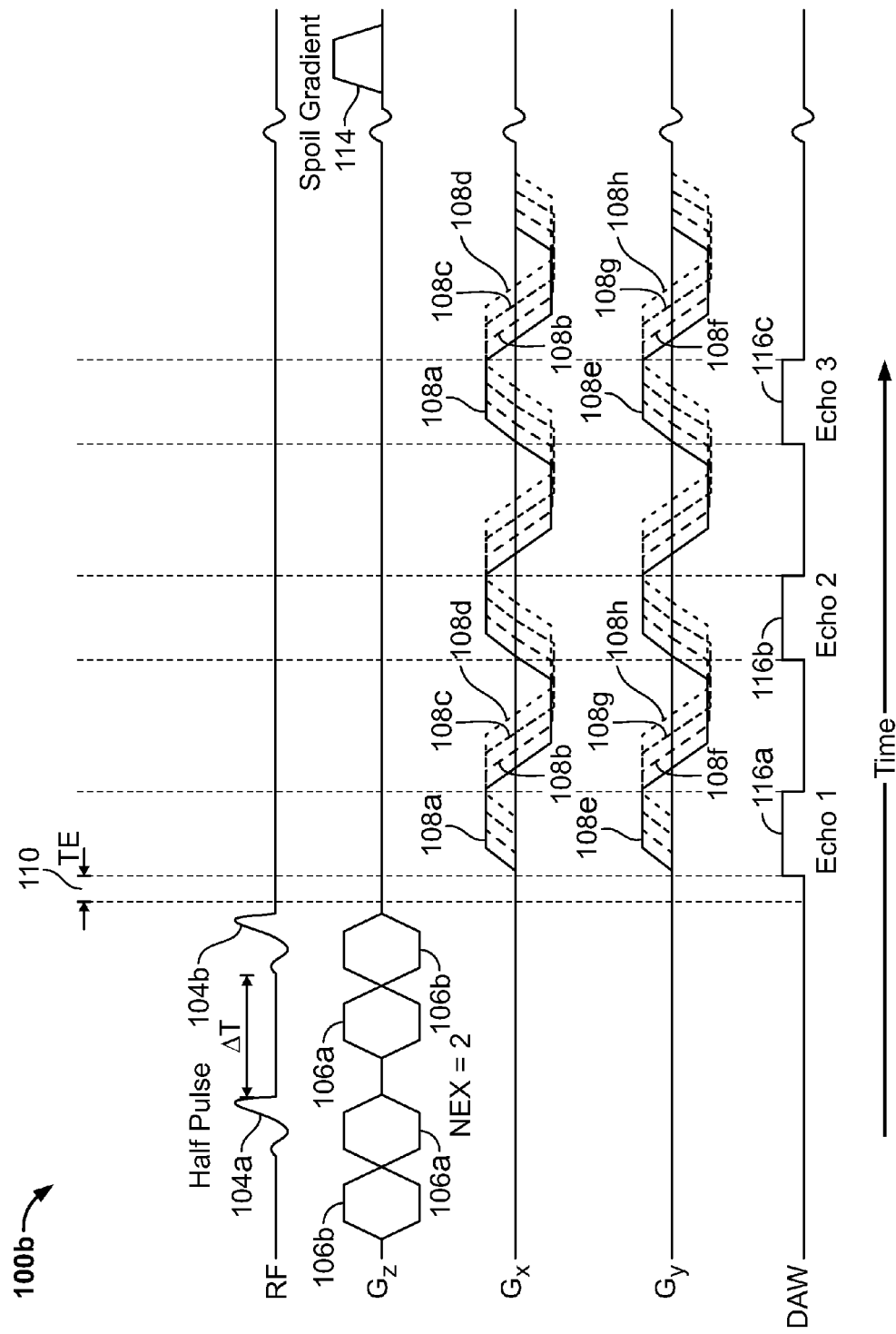
Figure 1C:
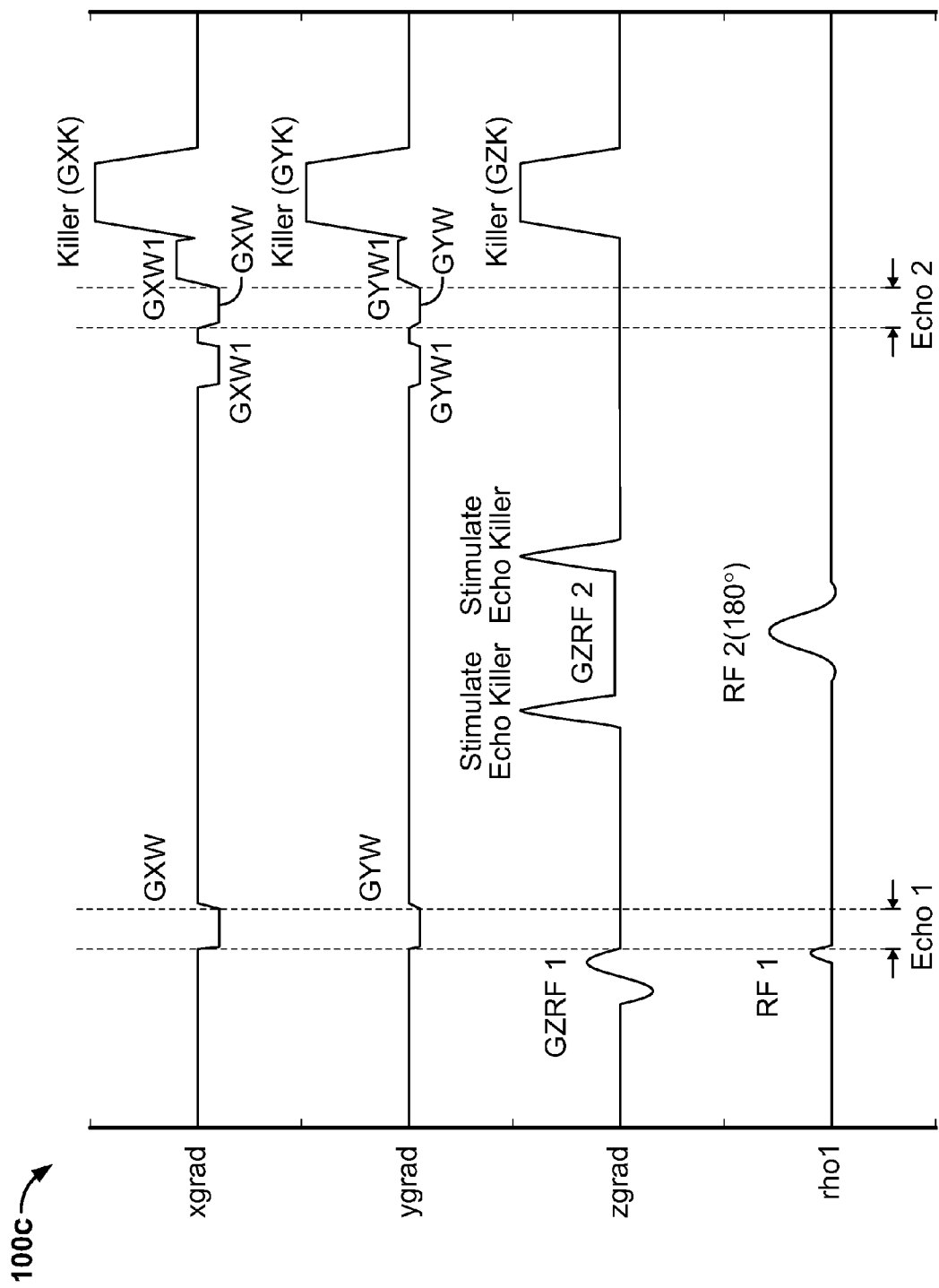

FIGS. 1A-1C are diagrams illustrating example data acquisition schemes for generating magnetic resonance (MR) images with short echo times. An example data acquisition scheme 100a illustrated in FIG. 1A includes radio frequency (rf) pulses, magnetic field gradients (for orthogonal Cartesian coordinates x, y, and z), and a data acquisition window (DAW) illustrated in five parallel timelines extending from left to right in the diagram. The data acquisition scheme 100a can be implemented for UTE spectroscopic imaging of samples including cortical bone, which has a short T2 in the order of 300 to 500 us. In an example implementation, two echoes are acquired per repetition time (TR).

In some implementations, the first gradient field $G_z$ is applied in a longitudinal direction, parallel to a principle external magnetic field $B_0$ (i.e., the z-direction). The second gradient field $G_x$ is applied in a transverse direction, orthogonal to $B_0$ (i.e., the x-direction). The third gradient field $G_y$ is applied in a transverse direction, orthogonal to $B_0$ and orthogonal to the x-direction (i.e., the y-direction). The gradient $G_z$ is used for slice selection, while the gradients $G_x$ and $G_y$ are used to select a radial sampling of k-space in the selected slice.

The example data acquisition scheme 100a begins with a preparation period 118. The preparation period includes an rf pulse 102 to reduce and/or suppress long T2 signals. For example, a 90° rf pulse followed by gradient dephasing or a long adiabatic 180° pulse followed by a delay (TI) may be applied during the preparation period 118. In some implementations of the scheme 100a, a long sinc- or square-shaped pulse may be used rather than an adiabatic 90° pulse or 180° pulse. In the illustrated examples, adiabatic pulses are chosen to provide uniform rotation and reduced signal attenuation of the short T2 signals. In some implementations, the preparation period 118 is omitted, for example, in applications that do not utilize suppression of long T2 signals.

Next, a slice selecting gradient 106a is applied during an rf half pulse 104. In a subsequent experiment, the slice selecting gradient 106b is applied during the rf half pulse 104. A complete slice profile is generated by collecting data with the slice selection gradient in one direction (106a) and adding this to data collected with the slice selection gradient polarity reversed (106b). In the illustrated example, the peak of the half pulse 104 is reached as the slice selection gradient ramps down, and both the rf half pulse 104 and the gradient 106a (or 106b) reach zero amplitude simultaneously. In some implementations, the rf pulse 104 and/or the gradient 106 are configured differently. The rf half pulse 104 produces a magnetic resonance echo signal after an echo time 110.

The rf half pulse 104 is followed by projective reconstruction (PR) readout gradients 108a-108h for radial ramp sampling of each k-space trajectory. The magnetic field gradients 108a-108h are applied in pairs. In the illustrated example, the gradients 108a and 108e are applied in a first PR readout, the gradients 108b and 108f are applied in a second PR readout, the gradients 108c and 108g are applied in a third PR readout, the gradients 108d and 108h are applied in a fourth PR readout, and other pairs of gradients (not illustrated) may be applied in subsequent readouts. Each pair of gradients (e.g., the pair of gradients 108a, 108e) is configured to select for acquisition components of the magnetic resonance echo signal produced by the rf half pulse 104. Each selected component corresponds to a radial projection in a two-dimensional spatial frequency domain of the sample. During each readout, a free induction decay (FID) 116 corresponding to magnetic resonance signals selected by the gradients 108 is collected by an rf coil. In some implementations, the readout gradients 108 are configured differently.

The echo time 110 between the end of the rf half pulse 104 and the first pair of gradients 108a, 108e can be less than 10 μs. For example, the echo time 110 in the illustrated example is 8 μs. In some implementations, the delay times and echo spacing is chosen so that the TEs are uniformly distributed for the interleaved groups. For example, in the illustrated acquisition scheme 100a, the time between the end of the rf half pulse 104 and the second pair of gradients 108b, 108f is 88 μs, the time between the end of the rf half pulse 104 and the third pair of gradients 108c, 108g is 168 μs, and the time between the end of the rf half pulse 104 and the fourth pair of gradients 108d, 108h is 248 μs.

In an example implementation of the data acquisition scheme 100a, a sample of cortical bone is imaged. In this example, a total of 2025 projections are acquired, and were interleaved into forty-five groups with an initial TE of 8 μs and a TE delay of 80 μs thereafter. In the long T2 saturation approach, UTE spectroscopic imaging acquisition was preceded by a maximal phase 90° pulse 102 (8 ms in duration) followed by a crusher gradient 112 to spoil the in-plane magnetization from long T2* fat and muscle, leaving short T2* bone signal largely unaffected. Other acquisition parameters included a imaging FOV of 10 cm, a TR of 75 ms, a flip angle of 60°, imaging bandwidth of 62.5 kHz, readout matrix of 128, a slice thickness of 8 mm within a total scan time of 5 min. In implementations of the inversion recovery approach for suppression of long T2 signals, a long adiabatic fast passage inversion pulse 102 (8.64 ms in duration) was used to invert the longitudinal magnetization of long T2* signals. The water in bone has a short T2* and is not inverted by the inversion pulse 102. Other imaging parameters were similar to those of the saturation approach, except a larger readout matrix of 256 and a longer TR of 300 ms along with a TI of 125 ms in a total scan time of 20 min.

FIG. 1B illustrates an example data acquisition scheme 100b for generating MR images with short echo times. For example, the scheme 100b can be used to image a human knee, including deep radial and calcified layers of cartilage (T2~1 ms) and meniscus (T2~4~8 ms). In the illustrated data acquisition scheme 100b, the gradient fields 108 are extended to collect multiple echoes per TR. In the illustrated example, three echoes are illustrated, but the gradient fields 108 are extended beyond three echoes in some implementations. Multiple echoes are acquired to improve the spectral resolution. The data acquisition scheme 100b includes a double half pulse, which includes two rf half pulses 104a and 104b configured to produce a magnetic resonance echo signal. The double half pulse improves the slice profile for long T2 fat and muscle signals, suppressing out-of-slice long T2 signal contamination.

FIG. 1C illustrates an example data acquisition scheme 100c for generating MR images with short echo times. The data acquisition scheme 100c includes a multi-echo spin echo UTE sequence, where half pulse excitation is followed by radial ramp sampling for FID acquisition. Then a slice selective 180° pulse is applied and followed by subsequent spin echo acquisitions. Spin echo acquisition may reduce artifacts caused by field inhomogeneity by using a 1800 pulse to refocus errors, leading to a longer T2 decay rather than a shorter T2* decay. Therefore, it may be useful to combine multi-echo spin echo acquisition with UTE spectroscopic imaging to improve the spectral resolution.

Figure 2A:
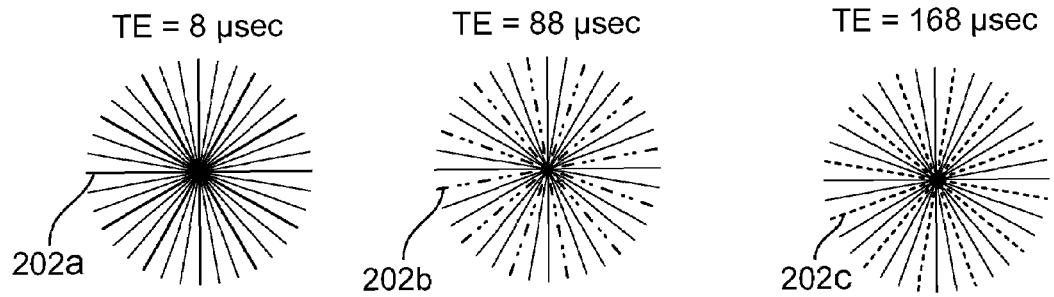
FIGS. 2A and 2B are plots illustrating example radial trajectories in k-space for generating MR images.
Figure 2B:
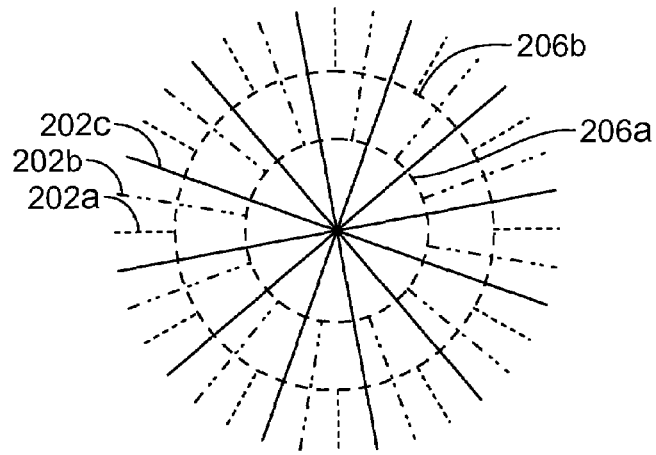

FIGS. 2A and 2B are plots illustrating example radial projections in k-space (i.e., the spatial frequency domain) for generating MR images. The radial projections are interleaved into multiple groups, with each group having a different TE (TE delay interval can be chosen to cover a certain spectral bandwidth). Two techniques are integrated into the reconstruction algorithm: (1), view sharing of high spatial frequency projection data from neighboring groups to suppress streak artifacts; (2), sliding window reconstruction to reconstruct images for each interleaved group.

FIG. 2A illustrates three groups 202a, 202b, 202c of radial projections. Each group 202 is associated with an echo time. The group 202a is associated the echo time 8 µs, the group 202b is associated the echo time 88 µs, and the group 202c is associated the echo time 168 µs. Each group 202 includes twelve radial half projections extending from a low spatial frequency region of the k-space to a high spatial frequency region of the k-space. Each radial projection defines an angle in the k-space. The radial projections in each group define a set of angles distributed uniformly from zero radians to $2\pi$ radians. In addition, the groups 202 are distributed uniformly in the k-space. That is to say, when the groups 202a, 202b, and 202c plotted on a single coordinate axis system, the angle between any two neighboring radial projections is equal. Three groups are illustrated in FIG. 2A, but fewer or more groups can be used. For example, forty groups or more are used in some example implementations.

FIG. 2B illustrates an example technique for generating MR images based on the radial projections illustrated in FIG. 2A. FIG. 2B illustrates the components of each radial projection used for generating an image associated with the echo time 168 µs. The illustrated example reconstruction uses low frequency data from group 202c to generate the MR image associated with the echo time 168 µs. The illustrated example implements view sharing of high spatial frequency projection data from neighboring groups 202a and 202b to suppress streak artifacts. For example, only high frequency components of the groups 202a and 202b are used to generate the MR image associated with the echo time 168 µs. The illustrated components of the radial projections in the group 202b extend from a first radius 206a to the radial perimeter of the k-space. The illustrated components of the radial projections in the group 202a extend from a second radius 206b to the radial perimeter of the k-space. The illustrated components of the radial projections in the group 202c extend from the radial origin (i.e., zero radius) of the k-space to the radial perimeter of the k-space. In some implementations, the low frequency projections extend to a low frequency radius proximate, but not at, the radial origin of the k-space.

Figure 13:
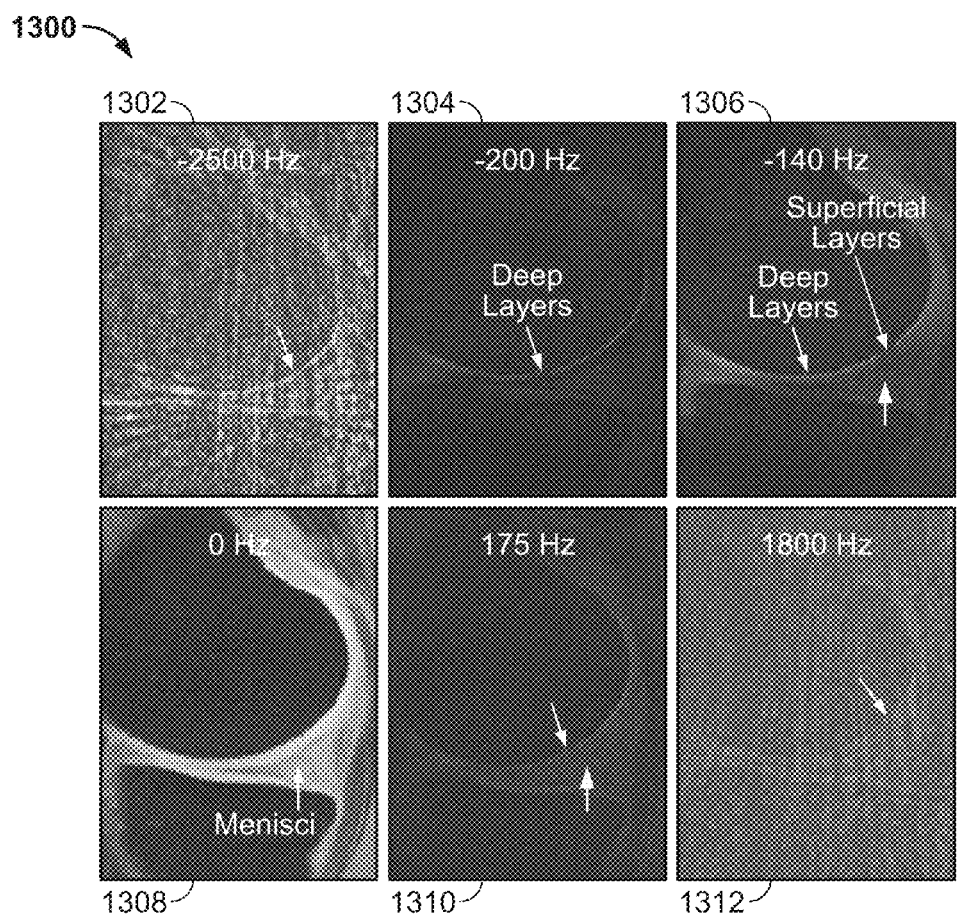
FIG. 13 is a set of example spectroscopic MR images of the human knee for multiple temporal frequencies.
Figure 15:
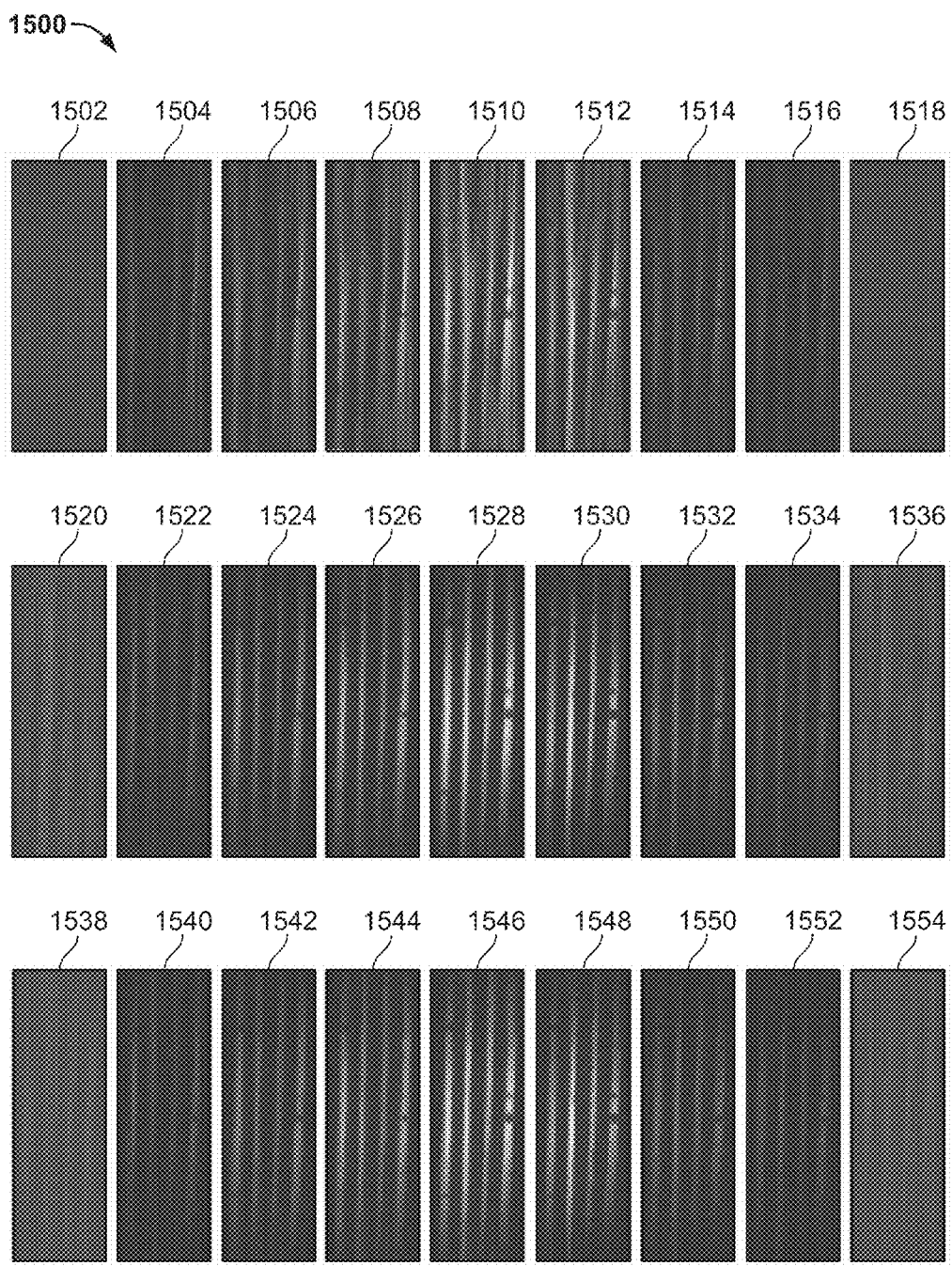
FIG. 15 is a sets of example spectroscopic MR images of the rubber bands of FIG. 14 for multiple temporal frequencies.

In some cases, a high spatial frequency view sharing algorithm reduces streak artifacts primarily in spectroscopic MR images. In some cases, streak artifacts are observed in time-domain MR images generated by the view sharing algorithm, but the streak artifacts are suppressed in a subset of spectroscopic MR images that are generated based on the time-domain MR images (e.g., by a Fourier transform of the time-domain MR images). For example, as illustrated in FIGS. 3B, 13, and 15 the streak artifacts are shifted to spectroscopic MR images associated with high or low (time) frequencies. In these example cases, the spectroscopic MR images associated with on-resonance and near on-resonance frequencies are substantially free of streak artifacts.

In some examples, the interleaved groups of projections are ordered in a way such that the high spatial frequency projection data from neighbor interleaves uniformly cover the k-space. For example, the acquisition group order, in some cases is 1, 15, 30, 8, 22, 37, etc. for a total number of 45 interleaved groups. In some implementations, a different group ordering is used.

Figure 2C:
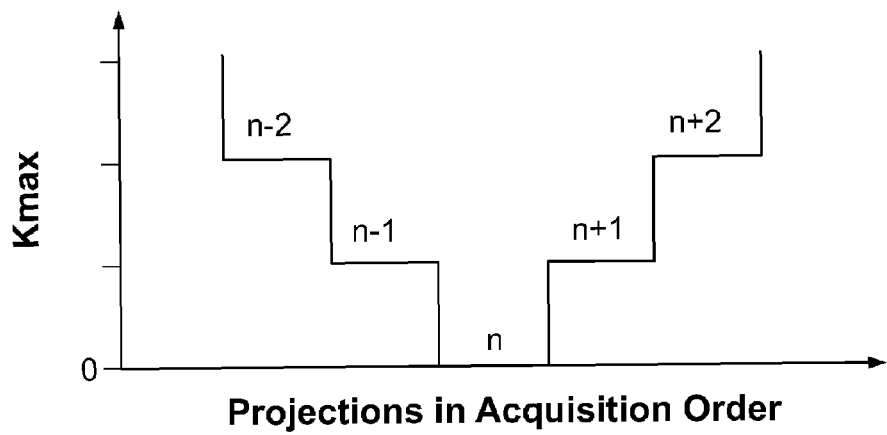
FIG. 2C is a plot illustrating an example sliding window image reconstruction scheme for generating MR images.

FIG. 2C illustrates an example sliding window image reconstruction scheme for generating MR images. The horizontal axis represents the projections in acquisition order. The vertical axis represents the components of the radial projections used to reconstruct an image based on the group "n" of radial projections. For example, the label "n" can represent the group 202c of FIG. 2A. In this example, the label "n–1" represents the group 202b of FIG. 2A, and the label n–2 represents the group 202a of FIG. 2A.

High spatial frequency projection data from neighboring interleaved groups of projections are included to the re-grid data to suppress streak artifact and increase image signal to noise ratio (SNR). The data sharing scheme in FIG. 2c is like a "tornado" filter shown in FIG. 2C, where more high in-plane spatial frequency projection data is shared among the nearest neighbor interleaves. Since MR image contrast is typically determined by the most central k-space data, this "tornado" filter may significantly suppress streak artifact without affecting the contrast behavior, or T2 decay behavior. This "tornado" filter is moved forward like a sliding window to regrid the interleaved projection data onto a grid, followed by Fourier transform of the k-space data to generate MR images at different TEs. The MR images at different TEs can be Fourier transformed in the time domain to generate spectroscopic MR images.

Figure 3A:
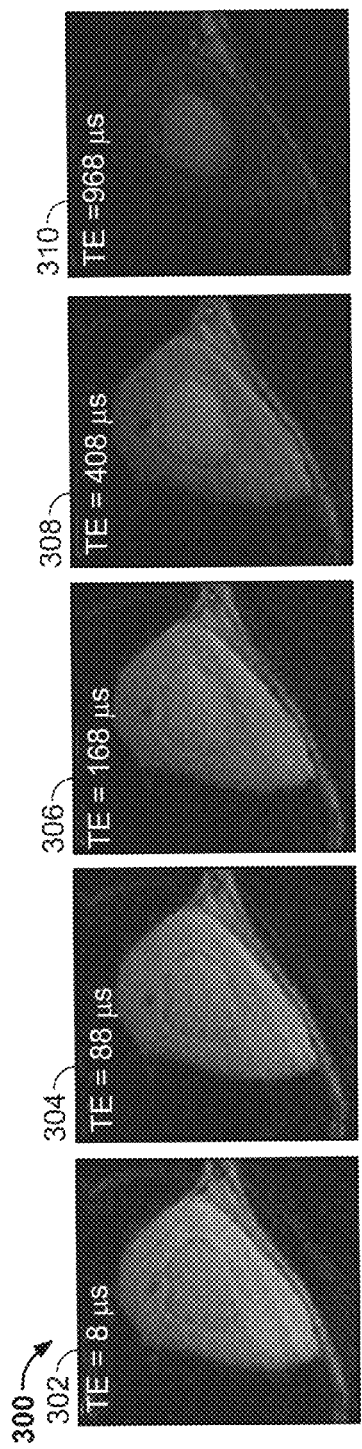
FIG. 3A is a set of example MR images of cortical bone for multiple echo times.
Figure 3B:
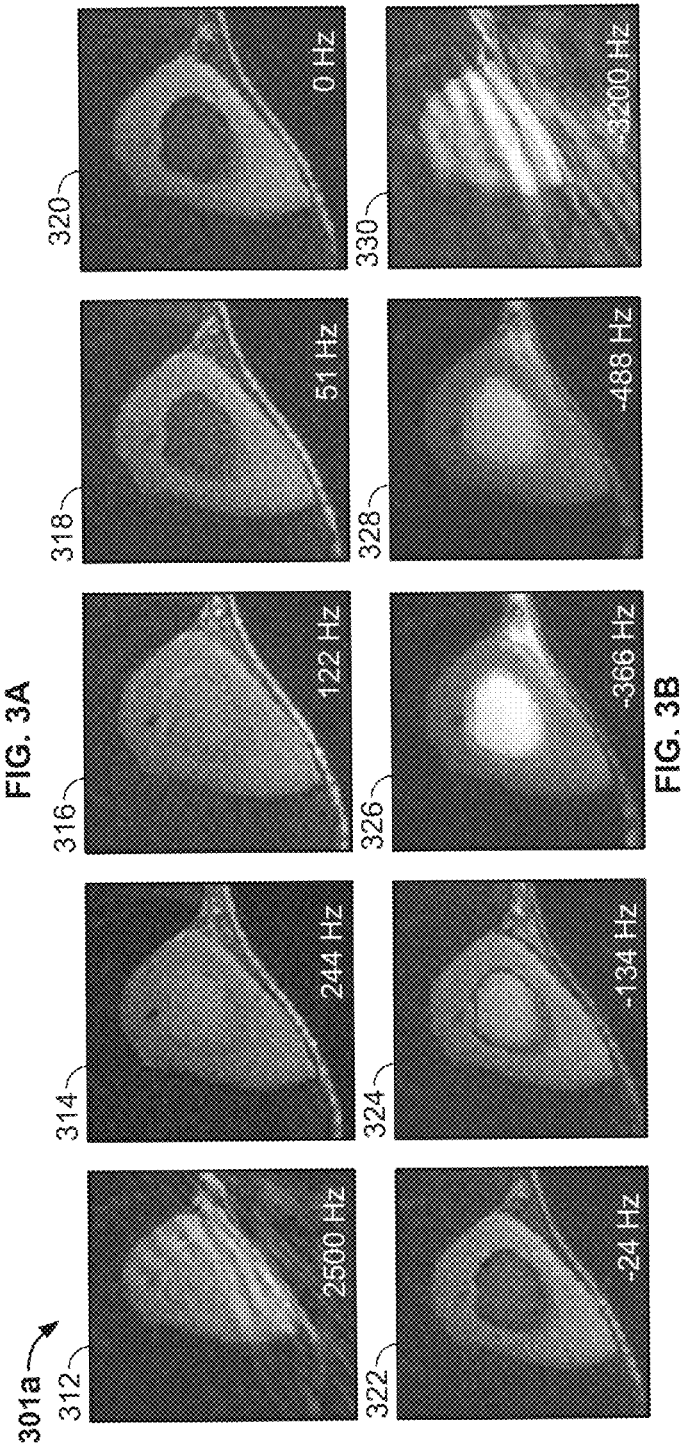
FIGS. 3B and 3C is a set of example spectroscopic MR images of the cortical bone for multiple temporal frequencies.

FIG. 3 is a set of example MR images 300 of cortical bone for multiple echo times. FIGS. 3A and 3B are two sets of example spectroscopic MR images 301a and 301b of cortical bone for multiple temporal frequencies. The illustrated example images 300 in FIG. 3A includes selected UTE variable TE images. The set of time-domain images 300 in FIG. 3A includes five images 302, 304, 306, 308, and 310. Each image is associated with a different one of the echo times 8 µs, 88 µs, 168 µs, 408 µs, 968 µs. For example, the image 302 is associated with an echo time of 8 μs. The example images 300 include some mild streak artifacts.

Cortical bone typically has a short T2 of approximately 360 μs. Cortical bone typically contains about 15% free water by volume, providing a mobile proton density far below that of muscle and fat. In order to improve the conspicuity of bone, the dynamic range is increased by efficient suppression of the long T2 fat and muscle signals. As shown in FIG. 1A, either an adiabatic 90° pulse or 180° pulse can be used to suppress fat and muscle signals, followed by variable TE UTE acquisition of the bone spectroscopic data.

In this example, the streak artifacts appear as narrow, highly (spatially) oscillating streaks in the time-domain MR images 300. Features of the streaks are determined at least partially by the projection angles defined by the radial projections used to generate the time-domain MR images 300. Since each interleaved data set has a different set of projection angles, the orientation of the streak artifacts are different each time-domain image. Therefore, the highly oscillating streak artifact in the time domain behaves like a high frequency signal in the time-frequency spectral domain. Fourier transform in the time domain shifts the streak artifacts to the high frequencies in the time-frequency spectral domain, resulting in reduced streak artifacts near the water resonance frequency.

A set of example spectroscopic MR images 301a, illustrated in FIG. 3B, are generated based in part on the MR images 300 of FIG. 3A. The illustrated example spectroscopic MR images 301a are reconstructed for resonance frequencies relative to water with high resolution (0.39×0.39 mm$^2$) and broad spectral bandwidth (12.5 kHz). The set of frequency-domain images 301a includes ten images 312, 314, 316, 318, 320, 322, 324, 326, 328, and 330. Each image is associated with one of the different resonance frequencies 2500 Hz, 244 Hz, 122 Hz, 51 Hz, 0 Hz, −24 Hz, −134 Hz, −366 Hz, −488 Hz, and −3200 Hz. For example, the image 320 is associated with the on-resonance frequency 0 Hz, which is the resonance frequency of water in this example. The image 318 is associated with the resonance frequency 51 Hz relative to the resonance frequency of water. The images 301a illustrate a bright cortical bone signal over a broad range of the spectrum. The oscillating streak artifacts observed in the time-domain images 300 of FIG. 3A are shifted to high frequencies in the spectral domain images 301a. The last image 330 is resealed to better show the artifact. The spectroscopic MR images near the resonance frequency 0 Hz are substantially free of streak artifacts. For example, the images 314 through 326 are substantially free of streak artifacts.

Figure 3C:
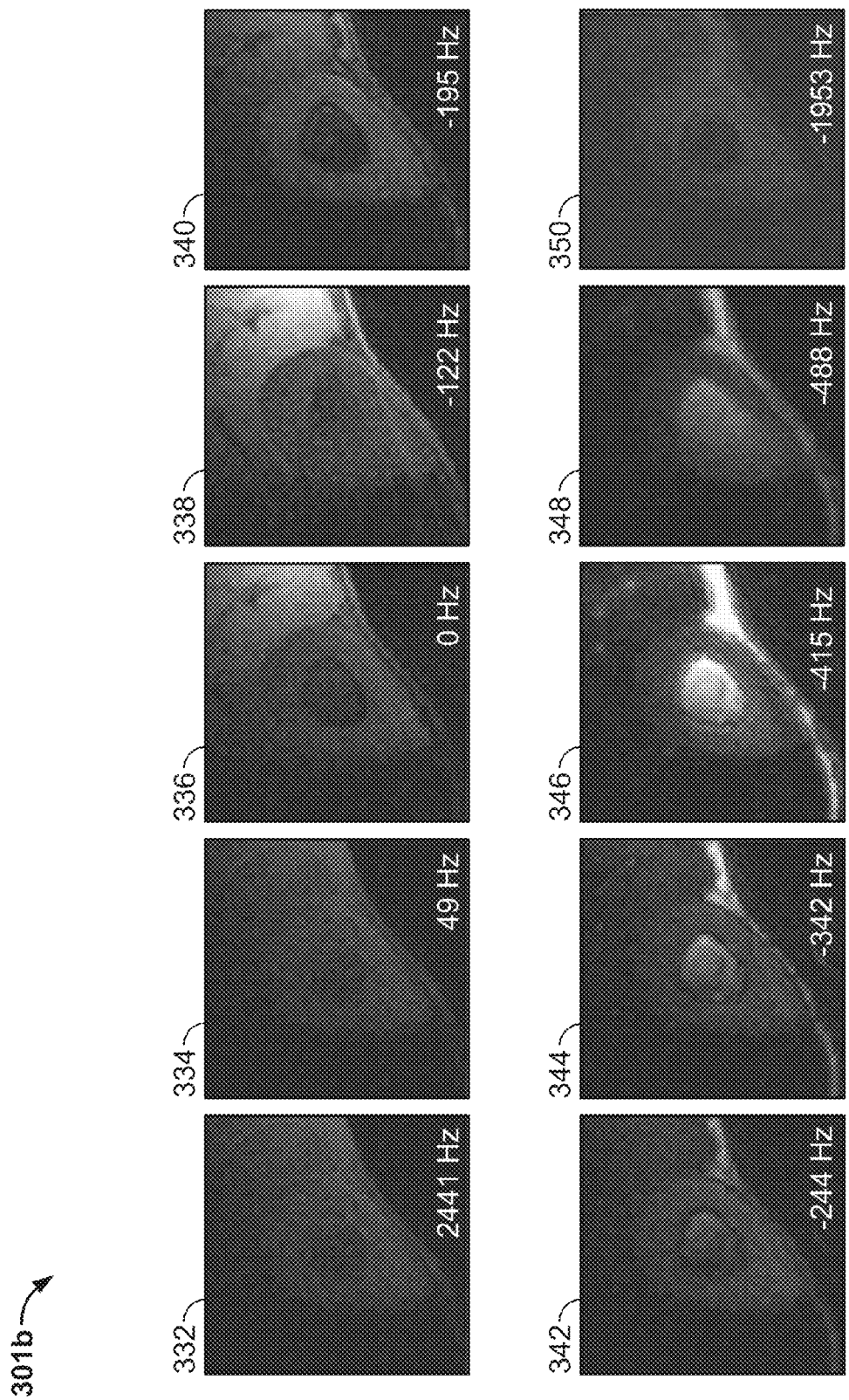

A second set of example spectroscopic MR images 301b of cortical bone, illustrated in FIG. 3C, are generated based on a different set of time-domain MR images. The spectroscopic images 301b are generated based on an acquisition scheme that includes a 4.8 millisecond (ms) Gaussian 90° pulse followed by gradient dephasing to suppress signals from the long T2* fat and muscle. In the illustrated example images 301b, there are some residual muscle and fat signals due to imperfect saturation. There is a shift of 195 Hz between the bone peak and muscle peak, perhaps due to greater diamagnetic susceptibility of cortical bone.

Figure 4A:
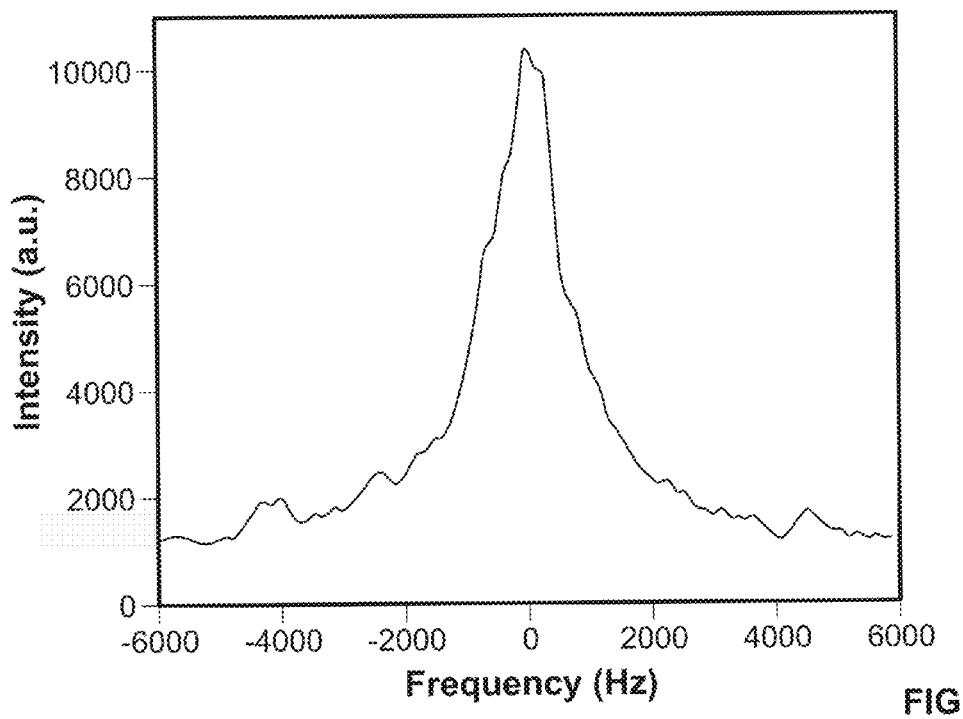
FIG. 4A is a plot illustrating an example frequency spectrum based on data for a single pixel in each of a set of MR images of cortical bone.
Figures 4B, 4C:
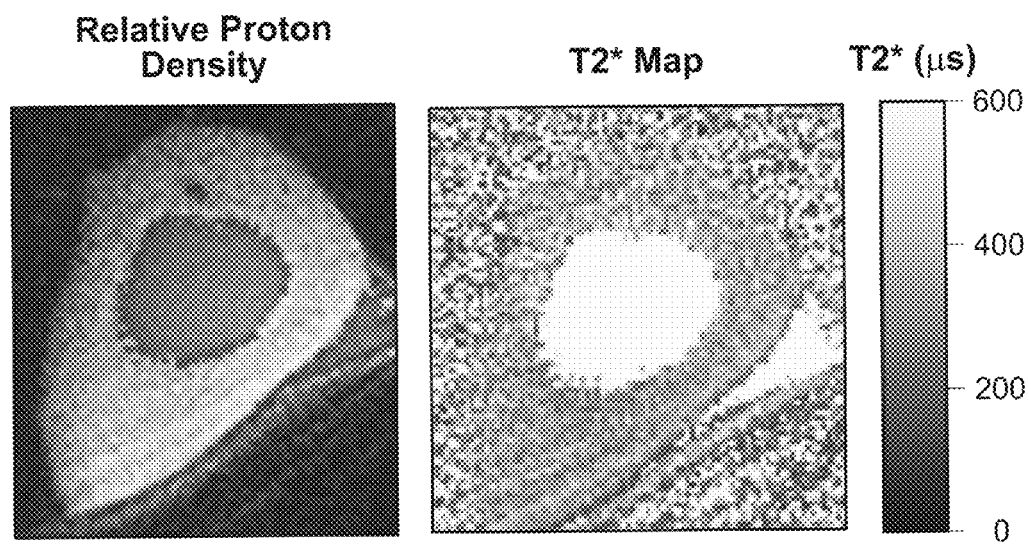
FIG. 4B is an example MR image showing a water distribution in the cortical bone.
FIG. 4C is an example T2* map for the hydrogen nuclear spins in the cortical bone.

FIG. 4A is a plot illustrating an example frequency spectrum based on data for a single pixel in each of a set of MR images of cortical bone. Frequency spectra, such as the spectrum illustrated in FIG. 4A, can be used to calculate relative water distribution in the sample. FIG. 4B is an example MR image showing a water distribution in the cortical bone. Relative water content was calculated based on the water peak area by fitting each spectrum to a Gaussian line shape. Quantification of water content in cortical bone can be an important factor in determining the mechanical property of bone in osteoporosis patients. Absolute quantification of bone water fraction is based on data from a reference sample.

The spectroscopic MR images can be used to generate a T2* map of the sample. The T2* map can be generated based on time-domain data or frequency-domain data. For example, a single exponential T2* decay fitting can be applied to the images at different TEs to produce pixel-based T2* values. In some cases, images at different TE can be fitted to a mono- or bi-exponential T2* decay on a pixel-by-pixel basis. Another approach is to fit the UTE spectra of each pixel using a Gaussian line shape. In some implementations, the spectral fitting approach may be more reliable, for example, due to the presence of streak artifacts in the time-domain images at different TEs. FIG. 4C is an example T2* map for the hydrogen nuclear spins in the cortical bone. T2* values were fitted using MRUI tool in the time-domain. Observed T2* values range from 300 μs to 600 μs. There are some streak artifacts in the T2* map, which may be better tolerated in spectral domain where the streak artifacts were shifted to high frequencies relative to the water peak.

Figure 5:
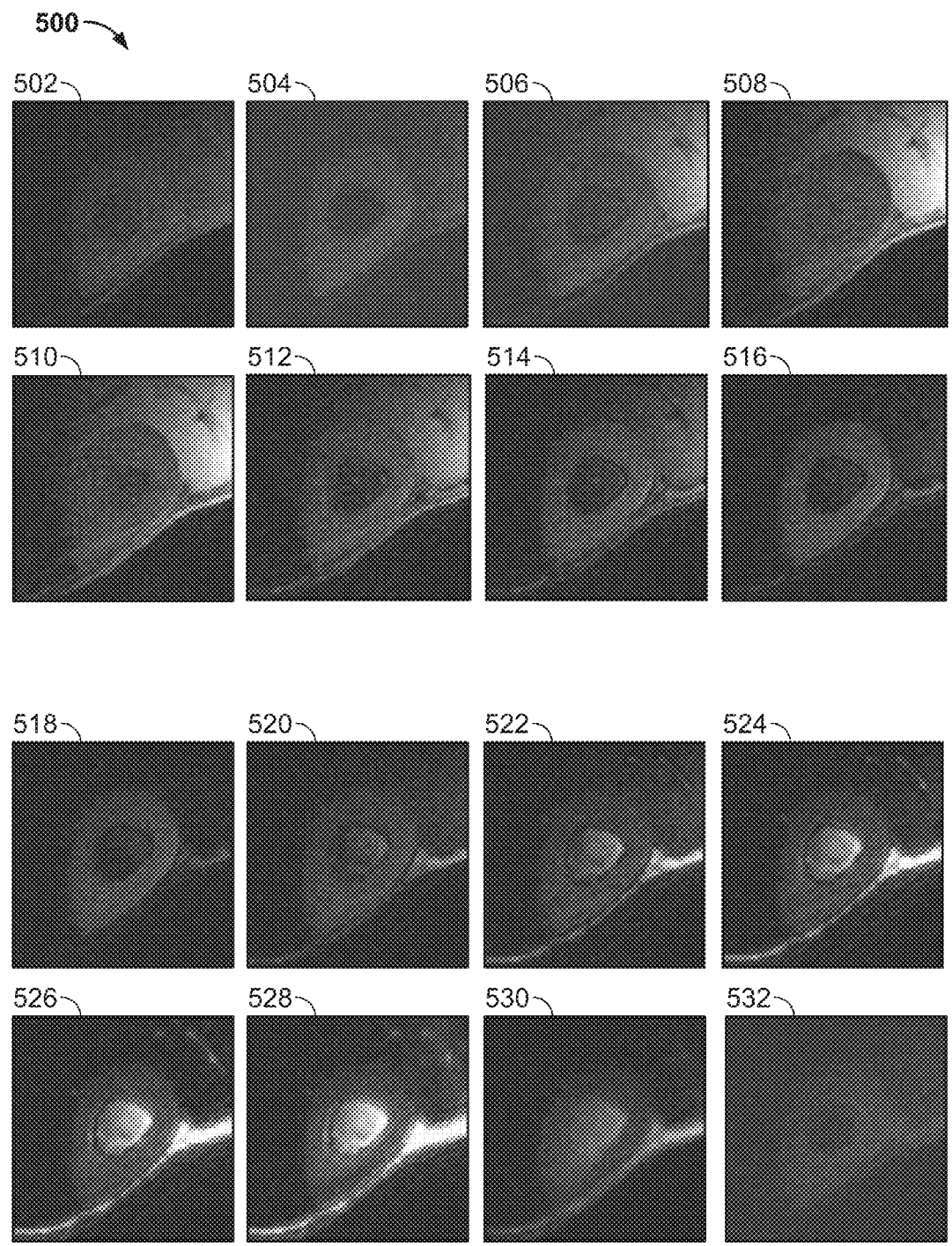
FIG. 5 is a set of example spectroscopic MR images of cortical bone for multiple temporal frequencies.

FIG. 5 is a set of example UTE spectroscopic MR images 500 of cortical bone for multiple temporal frequencies. The example images 500 are generated based on time-domain MR images. Data for generating the time-domain MR images was acquired based on a data acquisition scheme that included a long adiabatic 900 adiabatic pulse to suppress signals from the long T2 fat and muscle. The acquisition parameters include: field of view (FOV)=10 centimeters (cm), number of readouts=128, slice thickness=8 millimeters (mm), number of radial projections=2025, the radial projections are interleaved into 45 subsets with uniform TE delay of 52 us, recovery time (TR)=75 ms, TE=12 μs, dual echo acquisition, echo space=3.2 ms, spectral bandwidth=62.5 kHz, scan time=5 minutes. The UTE spectroscopic data was first re-gridded onto a 256×256 grid, followed by fast Fourier transform (FFT) to generate images at different TEs. Time-domain MR image data was zero-filled to 1024 in the time domain. The zero-filled data was fast Fourier transformed to generate the spectroscopic images 500.

In the example images 500, cortical bone is well depicted at a broad range of spectra, consistent with its short T2 values. Fat and muscle signals are well suppressed through the 90° adiabatic pulse excitation and gradient dephasing. There are some residual muscle signals and fat signals, each located at different resonance frequencies relative to the cortical bone peak, suggesting the resonance frequency shift due to susceptibility in cortical bone.

The images 500 are based on an interleaved acquisition for UTE spectroscopic imaging. A large number of projections are interleaved into many subsets of projections with each subset uniformly covering the k-space with a high undersampling factor. Each subset is associated with a different TE. The set of TE values is determined by the required UTE spectral coverage. Low spatial frequency data from each subset is used to reconstruct one image for the corresponding TE. View sharing of high frequency components of other subsets can be used to suppress streak artifacts and increase SNR. This approach may generate both high spatial resolution and spectral resolution data in a time-efficient manner, for example, under clinical scan time.

Figure 6:
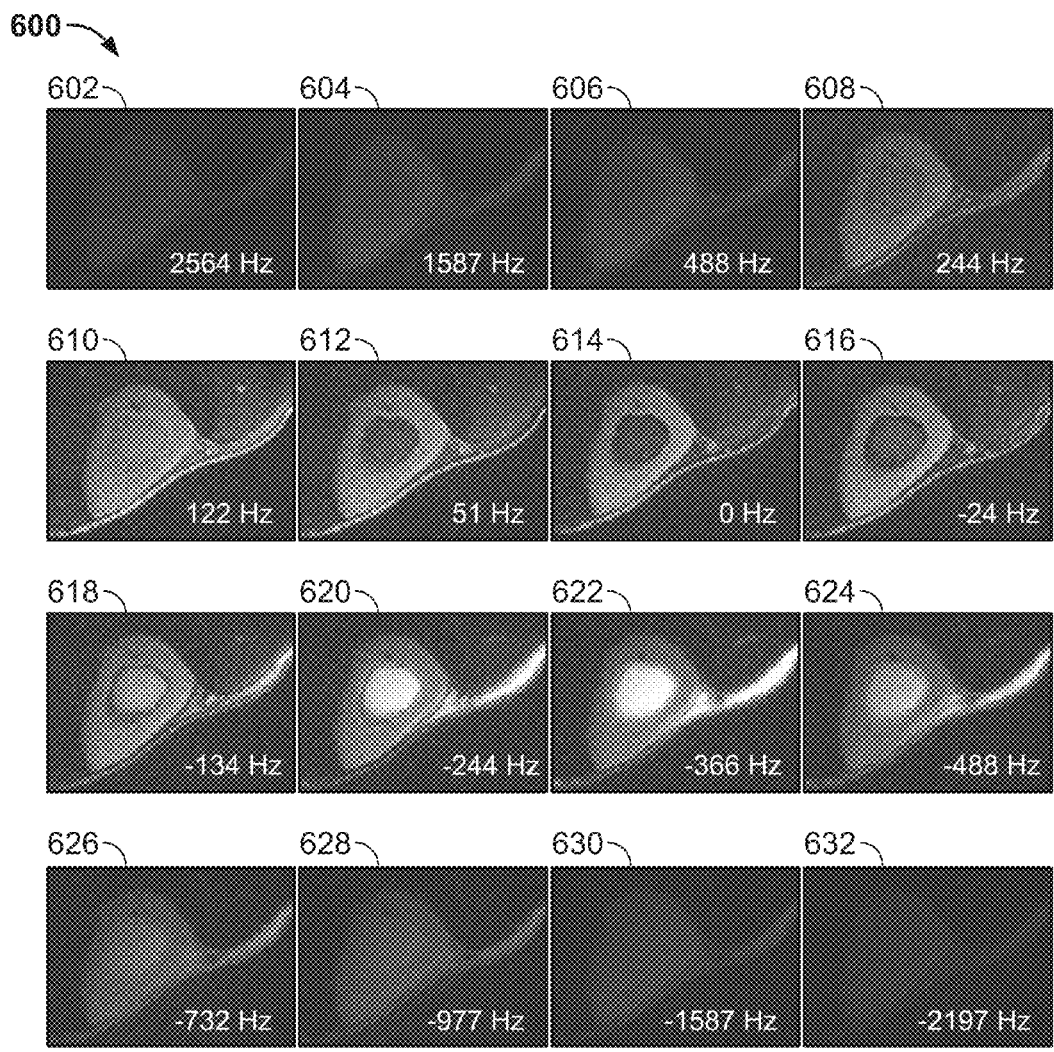
FIG. 6 is a set of example spectroscopic MR images of cortical bone for multiple temporal frequencies.

FIG. 6 is a set of example spectroscopic MR images 600 of cortical bone for multiple temporal frequencies. The spectroscopic MR images 600 are generated based on time-domain images. The time-domain images are generated based on a data acquisition scheme that includes a long adiabatic 1800 adiabatic pulse to suppress signals from the long T2 fat and muscle. The long adiabatic 1800 adiabatic pulse is followed by UTE spectroscopic data acquisition after a time T1 for both the fat and muscle spins to reach a null point (i.e., approximately zero longitudinal magnetization). Simulation shows that both the fat spin and muscle spin can be approximately nulled through an inversion recovery (IR) pulse using proper TI and TR (e.g., TR=300 ms, TI=125 ms).

In the illustrated example, the acquisition parameters include: TR=300 ms, TI=125 ms, FOV=10 cm, number of readouts=256, slice thickness=8 mm, number of radial projections=2025 (interleaved into 45 subsets with uniform TE delay of 80 us), TE=12 µs, dual echo acquisition, echo space=3.2 ms, frequency bandwidth=62.5 kHz, scan time=20 minutes. The UTE spectroscopic data was first re-gridded onto a 256×256 grid, followed by FFT to generate time-domain images at different TEs. The time-domain image data is zero-filled to 1024 data points in the time domain. FFT is applied to the zero-filled time-domain data to generate the spectroscopic MR images 600.

As illustrated in the example images 600, cortical bone is well depicted at a broad range of spectra, consistent with its short T2 values. Fat and muscle signals are well suppressed through the adiabatic inversion recovery pulse. In this example, there is less residual signal from the fat and muscle compared with the 90° adiabatic pulse approach. In addition, the 180° pulse approach allows improved SNR and contrast, but the scanner time is also longer in this example case.

Figure 7:
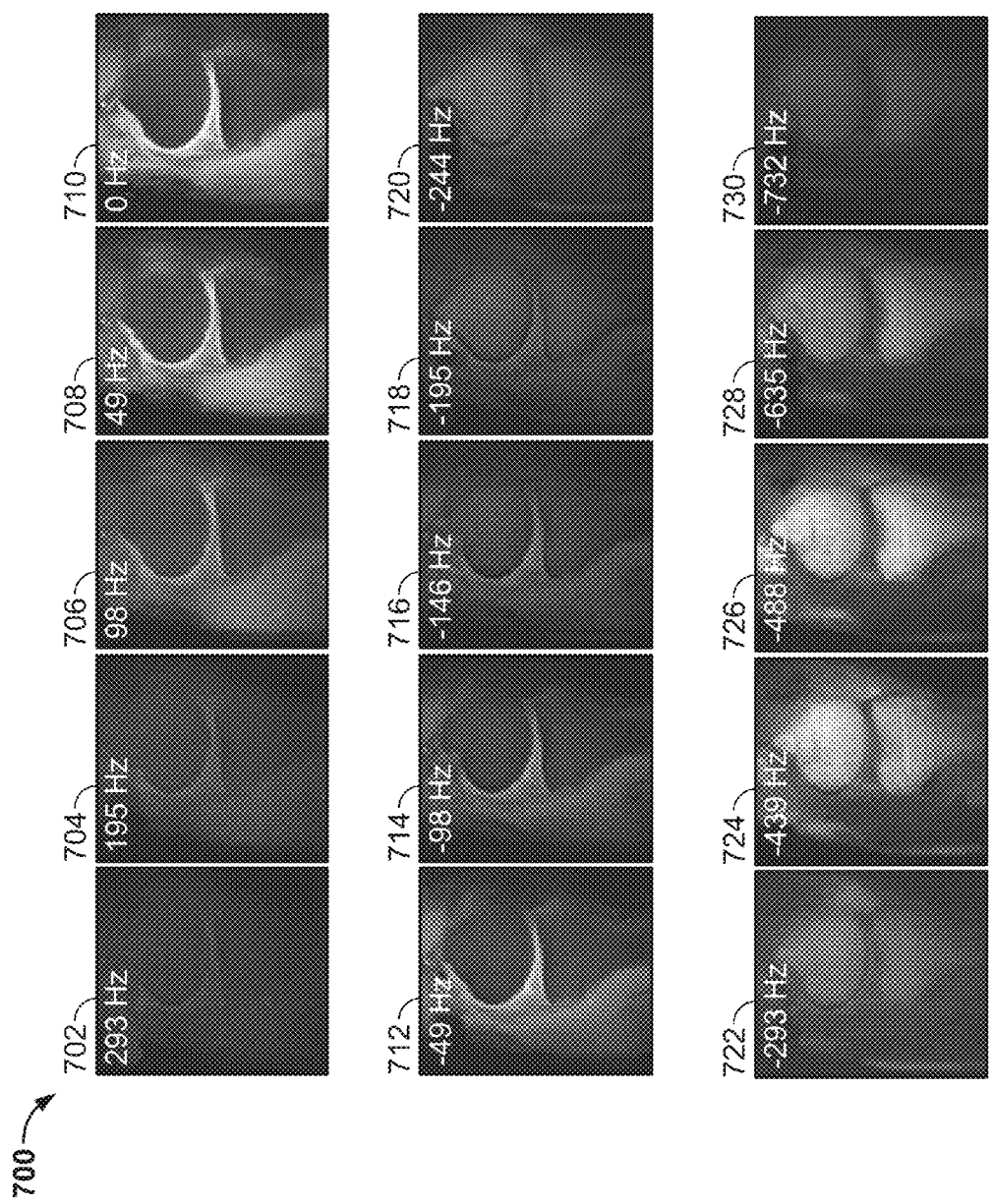
FIG. 7 is a set of example spectroscopic MR images of a human knee for multiple temporal frequencies.

FIG. 7 is a set of example spectroscopic MR images 700 of a human knee for multiple temporal frequencies. In the knee, there are many interesting tissues with short T2, including the deep radial and calcified layer of the cartilage, meniscus, tendon, and others. It would be very useful to get information about the spectral composition of these short T2 tissues. Since the T2s of these tissues (which may range, for example, from 1 to 8 ms) are longer than that of the cortical bone (which can be approximately 360 µs), multi-echoes can be acquired during each readout. In the present example, four echoes for each TR are acquired, which improves the spectral resolution.

UTE spectroscopic imaging with and without fat saturation have been implemented. The acquisition parameters are: FOV=16 cm, slice thickness=3 mm, number of readouts=256, number of radial projections=2025 (45 interleaves with TE delay of 120 us), TR=150 ms, TE=8 us, four echoes with echo spacing of 3.6 ms. The total scan time=10 minutes. The spectroscopic MR images 700 are generated based on time-domain MR images; the time-domain images are generated based on a data acquisition scheme that omits fat saturation. In the example images 700, the meniscus and calcified layer cartilage of the knee have a broad spectral distribution, consistent with their short T2 values. Fat signals are peaked at 440 Hz away from the water peak, consistent with the chemical shift between water and fat at 3 Tesla field strength.

Figure 8B:
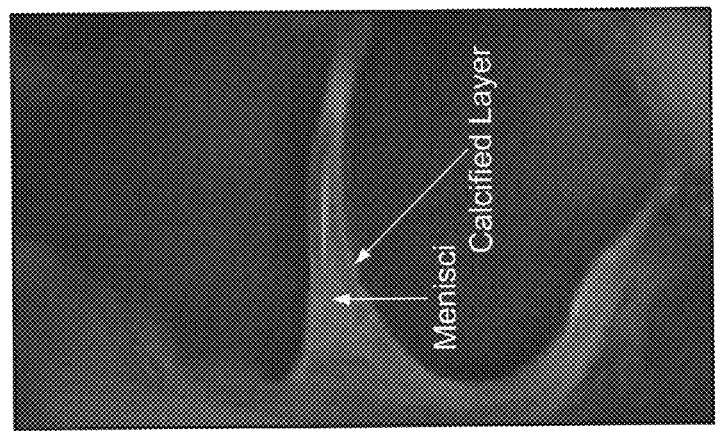
FIG. 8B is an example MR image of the human knee.
Figure 8A:
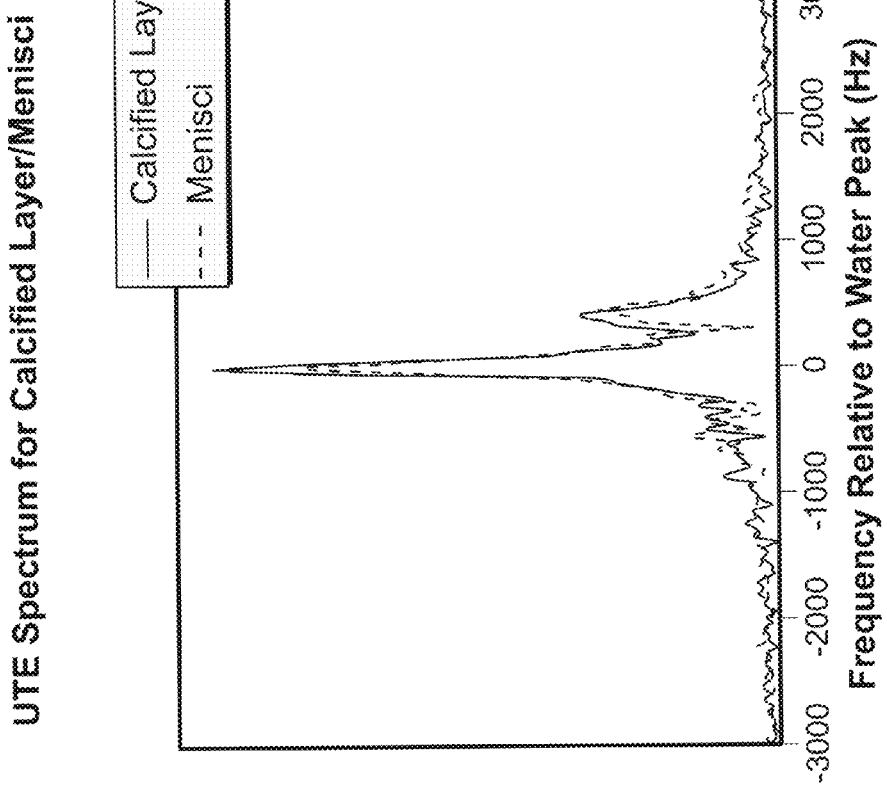
FIG. 8A is a plot illustrating an example frequency spectrum based on a set of MR images of a human knee.

FIG. 8A is a plot illustrating example frequency spectra based on a single voxel in the set of MR images 700 of the human knee. A fat peak appears for both spectra, indicating fat contamination. FIG. 8B is an example MR image of the human knee.

Figure 9:
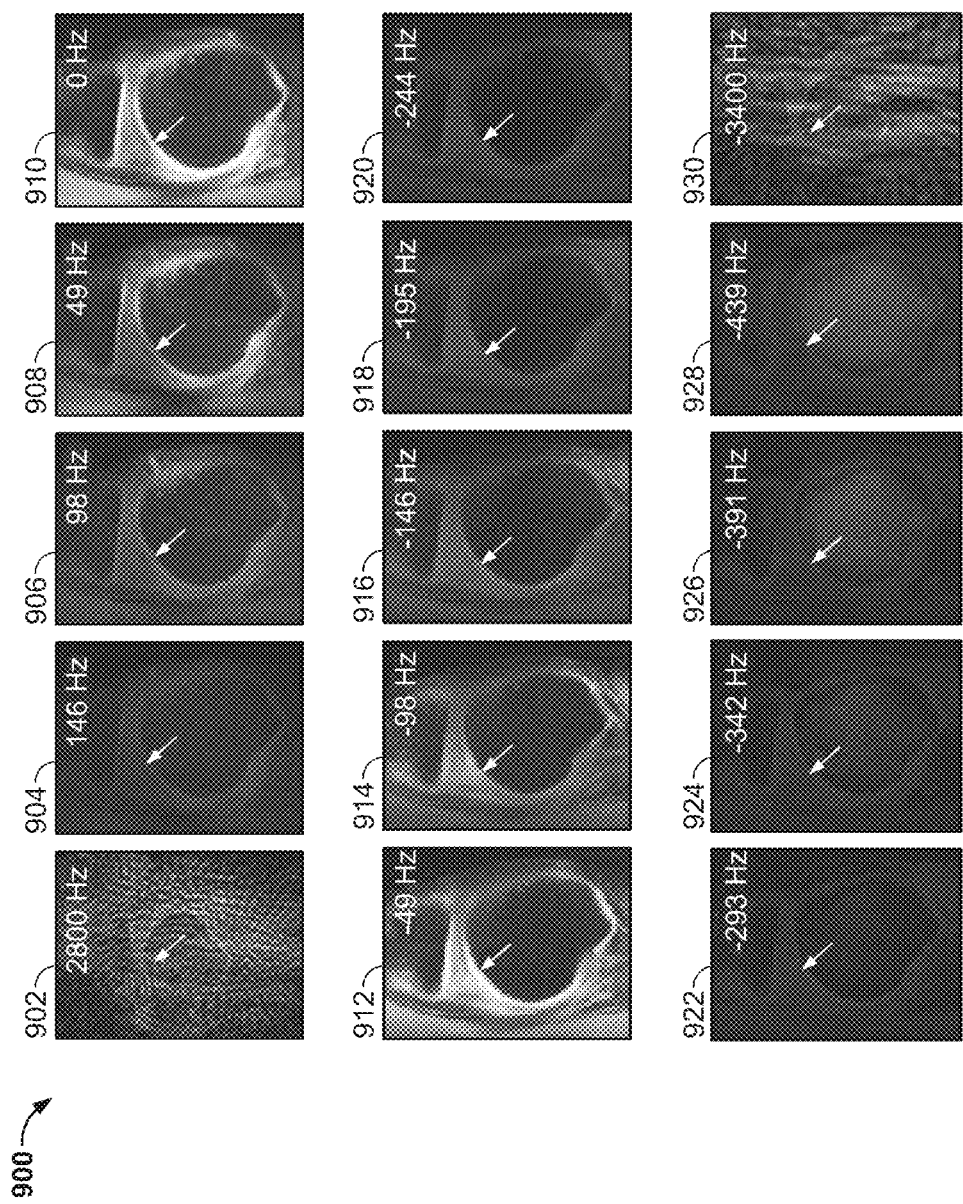
FIG. 9 is a set of example spectroscopic MR images of a human knee for multiple temporal frequencies.

FIG. 9 is a set of example spectroscopic MR images 900 of a human knee for multiple temporal frequencies. The spectroscopic MR images 900 are generated based on time-domain MR images; the time-domain images are generated based on a data acquisition scheme that includes fat saturation. Streak artifacts are observed in the high frequency image 930 and the low frequency image 902. No significant streak artifacts are observed near the resonance frequency of water. For example, images 904 through 928 include no significant streak artifacts. Fat signals are reduced by the fat saturation pulse technique, although there are still some residual fat signals peaked at 439 Hz away from the water peak. T2 relaxation times of the calcified layer cartilage and meniscus can be calculated based on either the image series at different TEs or the spectroscopic images 900.

Figures 10A, 10B:
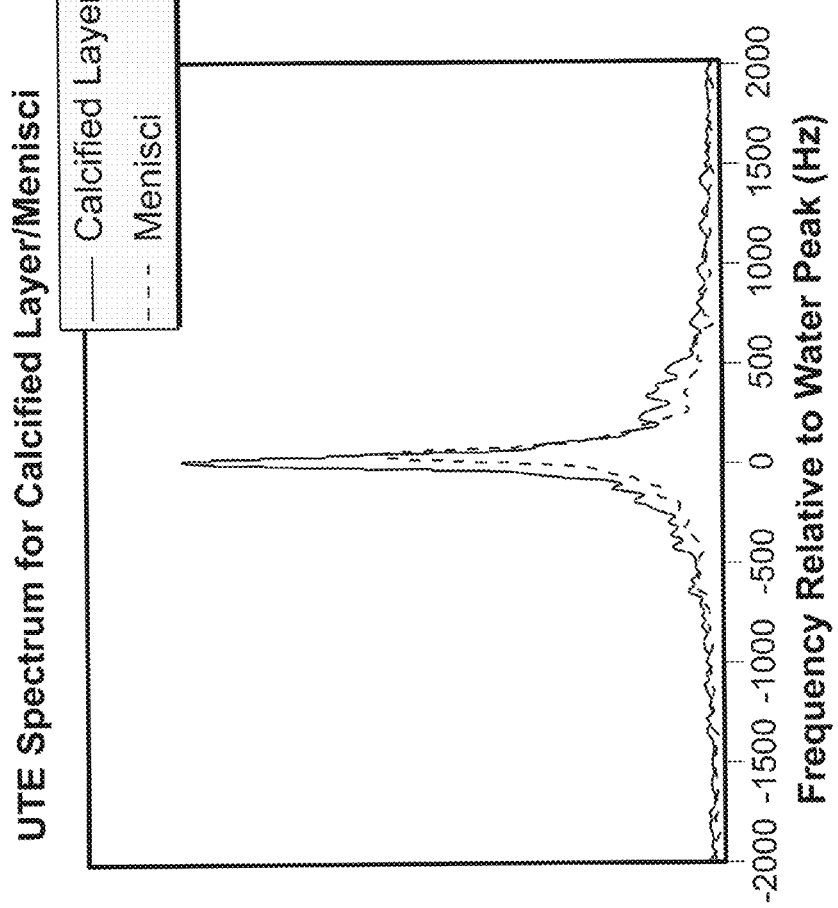
FIG. 10A is a plot illustrating an example frequency spectrum based on a set of MR images of a human knee.
FIG. 10B is an example MR image of the human knee.

FIG. 10A is a plot illustrating an example frequency spectrum based on the set of MR images 900 of the human knee. Spectra from the calcified layer and meniscus show significant attenuation of the fat peak, when compared with the spectra of FIG. 8A. FIG. 10B is an example MR image of the human knee.

Figure 11A:
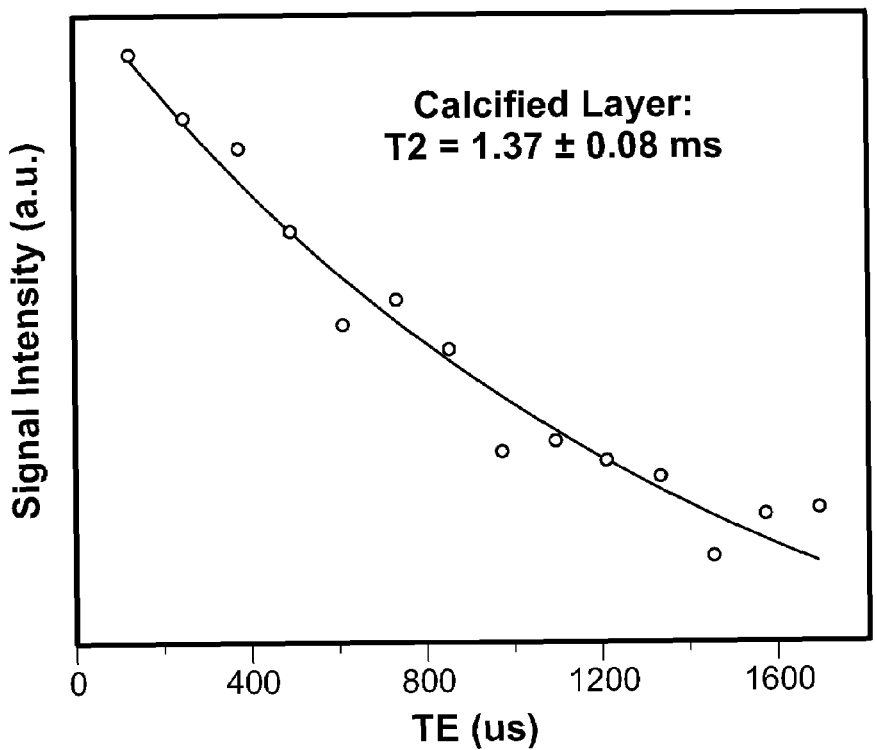
FIGS. 11A and 11B are plots illustrating data for assessing T2 values based on a set of MR images of a human knee.
Figure 11B:
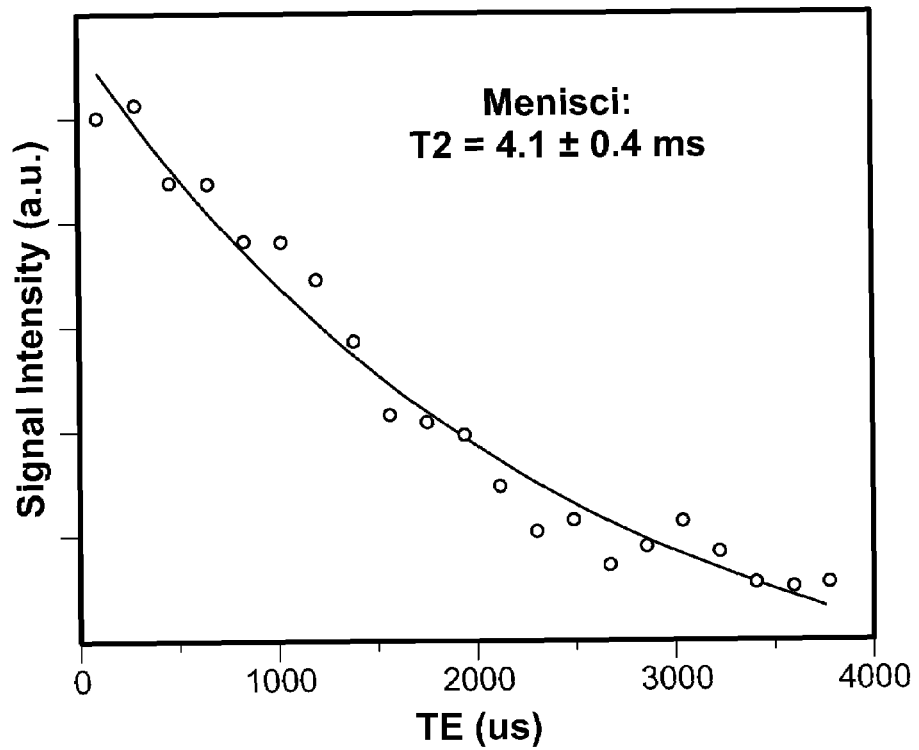

FIGS. 11A and 11B are plots illustrating data for assessing T2 values based on a set of MR images of a human knee. The plots include FID data points from a voxel in the calcified layer cartilage (FIG. 11A) and meniscus (FIG. 11B). Exponential fits of the FID data points indicate a T2 relaxation time of about 1.37 ms for the cartilage and 4.1 ms for the meniscus.

Figure 12:
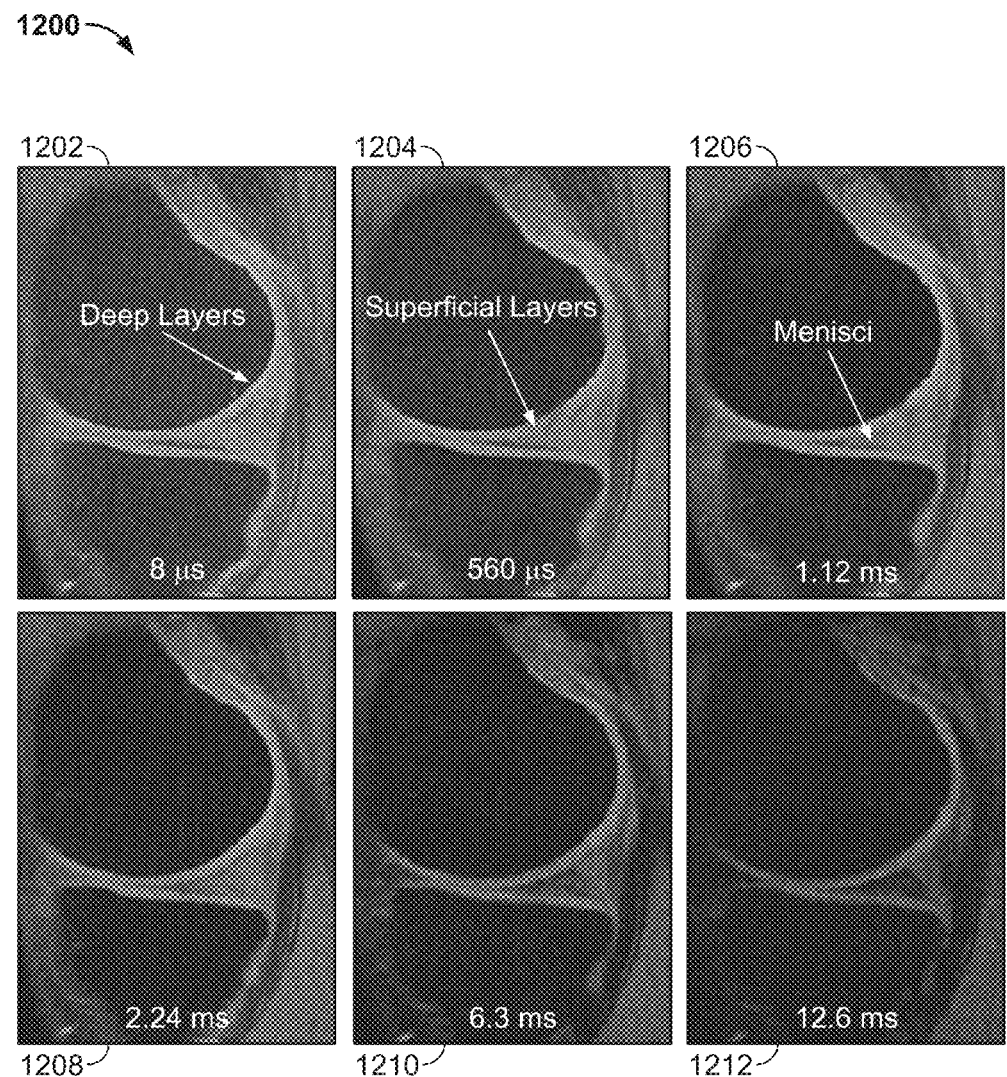
FIG. 12 is a set of example MR images of a human knee for multiple echo times.

UTE spectroscopic imaging with high spatial resolution was also investigated. FIG. 12 is a set of example MR images 1200 of a human knee for multiple echo times. The example images 1200 are based on UTESI with fat signal suppression using a long duration Gaussian pulse focused on the fat resonance frequency. The image dynamic range was increased, providing high contrast for the cartilage and meniscus in the time domain image series, as shown in FIG. 12. The undersampling streak artifact is significantly reduced due to the view sharing reconstruction.

FIG. 13 is a set of example spectroscopic MR images 1300 of a human knee for multiple temporal frequencies. The images 1300 are based on Fourier transformation of time-domain images, including the time-domain images 1200 illustrated in FIG. 12. The deep layers of cartilage (thin arrow) and meniscus (thick arrow) appear bright over a broad range of spectrum, suggesting its short T2 relaxation time. High contrast was achieved for the deep layers of cartilage at around −200 Hz away from the water peak resonance frequency, where the superficial layers of cartilage appear dark due to its long T2 relaxation time and narrow spectrum. The spectroscopic images near the peak resonance frequency did not show significant streak artifact which was shifted to high spectral frequencies due to the interleaved acquisition scheme.

Figure 14:
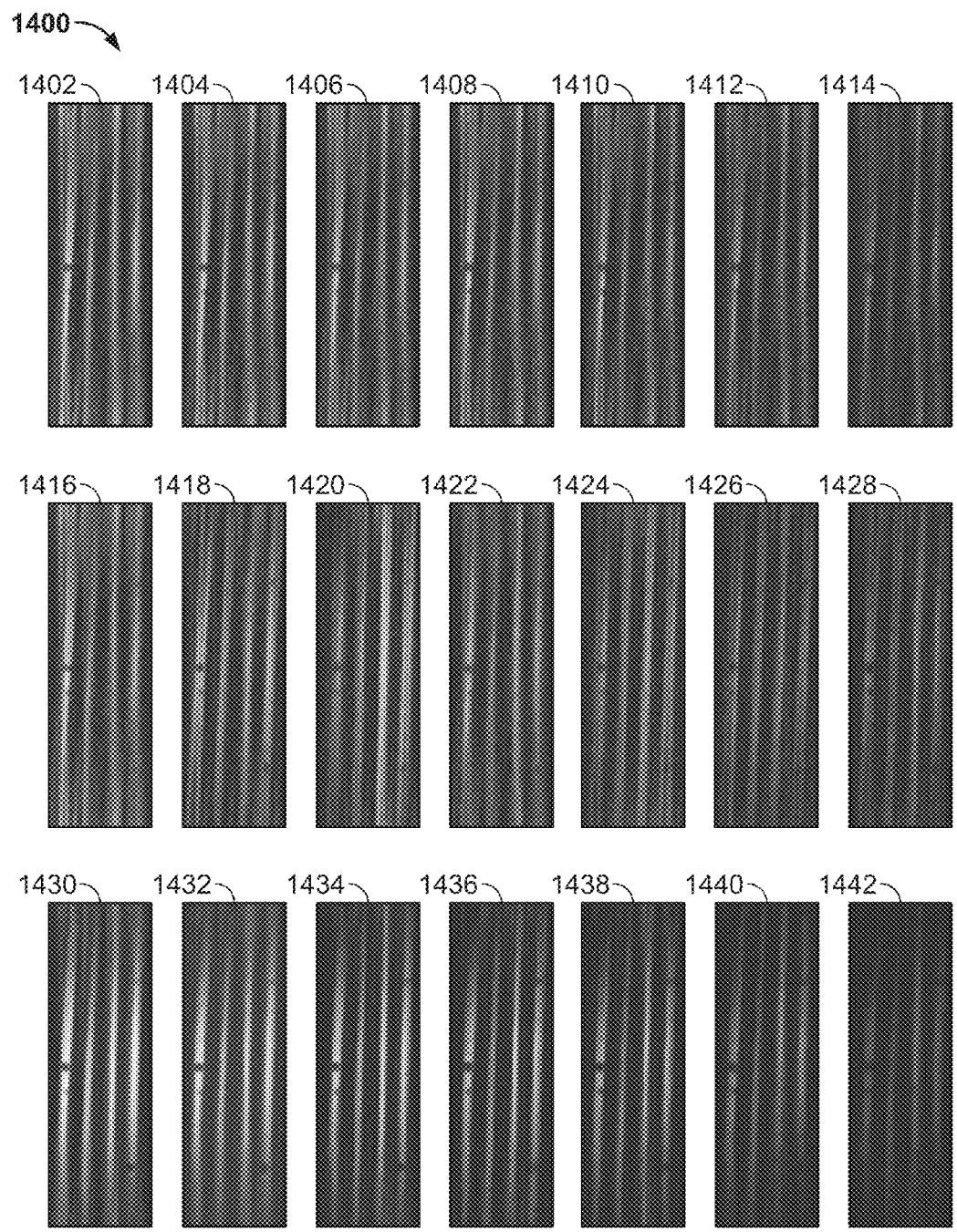
FIG. 14 is a set of example MR images of multiple rubber bands for multiple echo times.

FIG. 14 is a set of example MR images 400 of multiple rubber bands for multiple echo times. Seven different echo times are represented in FIG. 14. The three images in each vertical column of images are associated with the same echo time. The echo times increase from 8 µs on the left to 1568 µs on the right. Images 1402, 1416, and 1430 (first column on the left) are associated with an echo time of 8 µs. Images 1404, 1418, and 1432 (second column from the left) are associated with an echo time of 128 µs. Images 1406, 1420, and 1434 (third column from the left) are associated with an echo time of 248 µs. Images 1408, 1422, and 1436 (middle column) are associated with an echo time of 368 µs. Images 1410, 1424, and 1438 (third column from the right) are associated with an echo time of 608 µs. Images 1412, 1426, and 1440 (second column from the right) are associated with an echo time of 968 µs. Images 1414, 1428, and 1442 (rightmost column) are associated with an echo time of 1568 µs.

The images 1402-1414 in the top row are generated without projection interleaving. The images 1416-1428 in the middle row are generated with projection interleaving and without tornado filtering. The images 1418-1442 in the middle row are generated with projection interleaving and with tornado filtering. Tornado filtering significantly reduced the undersampling streak artifact.

The rubber bands represented in the images 1400 have a short T2* relaxation time. The images are based on a total number of 1935 radial projections, divided into forty-five groups with an initial TE of 8 μs and a TE delay of 120 μs thereafter. Each group includes forty-three projections that sparsely cover the k-space. For the top row of images 1402-1414, the same set of forty-three projections was applied for all forty-five groups. For the middle row of images 1416-1428, the forty-five groups of projections are interleaved into different sets of projection angles. Images at each TE were then reconstructed with and without high frequency view sharing. Other imaging parameters included a FOV of 8 cm, a TR of 20 ms, variable TE ranging from 8 μs to 5.4 ms, a flip angle of 60°, a bandwidth (BW) of 62.5 kHz, readout of 256 points in a total scan time of 1.3 min.

Streak artifacts appear in each of the images 1402-1414 generated without projection interleaving (in the top row) because of the undersampling. The streak artifact also appears in images 1416-1428 generated with projection interleaving and a conventional PR reconstruction algorithm (in the middle row). The streak artifact is reduced in the images 1430-1442 generated with view sharing of high frequency data from neighbor interleaves (in the bottom row).

FIG. 15 is a sets of example spectroscopic MR images of the rubber bands of FIG. 14 for multiple temporal frequencies. Nine different resonance frequencies are represented in FIG. 15. The three images in each vertical column of images are associated with the same resonance frequency. The resonance frequencies increase from left to right in FIG. 15. The middle row of images 1510, 1528, and 1546 are associated with the on-resonance frequency. The top row of spectroscopic MR images 1502, 1504, 1506, 1508, 1510, 1512, 1514, 1516, and 1518 are based in part on the top row of images 1402, 1404, 1406, 1408, 1410, 1412, 1414 in FIG. 14 that were generated without projection interleaving. The middle row of spectroscopic MR images 1520, 1522, 1524, 1526, 1528, 1530, 1532, 1534, and 1536 are based in part on the middle row of images 1416, 1418, 1420, 1422, 1424, 1426, and 1428 in FIG. 14 that were generated with projection interleaving and without tornado filtering. The bottom row of spectroscopic MR images 1538, 1540, 1542, 1544, 1546, 1548, 1550, 1552, and 1554 are based in part on the bottom row of images 1430, 1432, 1434, 1436, 1438, 1440, and 1442 in FIG. 14 with projection interleaving and with tornado filtering.

In the top row of images in FIG. 15, streak artifacts appear in all the spectroscopic images at different resonance frequencies when projection interleaving was not used. In the middle and bottom rows of images in FIG. 15, the undersampling streak artifact is shifted to high and low frequencies through the projection interleaving, and the images around the on-resonance frequencies are substantially free of streak artifacts. There is no significant difference between the on-resonance spectroscopic images without and with view sharing sliding window reconstruction, which is expected since both approaches take use of all the interleaved projection data during the Fourier transformation in the time domain.

Figure 16A:
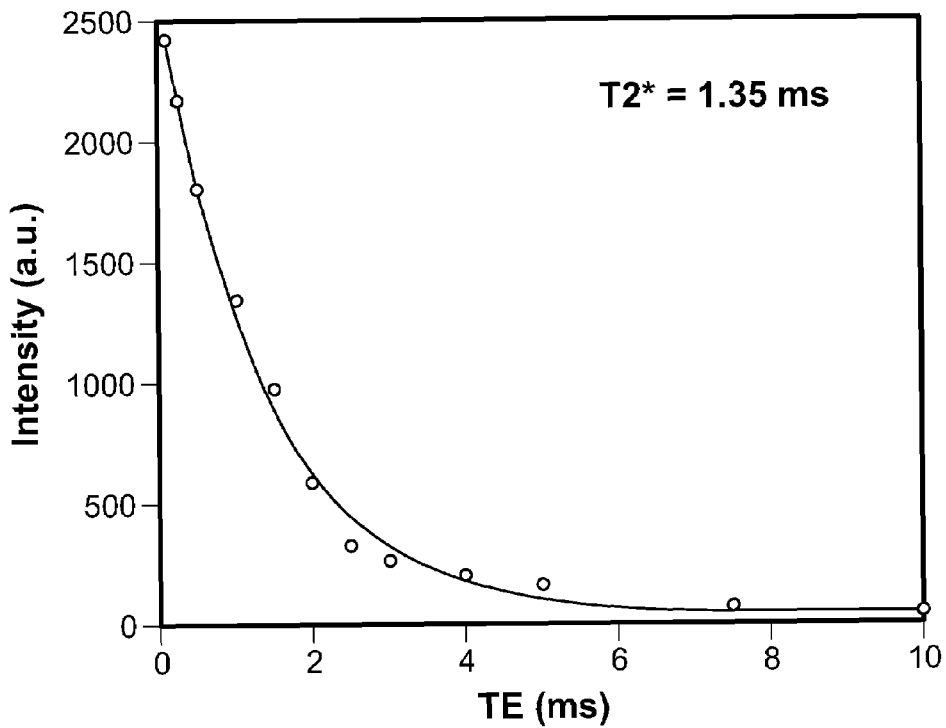
Figure 16B:
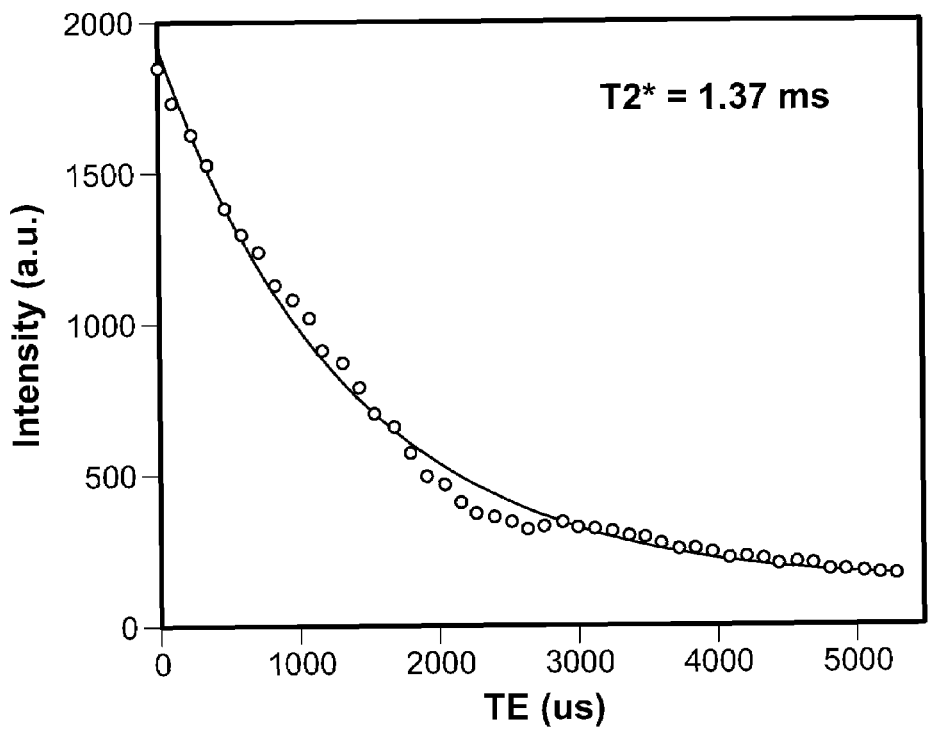
Figure 16C:
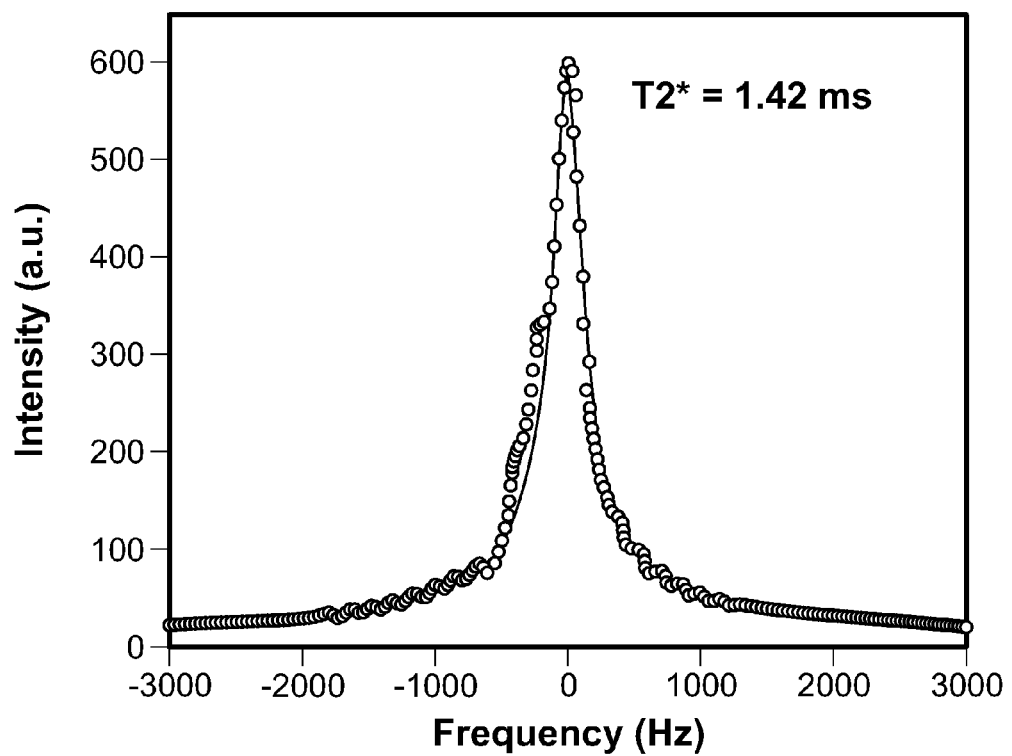

T2* quantification of a sample can be performed through exponential fitting of the time-domain images and modified Lorentizian line shape fitting of the spectroscopic images acquired with an interleaved UTE acquisition and view sharing sliding window reconstruction. FIGS. 16A-16C are plots illustrating data for assessing T2* values based on a set of MR images of the rubber bands, wherein FIGS. 16A and 16B illustrate data in the time domain and FIG. 16C illustrates data in the frequency domain. The reference standard using UTE acquisition at progressively increasing TEs under full sampling shows a short T2* of 1.35 ms, as shown in FIG. 16A. FIG. 16B shows fitting of the UTESI images in the time domain, which provides a similar T2* of 1.37 ms. FIG. 16C shows fitting of the magnitude spectroscopic images using a modified Lorentzian line shape function, which provides a T2* of 1.42 ms. There are still some streak artifacts in the time-domain UTESI images even with view sharing and sliding window reconstruction. The spectroscopic images are substantially free from streak artifacts around the peak resonance frequencies. In some implementations of view sharing and sliding window reconstruction, T2* quantification through line shape fitting in the frequency-domain is less affected by the undersampling streak artifact.

Figure 17A:
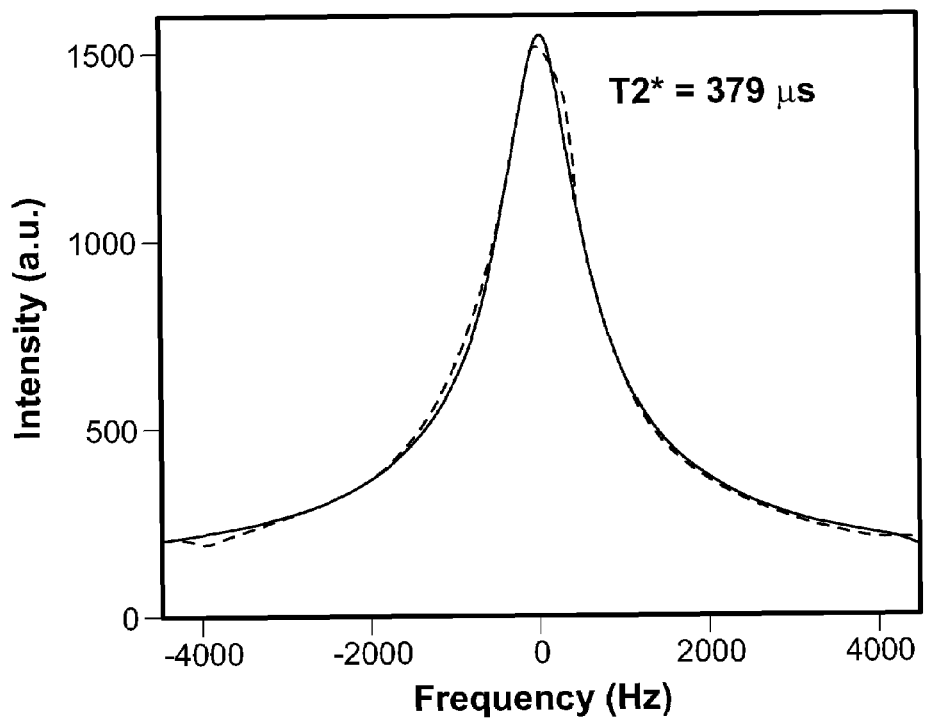
Figure 17B:
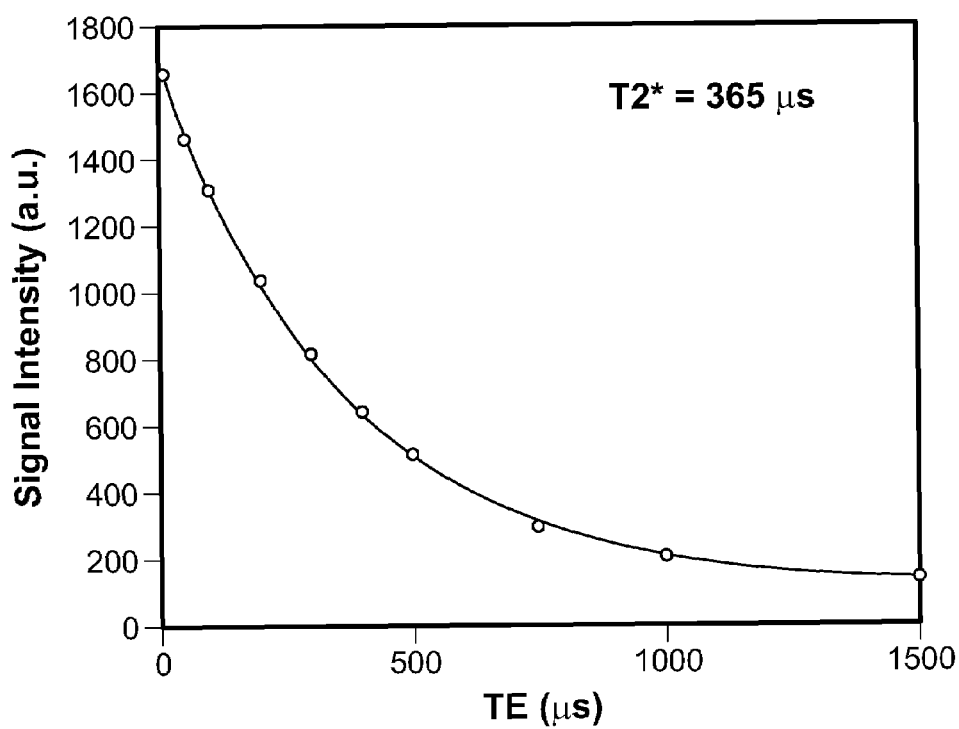

The accuracy of T2* quantification in vivo using UTESI can be evaluated by comparing T2* derived from the modified Lorentzian line shape fitting with T2* from a reference scan using full-sampled UTE acquisition at progressively increasing TEs. FIGS. 17A and 17B are plots illustrating data for assessing accuracy of T2* quantification based on a set of MR images of cortical bone, wherein FIG. 17A illustrates data in the frequency domain and FIG. 17B illustrates data in the time domain. To reduce noise, an averaged spectrum from an ROI containing 10×10 pixels was used for fitting. The plots in FIG. 17A represents modified Lorentzian line shape fitting of an averaged magnitude spectrum, while the plots in FIG. 17B represent exponential line shape fitting in the time domain. The magnitude spectrum is represented by the dotted line in FIG. 17A, and the fitted line shape is represented by the solid line. The modified Lorentzian fit yields a broad FWHM of 1455 Hz and short T2* of 379 μs, which is consistent with the T2* value of 365 μs derived from exponential fitting of full-sampled UTE images shown in FIG. 17B.

The data acquisition schemes illustrated in FIGS. 1A, 1B, and 1C, in addition to the data processing techniques described with respect to FIGS. 2A, 2B, and 2C, can be applied to analyze samples at different angular orientations. For example, the magic angle effect and/or the bulk susceptibility effect may be investigated. In an example implementation, a human Achilles tendon is analyzed a multiple different orientations. Achilles tendon consists of type I collagen fibers with a triple helical structure embedded into the extracellular matrix, which is composed of elastins, glycoproteins and tendocytes. The highly ordered parallel bundles are optimized for transmitting force created in the muscle to the bone. Entheses are regions where tendons, ligaments or joint capsules are connected to bone, and also consists of type I collagen fibers. This anisotropy structure in Achilles tendon and enthesis precludes isotropic motion of water molecules, resulting in a larger apparent diffusion coefficient (ADC) in the direction parallel to the collagen fibers than that in the direction perpendicular to the collagen fibers. Meanwhile, the ordered hierarchy of collagen fibers considerably enhances dipole-dipole interaction which is angular dependent and can be described by the term $(3 \cos^2 \theta - 1)$ where $\theta$ is the angle between the fiber orientation and $B_0$ field. The dipolar interactions result in very short T2 relaxation times, or rapid signal decay. By orienting the fibers 550 or 1250 to $B_0$ field the term $(3 \cos^2 \theta - 1)$ is substantially zero (magic angle effect), the dipolar interactions are reduced and the effective T2 is considerably increased.

It is generally considered that there are two water populations in tendon, namely bound water and bulk water with mobility on two different time scales. Bound water molecules binding to proteoglycans and small peptides are subject to the residual dipole-dipole interactions, resulting in an angular dependent T2 relaxation time. Bulk water molecules bound to side chains of proteoglycans tumble isotropically and can be detected at all orientations. If the bulk water molecules are trapped in a cavity, the shape of the cavity will alter a local magnetic field inside it, resulting in an orientation dependent bulk susceptibility effect. The resonance frequency for water in disordered interconnecting gaps will shift by reorienting the tendon collagen fibers in the static magnetic field.

Figure 18:
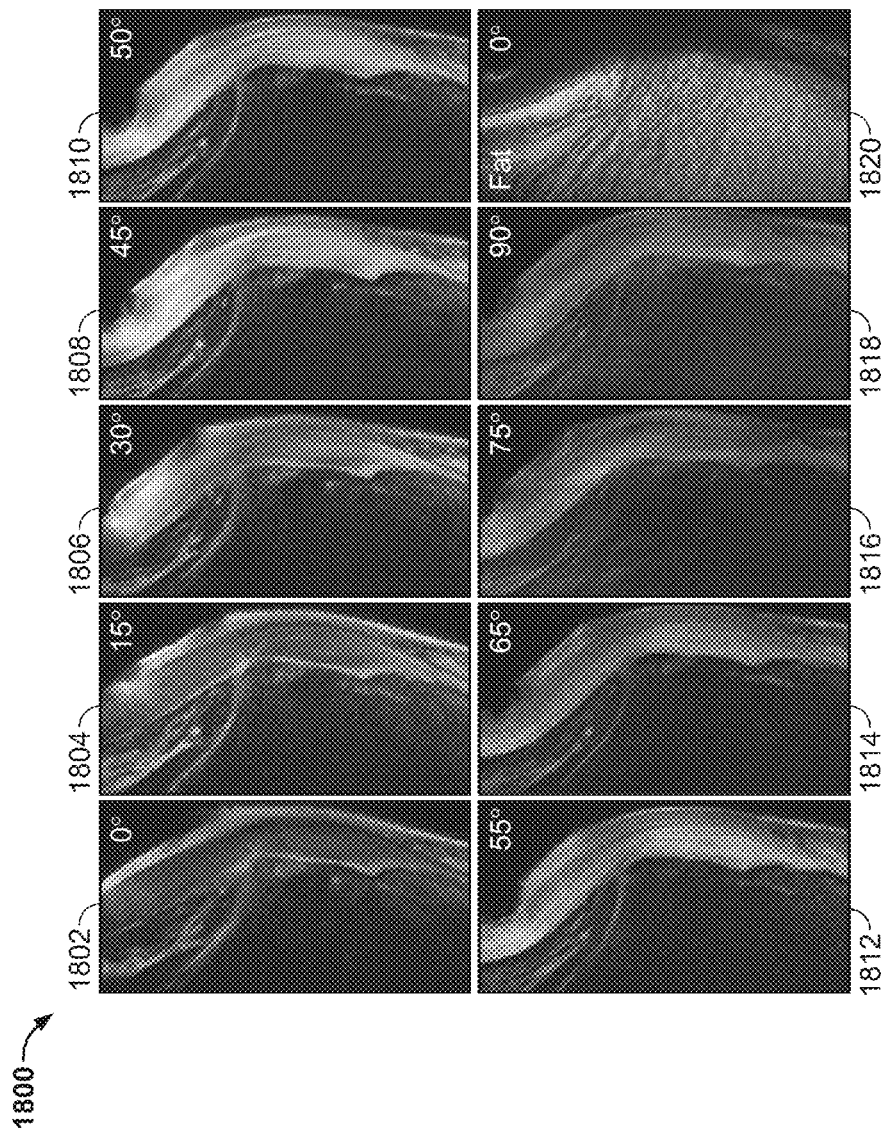
FIG. 18 is a set of MR images of a human Achilles tendon and enthesis in the sagittal plane at multiple angular orientations.

Bulk susceptibility effect can be directly derived from the resonance frequency shift of the UTE spectra peak at a series of angular orientations. FIG. 18 is a set of MR images of a human Achilles tendon and enthesis in the sagittal plane at multiple angular orientations. A significant signal increase is observed when the fibers are orientated 550 relative to the $B_0$ field. This is due to the magic angle effect which increases T2* of tendon and enthesis near the magic angle of 54.7°. A fat peak from 0° is also shown as a reference.

Figure 19:
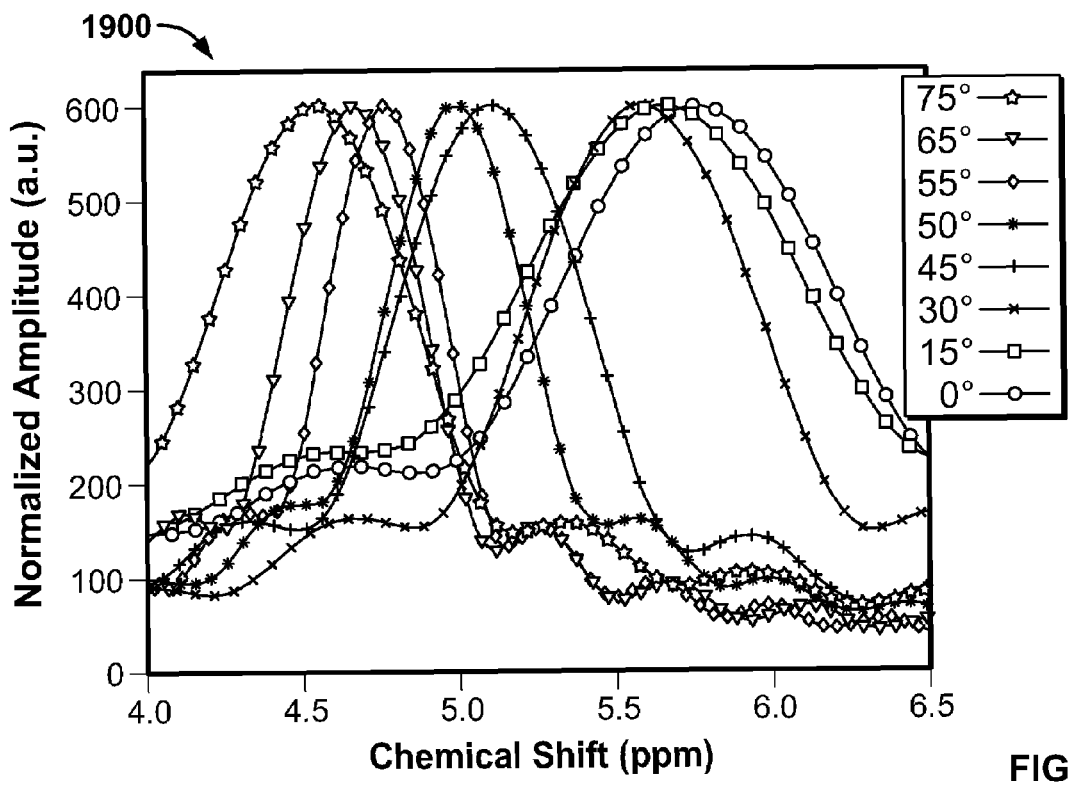
FIG. 19 is a plot illustrating magnitude MR spectra for a human Achilles tendon at multiple angular orientations.

FIG. 19 is a plot illustrating example magnitude MR spectra for a human Achilles tendon at multiple angular orientations. The example plot shows that the broad spectrum at 0° to $B_0$ becomes narrower at 55°, and then broader again as the orientation angle increases to 90°. Furthermore, the resonance frequency was shifted due to directional susceptibility of the Achilles tendon.

Figure 20:
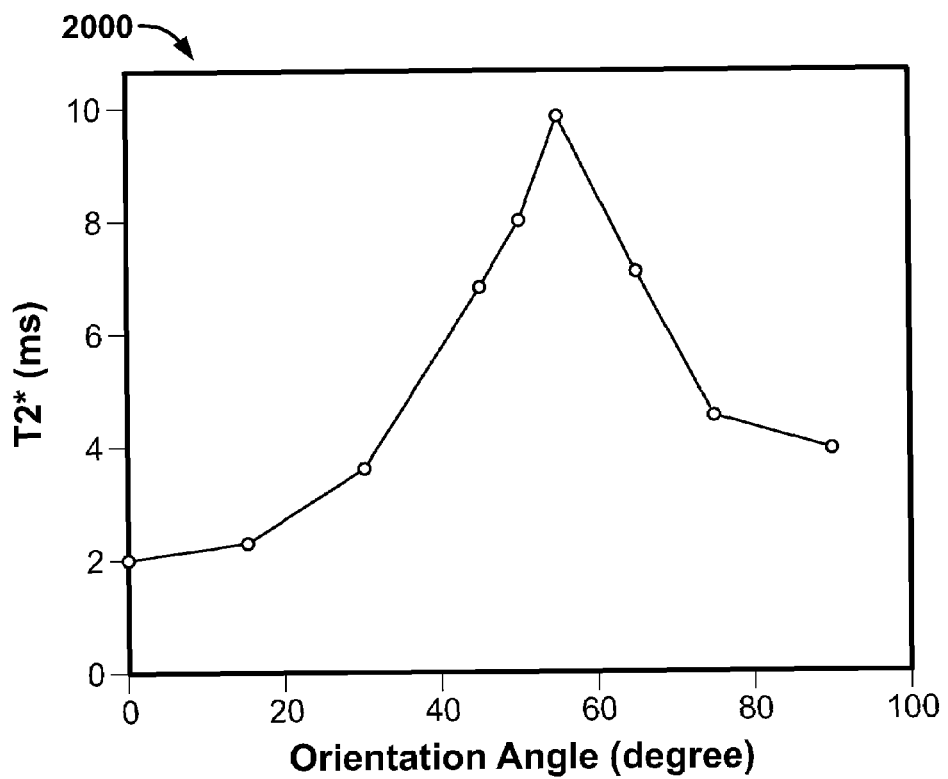
FIG. 20 is a plot illustrating values of T2* based on MR data from a human Achilles tendon at multiple angular orientations.

FIG. 20 is a plot illustrating values of T2* based on MR data from a human Achilles tendon at multiple angular orientations. T2* is fitted as a function of the orientation angle. T2* increased from 2 ms at 0° to 10 ms at 55°, and then gradually decreased to 4 ms at 90°.

Figure 21:
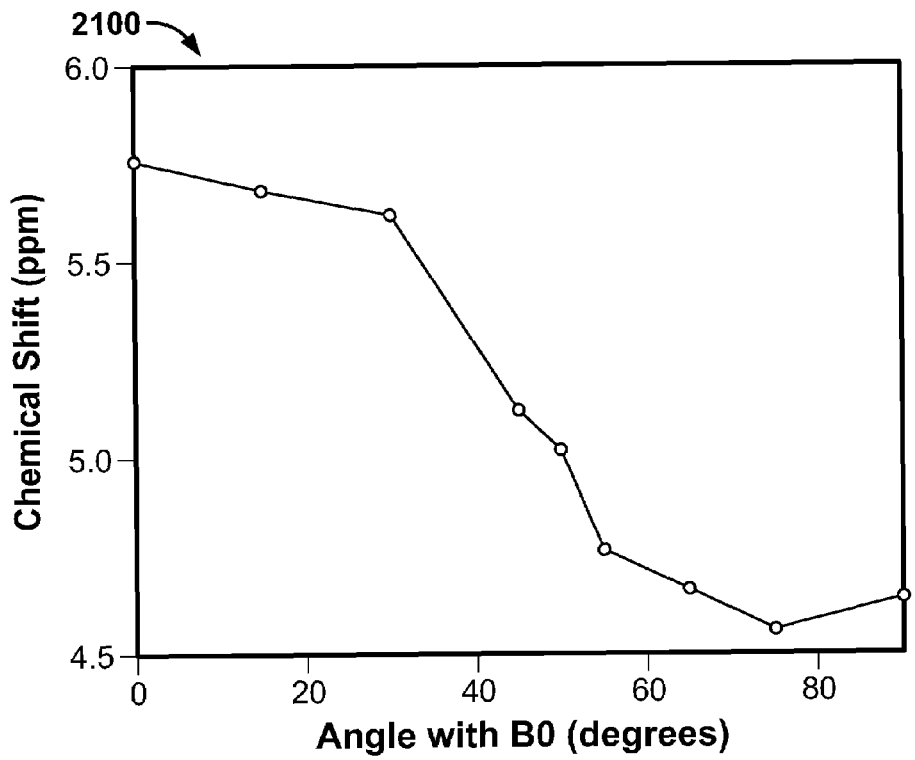
FIG. 21 is a plot illustrating values of chemical shift based on MR data from a human Achilles tendon at multiple angular orientations.

FIG. 21 is a plot illustrating values of chemical shift based on MR data from a human Achilles tendon at multiple angular orientations, showing the resonance frequency shift due to bulk susceptibility effect. There is a continuous frequency shift towards fat peak when tendon was orientated from 0° to 90° relative to $B_0$ field.

Figure 22:
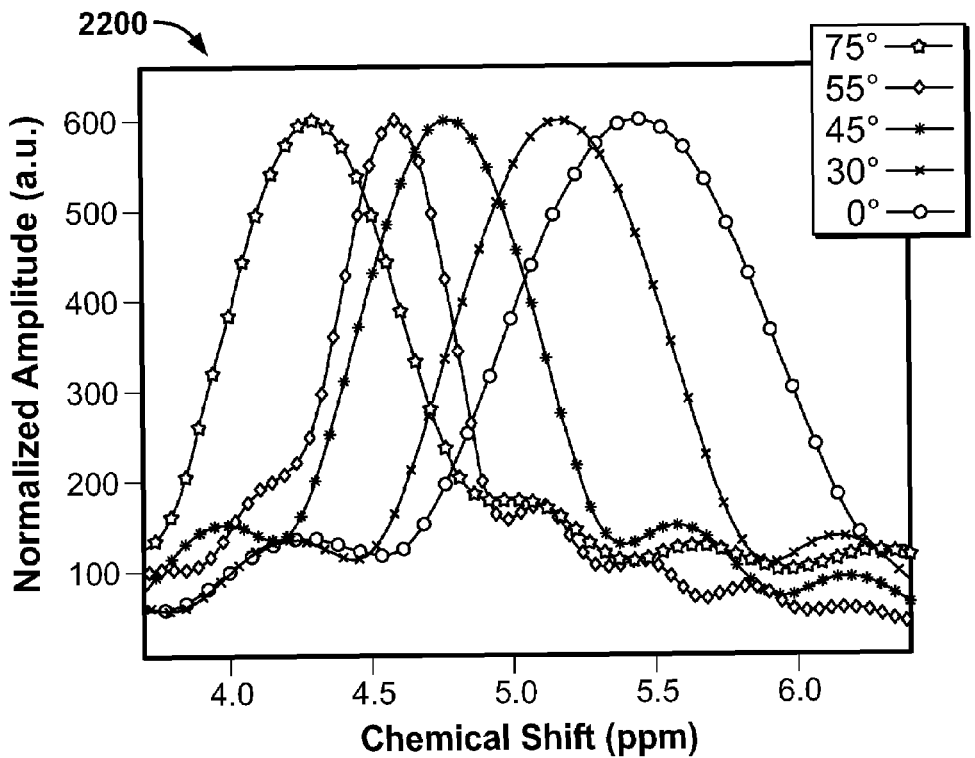
FIG. 22 is a plot illustrating magnitude MR spectra for a human Achilles tendon at multiple angular orientations.

FIG. 22 is a plot illustrating example magnitude MR spectra for a human Achilles tendon at multiple angular orientations. The example plot shows that the broad spectrum at 0° to B0 becomes narrower at 55°, and then broader again as the orientation angle increases to 90°. Furthermore, the resonance frequency was shifted due to directional susceptibility of the enthesis.

Figure 23:
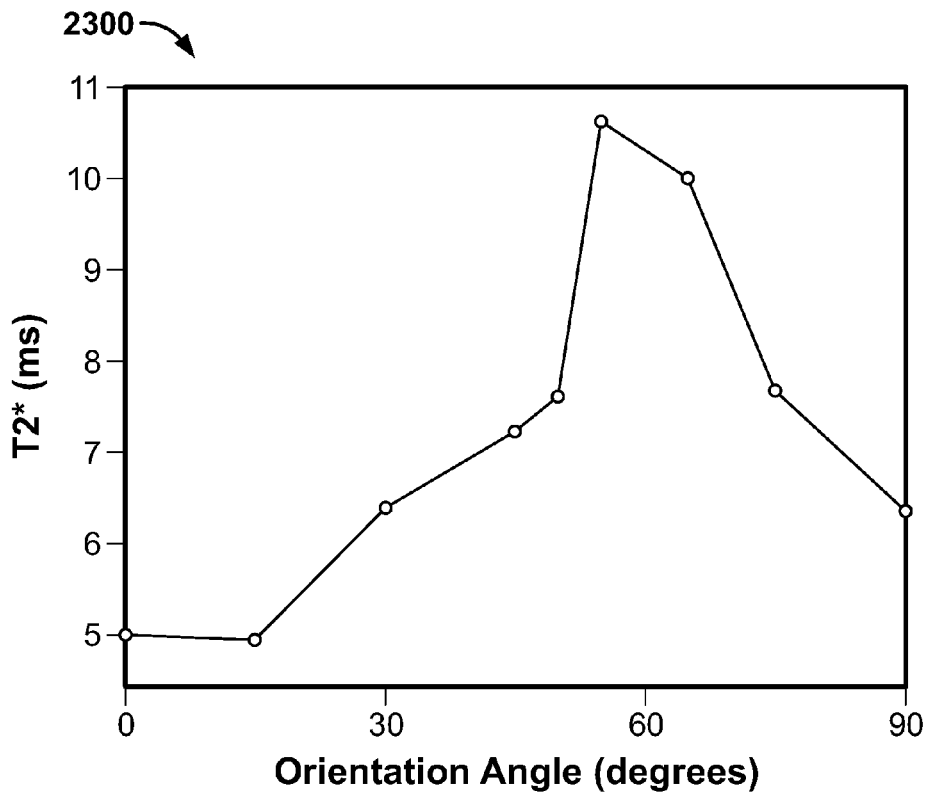
FIG. 23 is a plot illustrating values of T2* based on MR data from a human Achilles tendon at multiple angular orientations.

FIG. 23 is a plot illustrating values of T2* based on MR data from a human Achilles tendon at multiple angular orientations. T2* is fitted as a function of the orientation angle. T2* increased from 5 ms at 0° to 10 ms at 55°, and then gradually decreased to 6.4 ms at 90°.

Figure 24:
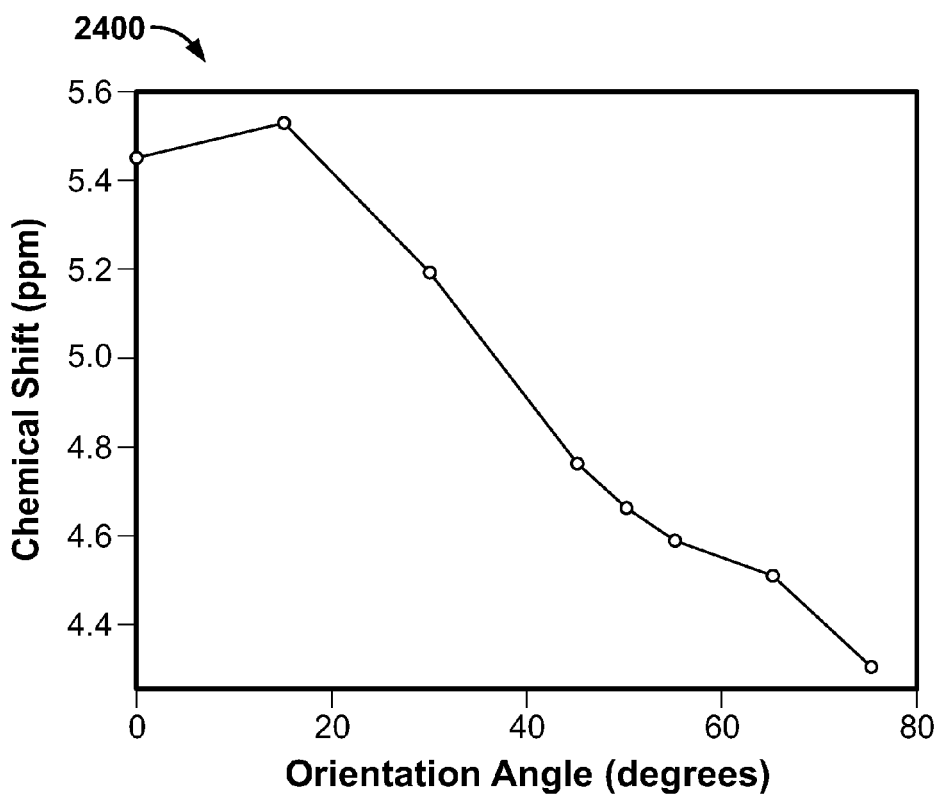
FIG. 24 is a plot illustrating values of chemical shift based on MR data from a human Achilles tendon at multiple angular orientations.

FIG. 24 is a plot illustrating values of chemical shift based on MR data from a human Achilles tendon at multiple angular orientations, showing the resonance frequency shift due to bulk susceptibility effect.

In another example, UTESI was applied to four human volunteers and six cadaveric specimens. The combination of highly undersampled interleaved projection reconstruction with a multi-echo UTE acquisition at progressively increasing TEs is able to provide high spatial resolution spectroscopic imaging of short T2 tissues in the musculoskeletal (MSK) system, including the deep radial and calcified layers of cartilage, menisci, ligaments, tendons and entheses. T2* was quantified through exponential signal decay fitting of the multi-echo images, or line shape fitting of the magnitude UTESI images. High spatial resolution and contrast images were generated for the deep radial and calcified layers of articular cartilage, menisci, ligaments, tendons and entheses, respectively. Line shape fitting of the UTESI magnitude spectroscopic images show a short T2* of 1.34±0.56 ms, 4.19±0.68 ms, 3.26±0.34 ms, 1.96±0.47 ms, and 4.21±0.38 ms, respectively.

In the example implementations, fresh human ankles were harvested from nonembalmed cadavers. The ankle samples include a distal portion of the leg, ankle and foot, including intact soft tissues. The specimens were immediately deep-frozen at −40° C. (Form a Bio-Freezer; Form a Scientific, Marietta, Ohio). The specimens were then allowed to thaw for 36 hours at room temperature prior to imaging. A quadrature knee coil is used for signal reception in volunteer studies. A 3-inch coil is used for cadaveric specimens. Typical acquisition parameters include: FOV of 14 to 16 cm for volunteers and 10 cm for cadaveric samples, TRs of 60 to 200 ms, an initial TE of 8 µs and a TE delay of 120 to 300 µs thereafter, one to four echoes with an echo spacing of 4-6 ms, flip angle of 40° to 60°, bandwidth of ±62.5 kHz, readout of 512 (actual sampling points=278), 3 to 8 slices, slice thickness of 2 to 3 mm, 1980 to 2025 projections interleaved into 45 to 72 groups. The total scan time is about 8 to 13 minutes. The oblique sagittal plane is used to evaluate the calcified layer of cartilage in the femorotibial joint and meniscus. The oblique coronal plane is used to image the lateral collateral ligament. The oblique sagittal and axial planes are used to interrogate the Achilles tendon and enthesis. MR images are reviewed by a subspecialized musculoskeletal radiologist to identify region of interest placement in normal appearing calcified layer of the femorotibial joint, the ligament, the meniscus, the Achilles tendon and enthesis. Normal calcified layer cartilage is identified by its location just superficial to subchondral bone, its thin linear morphology and bright signal intensity. Normal appearing meniscus is identified by its triangular morphology in the sagittal plane, and the absence of any regions of superimposed linear signal that extend to an articular surface. Normal appearing ligament, Achilles tendon and enthesis are defined by its uniform signal and linear morphology.

Figure 25:
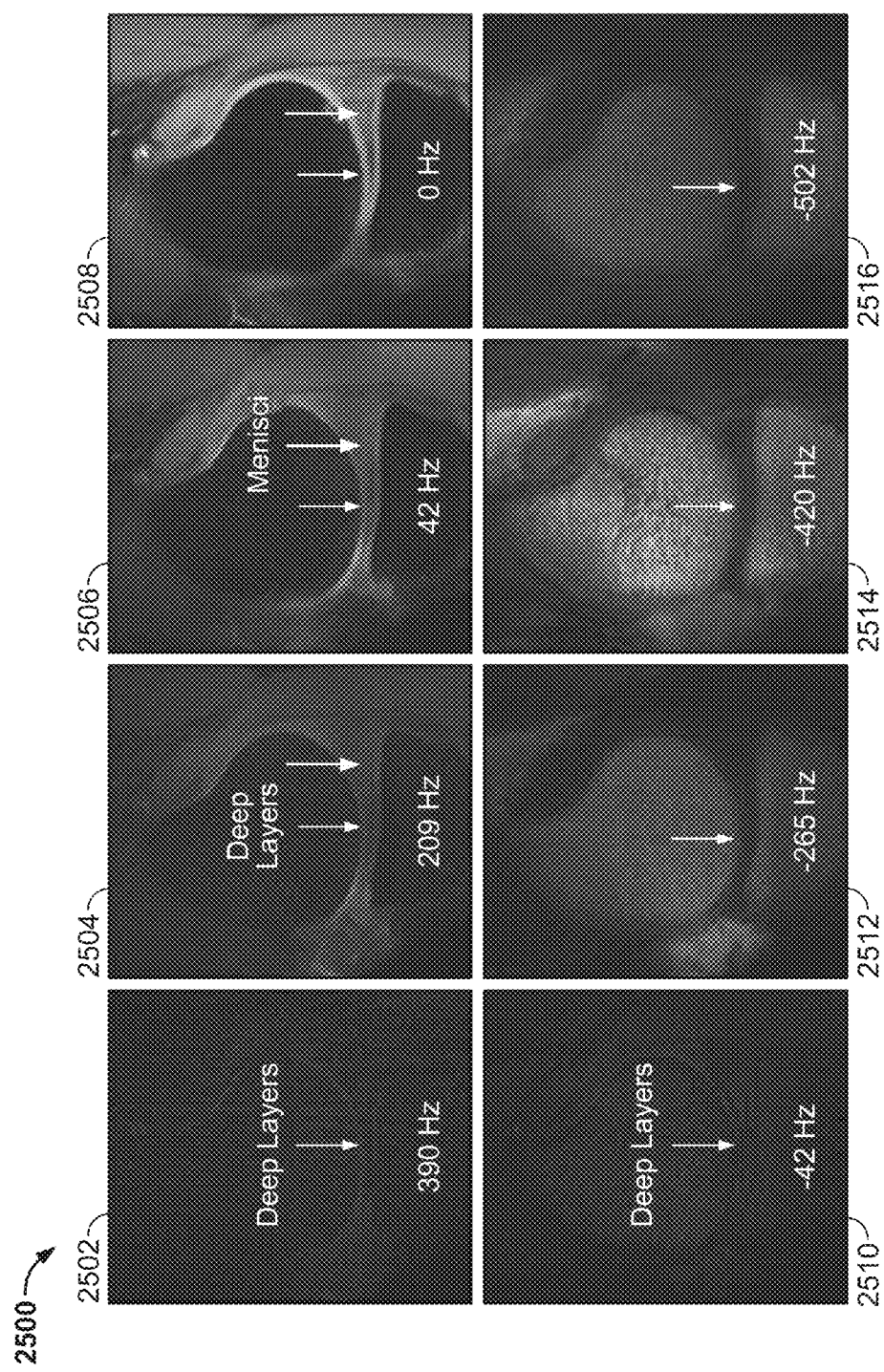
FIG. 25 is a set of example spectroscopic MR images of a human knee for multiple temporal frequencies.

FIG. 25 is a set of example spectroscopic MR images 2500 of a human knee for multiple temporal frequencies. The example images 2500 show UTE spectroscopic images of the femorotibial articular cartilage and meniscus from a healthy volunteer with a quadrature knee coil for signal reception. The imaging FOV of 16 cm, readout of 512 and 3 mm slice thickness resulted in an acquired voxel size of 0.3×0.3×3.0 mm³, depict the knee structure such as the superficial layers of cartilage, deep radial and calcified layers of cartilage and meniscus. The deep layers of cartilage appear bright over a broad range of spectrum, consistent with their short T2 relaxation time. Fat signal is shifted to −420 Hz at 3T, suggesting that UTESI provides accurate fat water separation. The undersampling streak artifact was shifted to high spectral frequencies, leaving streak artifact free images near the water resonance frequencies.

Figure 26B:
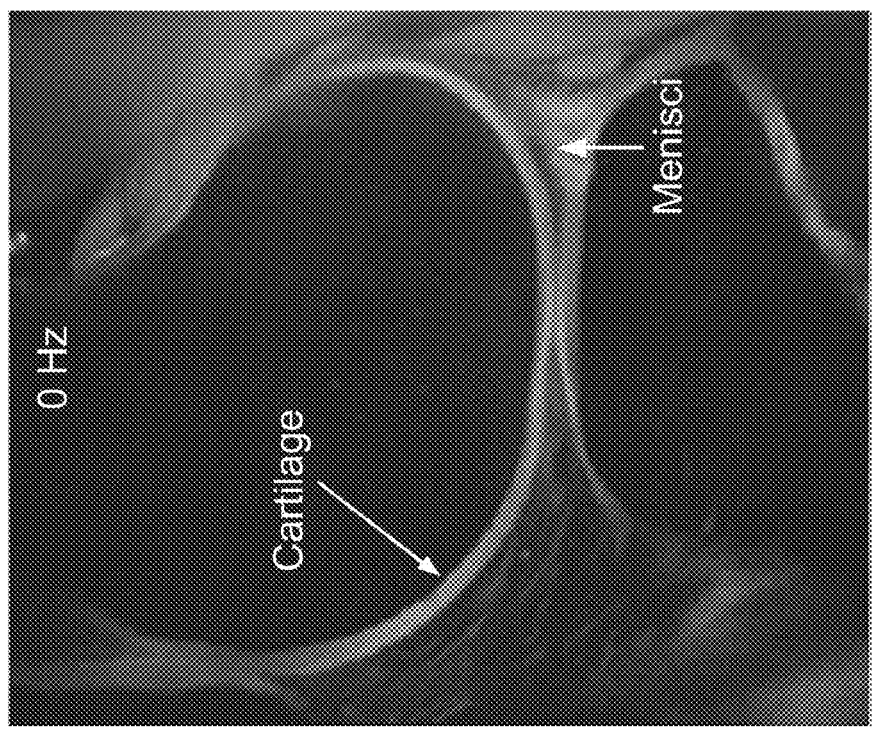
FIGS. 26A and 26B are example spectroscopic MR images of a human knee for the same temporal frequency.
Figure 26A:
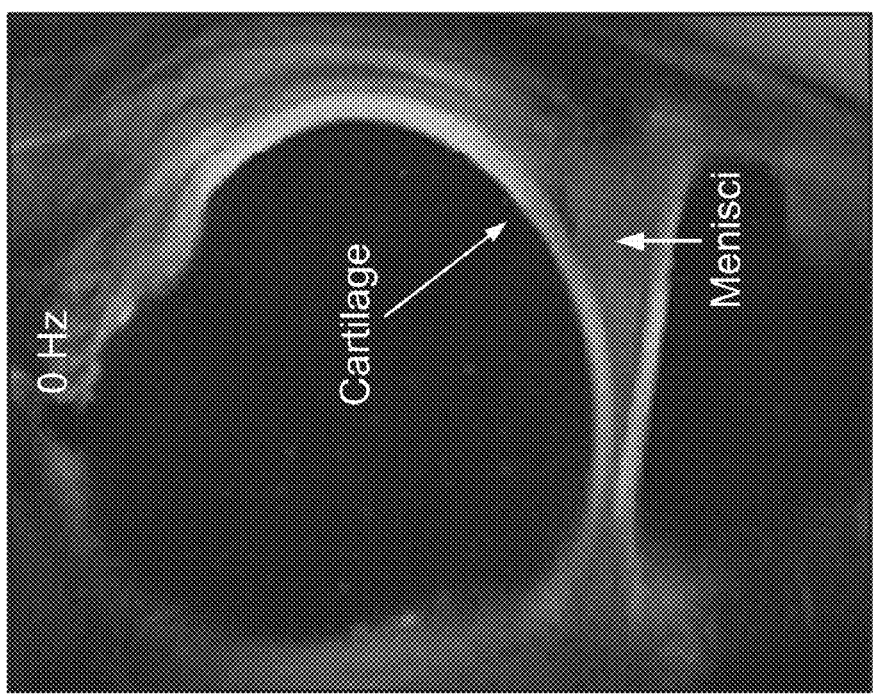

FIGS. 26A and 26B are example spectroscopic MR images of two different slices of a human knee for the same resonance frequency. Both the articular cartilage and meniscus are depicted with high spatial resolution, high SNR, and fat suppression without substantial streak artifact.

Figure 27:
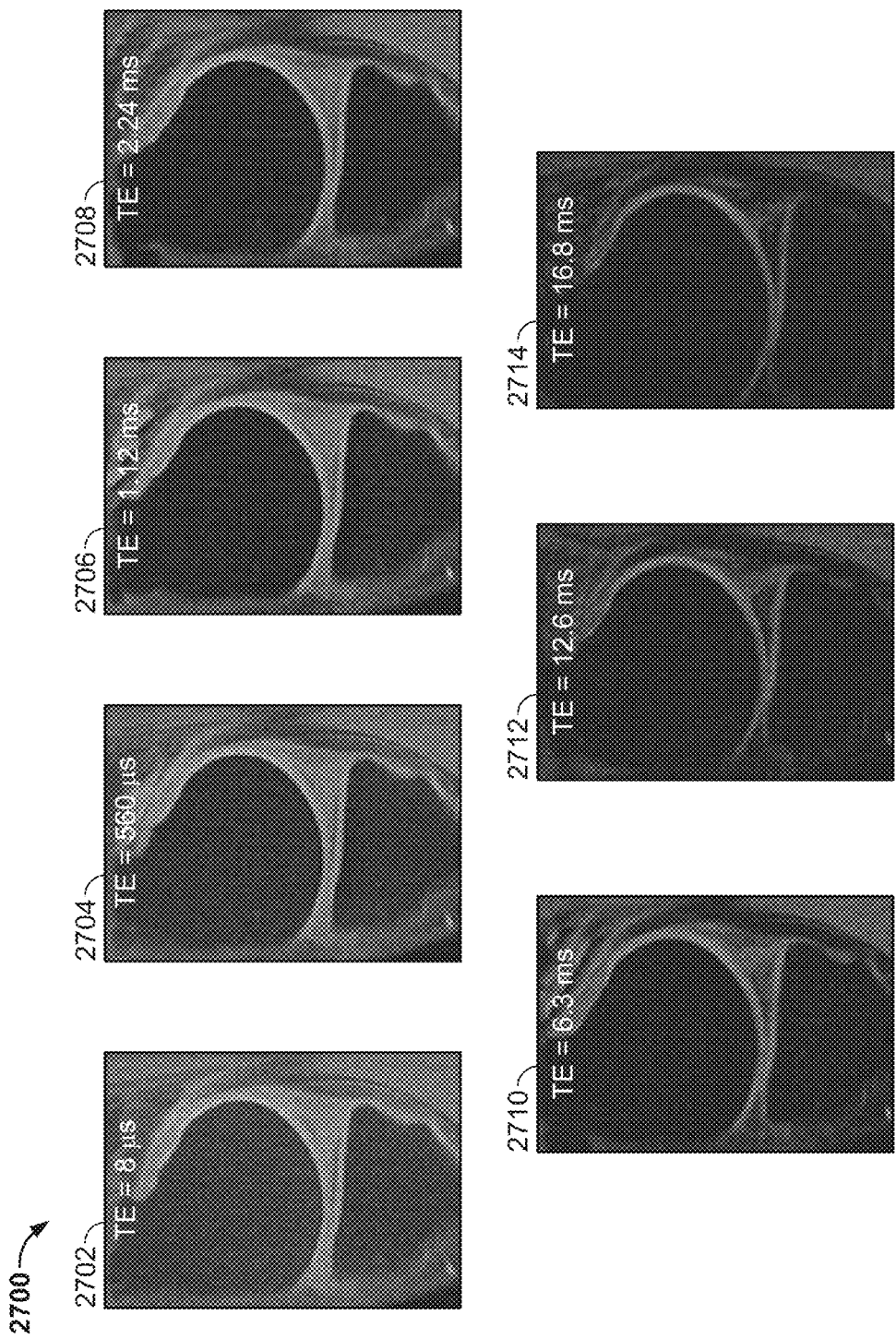
FIG. 27 is a set of example MR images of a human knee for multiple echo times.

FIG. 27 is a set of example MR images 2700 of a human knee for multiple echo times. The acquisition parameters are: FOV=16 cm, slice thickness=3 mm, number of readouts=512, number of radial projections=2025 (45 interleaves with TE delay of 120 us), TR=150 ms, TE=8 µs, 4 echoes per readout with echo spacing of 5.2 ms. The total scan time=10 minutes.

Figure 28:
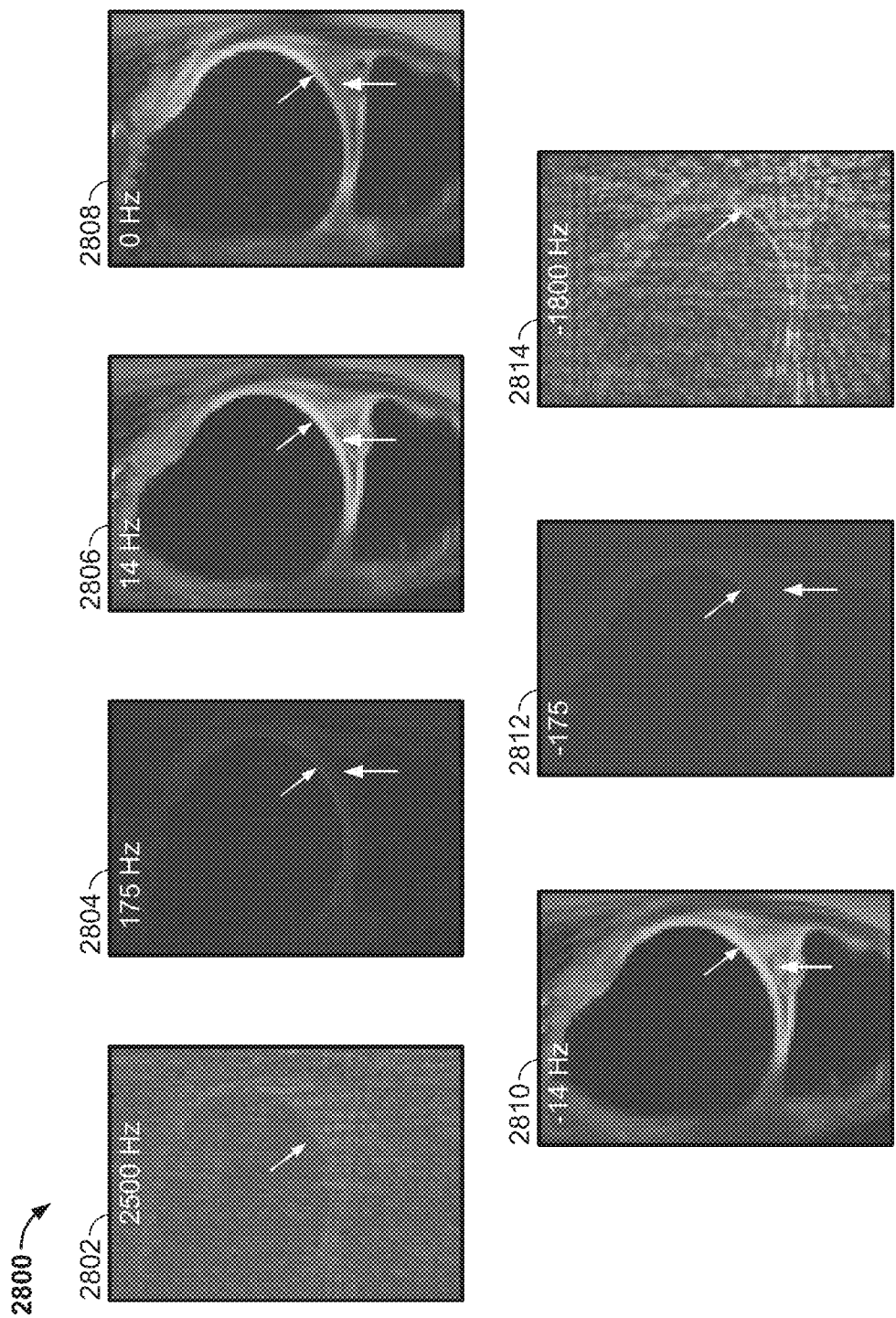
FIG. 28 is a set of example spectroscopic MR images of a human knee for multiple temporal frequencies.

FIG. 28 is a set of example spectroscopic MR images 2800 of the human knee for multiple temporal frequencies. The images 2800 are generated based in part on the images 2800 of FIG. 28. The calcified layer and menisci are well depicted across a broad spectrum range, consistent with their short T2 values. The acquired pixel size is 0.31×0.31×3.0 mm², with a spectral bandwidth of 7.1 kHz, and spectral resolution of 7 Hz (after zero-filling). The first and last images were re-scaled to show the strong streak artifacts, which were shifted to high frequencies because of the interleaved acquisition.

Figure 29A:
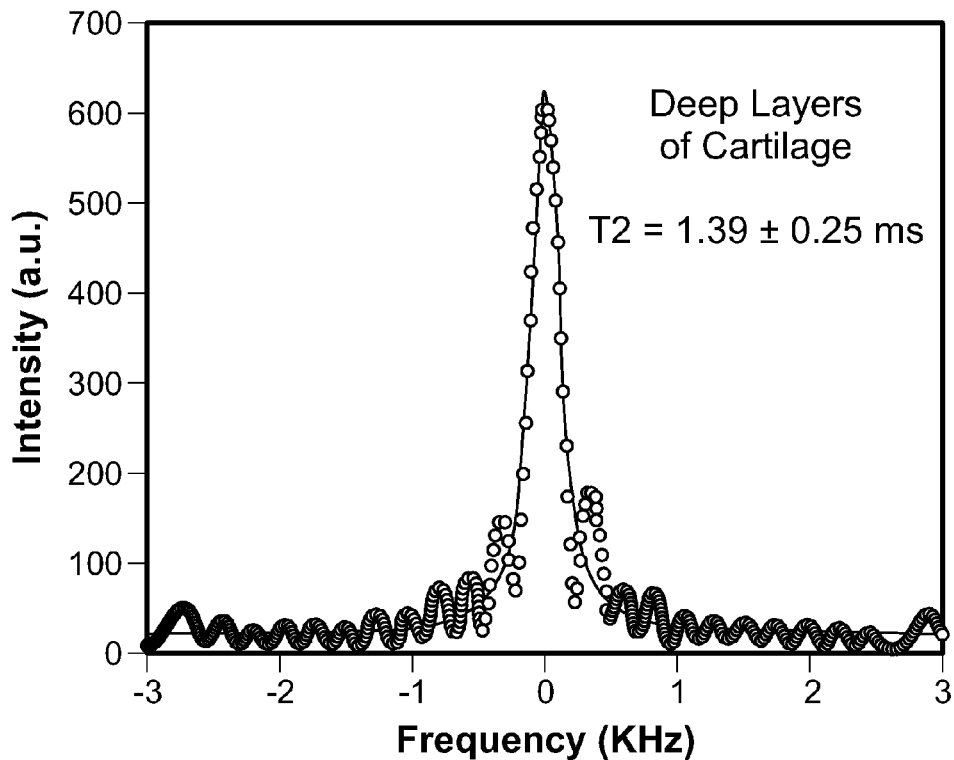
Figure 29B:
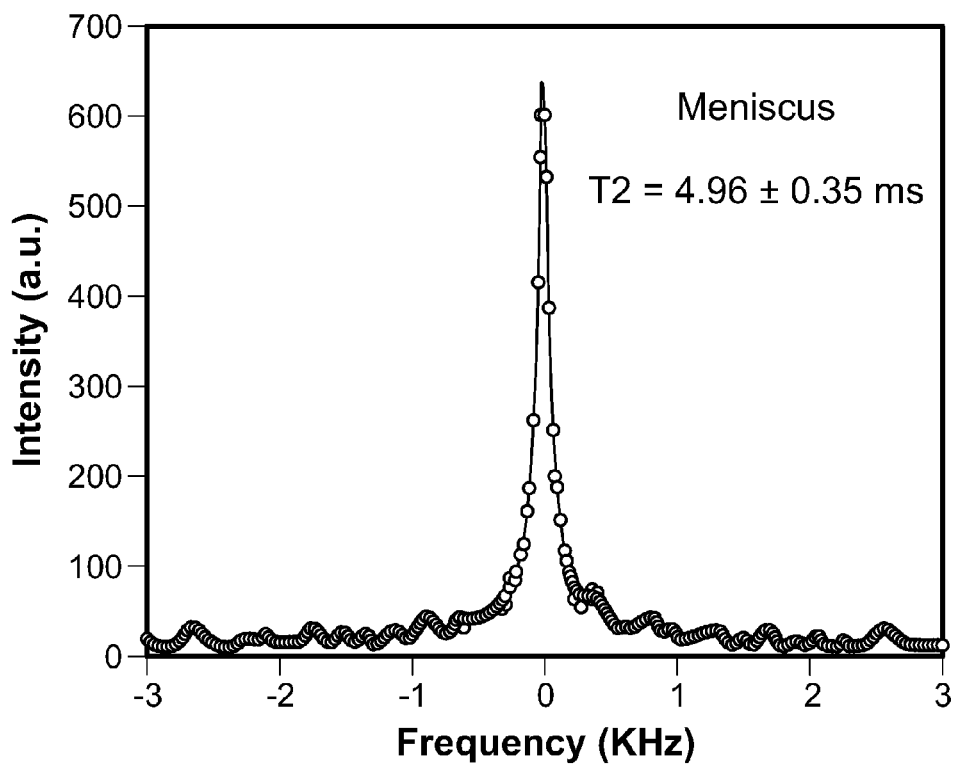
Figure 29C:
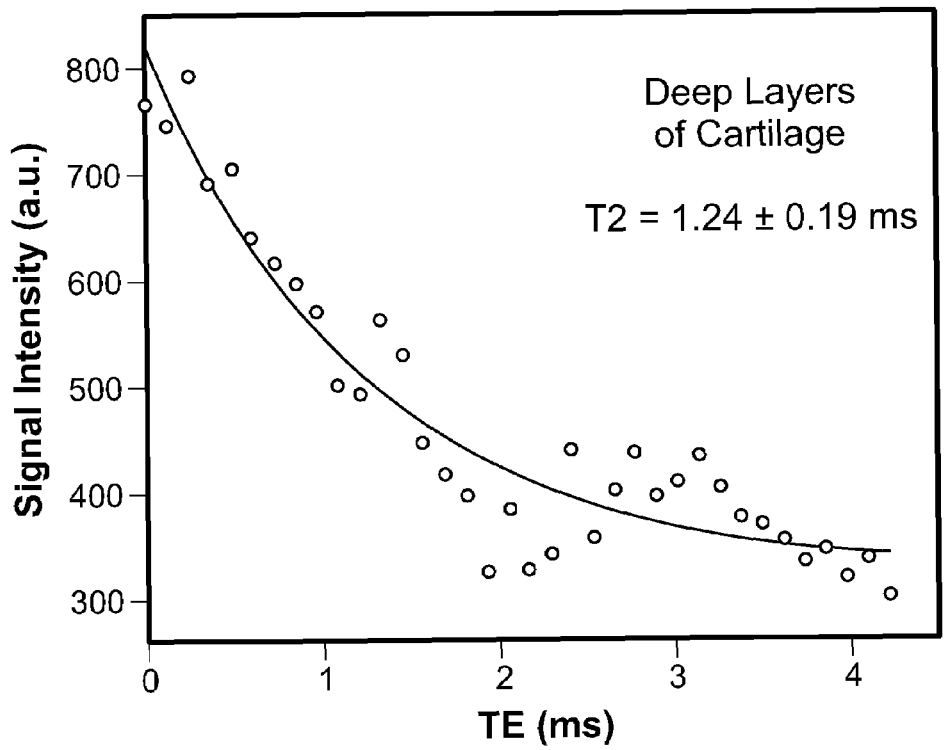
Figure 29D:
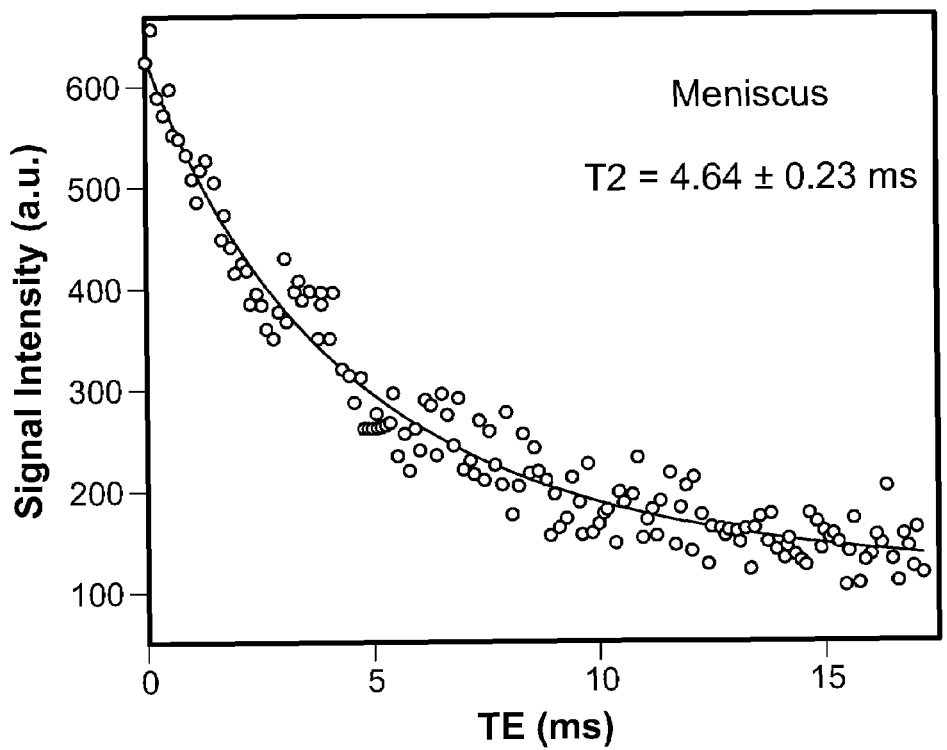

FIGS. 29A-29D are plots illustrating data for assessing T2 values based on a set of MR images of a human knee, wherein FIGS. 29A and 29B illustrate data in the frequency domain and FIGS. 29C and 29D illustrate data in the time domain. FIGS. 29A and 29C are based on UTE spectra from a small ROI (3 pixels) drawn in the deep layers of cartilage. FIGS. 29B and 29C are based on UTE spectra from large ROI (100 pixels) in meniscus. Line shape fitting of the magnitude UTE frequency spectrum of the deep layers of cartilage shows a short T2* of 1.39±0.25 ms (FIG. 29A), which was comparable with the value of 1.24±0.19 ms derived from exponential signal decay fitting in the time domain (FIG. 29C). Signal fluctuation in the decay curve occurs mainly due to the residual undersampling streak artifact. Line shape fitting of the magnitude UTE frequency spectrum of the meniscus shows a short T2* of 4.96±0.35 ms (FIG. 29B). Exponential signal decay fitting shows a similar T2* value of 4.64±0.23 ms (FIG. 29D).

Figure 30:
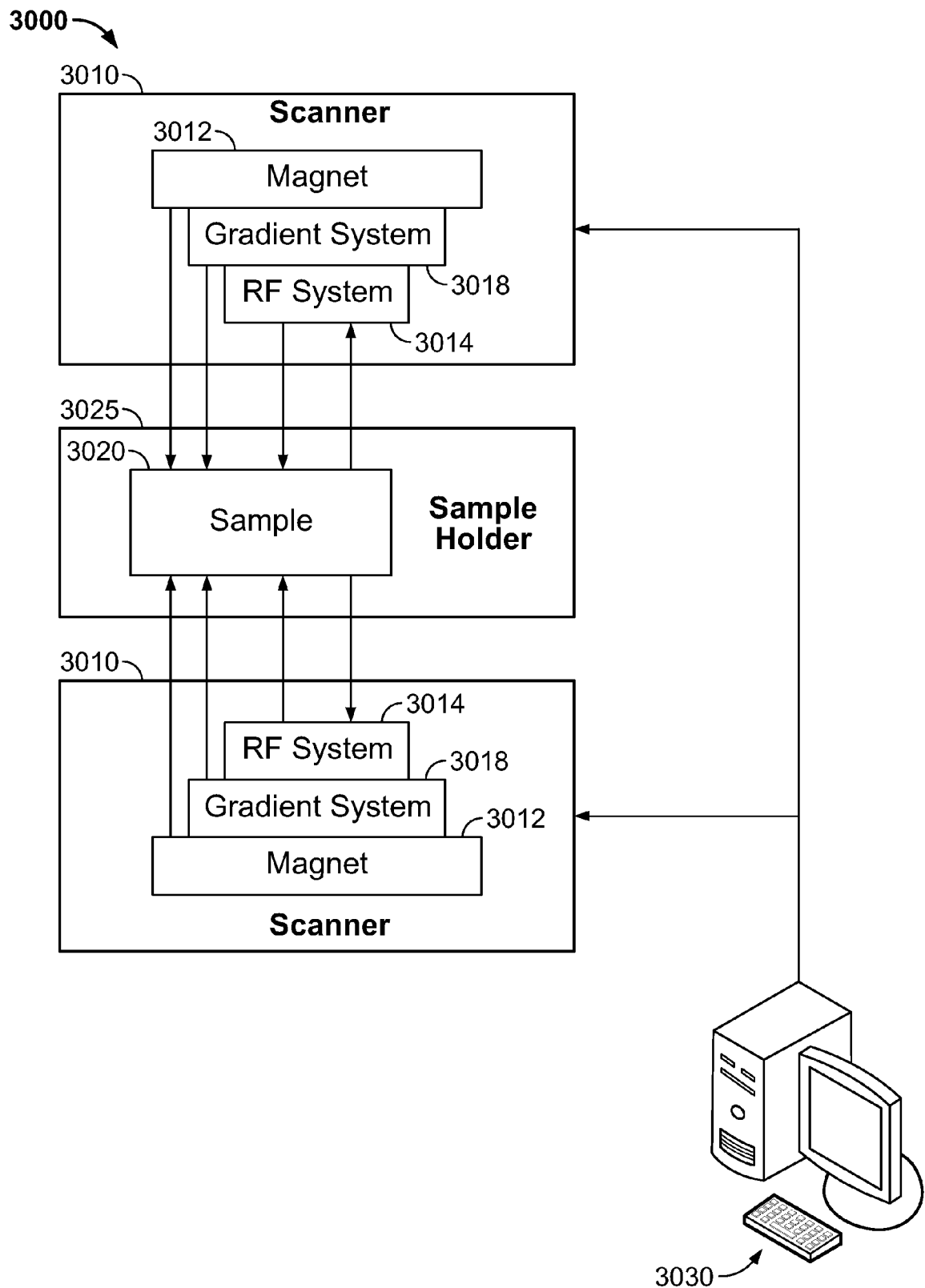
FIG. 30 is a block diagram illustrating an example system for magnetic resonance imaging (MRI).

FIG. 30 is a block diagram illustrating an example system 3000 for magnetic resonance imaging (MRI) with short echo times. The system 3000 can implement MRI techniques disclosed in this specifications. For example, the system 3000 can be used to acquire MR echo signals having an ultrashort echo time and/or longer echo times. The MRI system 3000 can be implemented using commercially available MRI scanners. Examples of commercially available MRI scanners include a 3 Tesla Signa TwinSpeed scanner (GE Healthcare Technologies, Milwaukee, Wis.), and/or others.

The MRI system 3000 includes a scanner 3010, a data processing apparatus 3030 and a sample holder or table 3025 for holding a sample 3020. The scanner 3010 includes a main magnet 3012, a gradient system 3018 and an rf system 3014. The main magnet 3012 is designed to provide a substantially constant, homogeneous magnetic field (e.g., 3 Tesla, or a different field strength). For example, the main magnet 3012 can be implemented as an electromagnet, a superconducting magnet, or another type of magnetic.

The gradient system 3018 may include multiple gradient coils designed to provide magnetic field gradients (e.g., gradients along axes defined by a Cartesian geometry, a polar geometry, or a different geometry). The gradient system 3018 can select for acquisition signals generated by a desired slice. The gradient system 3018 can select for acquisition signal components corresponding to radial trajectories through a spatial frequency domain (i.e., k-space) of the sample 3020. The gradient system 3018 can generate a phase encoding and/or slice-selecting magnetic field. The gradient system 3018 can further include components such as gradient amplifier (not shown), and various other hardware components. In some implementations, the gradient system 3018 includes a maximum gradient performance of 40 milliTesla/meter and 150 milliTesla/meter/millisecond.

The rf system 3014 may include an rf transmit coil and a separate rf receive coil designed to separately transmit and receive rf pulses. Alternatively, the rf system 3014 may include an rf transceiver that has a single rf coil for receiving and for transmitting rf signals. For example, a close-fitting smaller coil may improve image quality when a small region is being imaged. In some cases, depending of the sample and/or the particular imaging application, various types of coils can be placed around specific parts of a body (e.g., the head, knee, wrist, etc.) or even internally. The rf system 3014 can further include components such as an rf synthesizer (not shown), a power amplifier (not shown), and various other hardware components. The rf system 3014 may be equipped with fast transmit/receive (T/R) switching to allow the use of TEs down to 8 µs. In some cases, a 3 inch coil is used for signal reception.

The data processing apparatus 3030 is designed to receive and process acquired data to obtain desired images and information. For example, the data processing apparatus 3030 can be implemented as a computer or as various computing components (e.g., servers, routers, workstations, and/or software components) in a distributed computing environment. For example, the data processing apparatus 3030 can generate images of the sample 3020 based on acquired magnetic resonance signals. In some implementations, the data processing apparatus 3030 can Fourier transform the images to generate spectroscopic images of the sample 3020. In some cases, the data processing apparatus 3030 includes remote systems for data processing. For example, in some cases, spectroscopic images are transferred to a remote Linux system for data analysis.

In one aspect of operation, the sample 3020 is subject to the external magnetic field generated by the magnet 3012. In response to the external magnetic field, a portion of the nuclear spins in the sample 3020 are polarized along an axis defined by the external magnetic field, and the sample acquires a bulk magnetic moment along the axis. The RF system 3014 and/or the gradient system 3018 manipulate the nuclear spins, for example, according to a pulse sequence that includes multiple radio frequency (rf) pulses, delays, and/or magnetic field gradients. The RF system 3014 acquires a signal generated by the nuclear spins in the sample 3020 in response to the pulse sequence. The data processing apparatus 3030 receives the acquired signals and generates images based on the signals.

Figure 31:
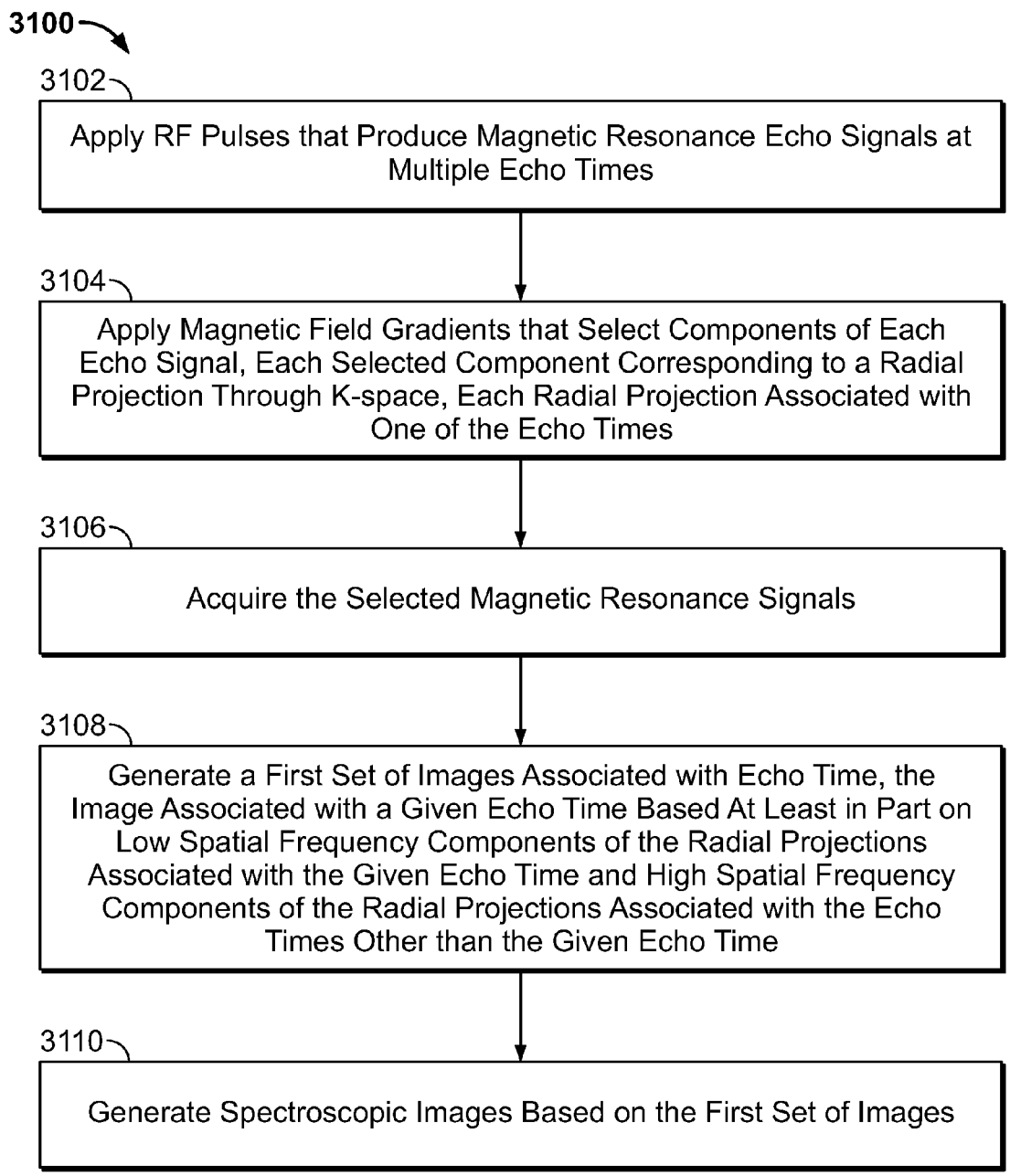
FIG. 31 is a flow chart illustrating an example process for magnetic resonance imaging with short echo times.

FIG. 31 is a flow chart illustrating an example process 3100 for magnetic resonance imaging with short echo times. The process 3100 can be used, for example, to generate the example images of FIGS. 3A-3C, 5-7, 9, 12-15, and 25-28. All or some aspects of the process 3100 can be implemented, for example, using the components of the system 3000 of FIG. 30. All or some aspects of the process 3100 can be implemented, for example, according to the acquisition schemes 100*a*, 100*b*, and/or 100*c* of FIGS. 1A-1C. In some implementations, the process 3100 includes the same, different, fewer, or additional operations in the same or a different order.

RF pulses are applied to a sample in order to produce magnetic resonance echo signals at multiple different echo times (3102). For example, the rf pulses can include one or more half pulses to generate echo signals having ultrashort echo times. One or more gradient fields can be applied during the applied rf pulses. For example, a slice selection gradient may be applied while the rf pulses are applied. In some implementations, an rf half pulse is applied once while a slice selection gradient field is applied, and then the rf half pulse is applied again while the slice selection gradient field is applied with an inverted polarity. In this case, data from the both experiments corresponding is combined to produce data for a single slice. In some cases, an ultrashort echo time is achieved by the combination of half pulse excitation, VERSE, radial ramp sampling, fast transmit/receive switching, and other techniques.

In addition to the rf pulses configured to produce echo signals, one or more additional rf pulses can be applied to the sample to suppress a signal from nuclear spins having a long transverse relaxation time. For example, a 900 adiabatic pulse can be applied to saturate long T2 spins, or a 1800 adiabatic pulse can be applied to invert long T2 spins. Inverting the long T2 spins can be followed by a delay period that allows the long T2 spins to reach a null point (i.e., substantially zero longitudinal magnetization) as a result of T1 relaxation. Long T2 signals may be suppressed, for example, in order to acquire a magnetic resonance signal generated by nuclear spins in the sample having a short T2. For example, long T2 signals from water and/or fat may be suppressed in order to image short T2 signals.

Magnetic field gradients that select components of each echo signal are applied to the sample (3104). Each selected component corresponds to a radial projection through a spatial frequency domain of the sample (i.e., k-space). Each radial projection is associated with one of the echo times. In some cases, each radial projection includes a radial half projection that defines a projection angle through the domain from proximate a radial origin of the domain to a radial perimeter of the domain. The gradients can be configured such that the projection angles defined by the radial projections are uniformly distributed in the spatial frequency domain from zero radians to $2\pi$ radians. The radial projections can be associated with the echo times such that the group of radial projections associated with each echo time defines a group of projection angles uniformly distributed in the spatial frequency domain from zero radians to $2\pi$ radians.

The selected magnetic resonance signals are acquired (3106). In some cases, the data acquired for each radial projection includes a plurality of data points ranging from the origin of the spatial frequency domain to a (non-zero) radius in the spatial frequency domain. In some cases, the data points for a each projection sparsely sample the spatial frequency domain. For example, a physical feature of the sample may define a Nyquist sampling criterion for imaging the feature, and the plurality of data points in a given radial trajectory may sample the spatial frequency domain below the Nyquist sampling criterion. The Nyquist sampling criterion may indicate a minimum distance between equally spaced data points in k-space for imaging features of a given length scale.

A first set of images is generated (3108). Each image is associated with one of the echo times. The image associated with a given echo time is generated based at least in part on low spatial frequency components of the radial projections associated with the given echo time and high spatial frequency components of the radial projections associated with the echo times other than the given echo time. In some cases, the image associated with a given echo time is based at least in part on all of the data points in a first subset of the radial projections associated with the given echo time. In some cases, the image associated with the given echo time is additionally based on a subset of the data points in a second subset of the radial projections associated with an echo time other than the given echo time. In some implementations, the subset of data points in the second subset of radial projections includes data points ranging from a second radius in the spatial frequency domain to a radial perimeter of the spatial frequency domain.

In some cases, a tornado filter is applied to generate the first set of images. For example, the tornado filter may reduce streak artifacts in one or more of the images. In some cases a sliding window reconstruction is applied to reduce streak artifacts in the images.

A set of spectroscopic images is generated based on the first set of images (3110). In some implementations, the spectroscopic images are generated by Fourier transforming at least a portion of the first plurality of images. In some implementations, streak artifacts are shifted to high and/or low frequency spectroscopic images, while on-resonance images are substantially free of streak artifacts.

Figure 32:
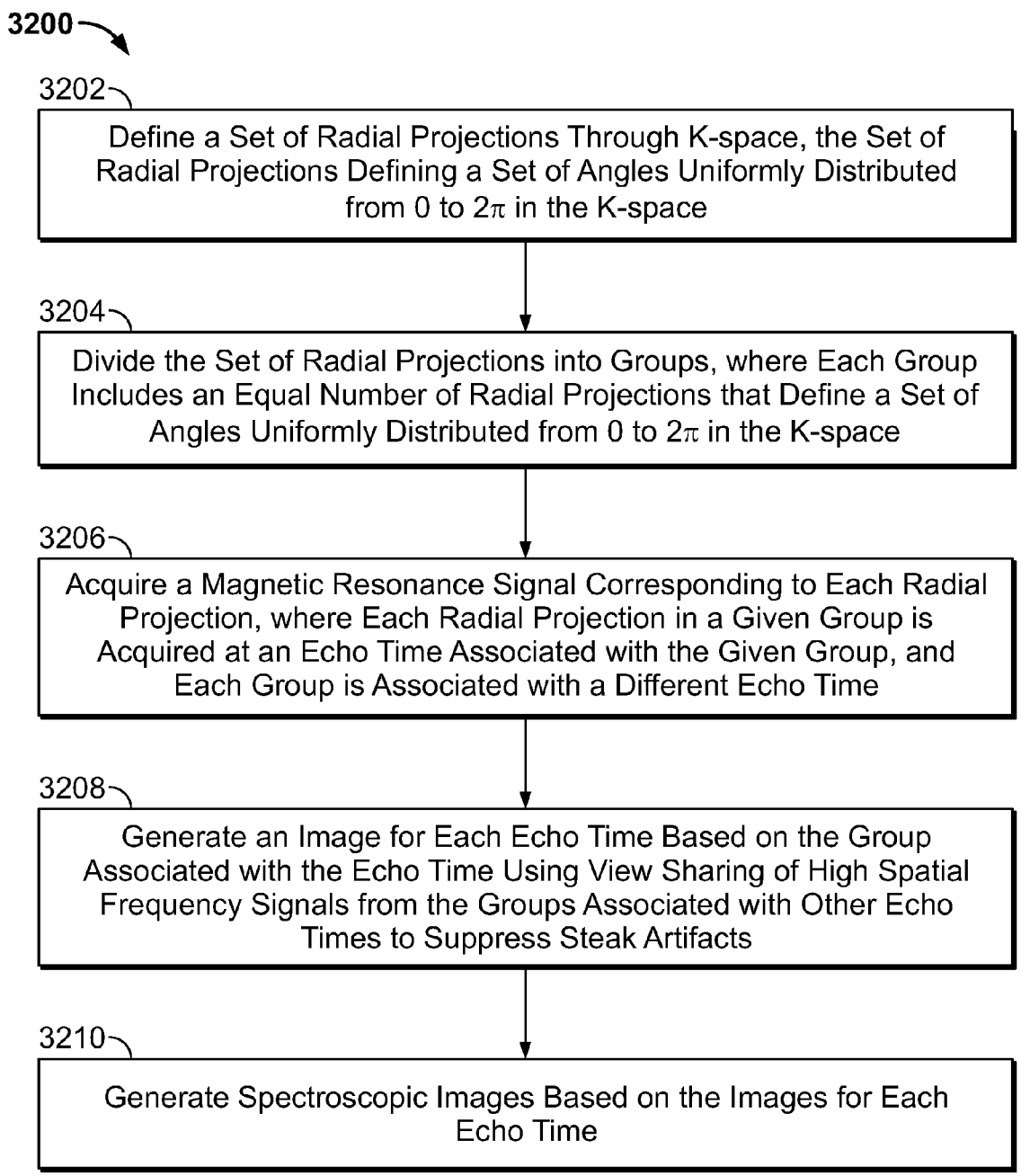
FIG. 32 is a flow chart illustrating an example process for magnetic resonance imaging with short echo times.

FIG. 32 is a flow chart illustrating an example process for magnetic resonance imaging with short echo times. The process 3200 can be used, for example, to generate the example images of FIGS. 3A-3C, 5-7, 9, 12-15, and 25-28. All or some aspects of the process 3200 can be implemented, for example, using the components of the system 3000 of FIG. 30. All or some aspects of the process 3200 can be implemented, for example, according to the acquisition schemes 100a, 100b, and/or 100c of FIGS. 1A-1C. In some implementations, the process 3200 includes the same, different, fewer, or additional operations in the same or a different order.

A set of radial projections are defined in the k-space (i.e., spatial frequency domain) of a sample (3202). Each radial projection defines an angle in the k-space. The set of radial projections defines a set of angles that are uniformly distributed from zero to $2\pi$ radians. The set of radial projections are divided into groups (3204). Each group includes an equal number of radial projections. The radial projections in each individual group are uniformly distributed from zero to $2\pi$ radians. In some cases, each group of radial projections includes the same number of radial projections.

A magnetic resonance (MR) signal corresponding to each radial projection is acquired (3206). Each group is associated with a different echo time, and the signals corresponding to the radial projections in a given group are all acquired with an echo time associated with the given group. For example, a first group is acquired with an echo time of 8 µs, a second group is acquired with an echo time of 88 µs, a third group is acquired with an echo time of 168 µs, and etc.

An image is generated for each echo time (3208). An image for a given echo time is generated based on at least part of all of the radial projections. An image for a given echo time is generated based on the group of radial projections associated with the given echo time and view sharing of high spatial frequency data of the radial projections in other groups. For example, the view sharing image reconstruction algorithm of FIGS. 2A-2B can be used to generate an image in order to reduce streak artifacts. One or more spectroscopic images is generated based on the images for each echo time (3210).

Embodiments of the subject matter and the functional operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer program products, i.e., one or more modules of computer program instructions encoded on a tangible program carrier for execution by, or to control the operation of, data processing apparatus. The tangible program carrier can be a propagated signal or a computer readable medium. The propagated signal is an artificially generated signal, e.g., a machine-generated electrical, optical, or electromagnetic signal, that is generated to encode information for transmission to suitable receiver apparatus for execution by a computer. The computer readable medium can be a machine-readable storage device, a machine-readable storage substrate, a memory device, a composition of matter effecting a machine-readable propagated signal, or a combination of one or more of them.

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, or declarative or procedural languages, and it can be deployed in any form, including as a stand alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device.

Computer readable media suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, input from the user can be received in any form, including acoustic, speech, or tactile input.

Embodiments of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described is this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client-server relationship to each other.

While this specification contains many specifics, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

A number of implementations have been described. Nevertheless, it will be understood that various modifications may be made. Accordingly, other implementations are within the scope of the following claims.

What is claimed is:

1. A method of magnetic resonance imaging comprising:
applying to a sample at least one radio frequency (rf) pulse configured to produce a plurality of magnetic resonance echo signals from the sample, each echo signal corresponding to one of a plurality of echo times;
applying to the sample magnetic field gradients configured to select for acquisition components of each of the magnetic resonance echo signals, the selected components corresponding to a plurality of groups of radial projections in a two-dimensional spatial frequency domain of the sample, each group associated with one of the plurality of echo times and defining a different plurality of projection angles in the spatial frequency domain, the groups interleaved to reduce streak artifacts in spectroscopic images associated with a resonance frequency;
acquiring the selected magnetic resonance signals; and
generating a plurality of images of the sample based on the acquired magnetic resonance signals, each image associated with one of the plurality of echo times, the image associated with a given echo time based at least in part on low spatial frequency components of the group of radial projections associated with the given echo time and high spatial frequency components of at least one other group of radial projections.

2. The method of claim 1, the plurality of images comprising a first plurality of images, the method further comprising generating a plurality of spectroscopic images of the sample based on the first plurality of images, wherein each of the plurality of spectroscopic images is associated with one of a plurality of temporal frequencies.

3. The method of claim 2, wherein generating a plurality of spectroscopic images of the sample based on the first plurality of images comprises Fourier transforming at least a portion of the first plurality of images.

4. The method of claim 2, wherein a first subset of the spectroscopic images associated with temporal frequencies far from the resonance frequency comprise streak artifacts.

5. The method of claim 4, wherein a second set of the spectroscopic images associated with temporal frequencies near the resonance frequency are substantially free of streak artifacts.

6. The method of claim 1, wherein generating a plurality of images comprises generating the image associated with the given echo time based additionally on high spatial frequency components of the group associated with the given echo time.

7. The method of claim 1, further comprising applying to the sample at least one rf pulse configured to suppress a signal from nuclear spins in the sample having a first transverse relaxation rate, and acquiring the selected magnetic resonance signals comprises acquiring a magnetic resonance signal generated by nuclear spins in the sample having a second transverse relaxation rate faster than the first transverse relaxation rate.

8. The method of claim 1, wherein acquiring the selected magnetic resonance signals comprises acquiring the selected magnetic resonance signals according to a radial ramp sampling algorithm.

9. The method of claim 1, wherein applying to a sample at least one radio frequency (rf) pulse comprises:
applying to the sample an rf half pulse while applying to the sample a slice selection gradient; and
applying to the sample the rf half pulse while applying to the sample the slice selection gradient with an inverted polarity.

10. The method of claim 1, wherein applying to the sample at least one rf pulse comprises applying to the sample an rf pulse configured to produce a magnetic resonance echo signal from the sample at an echo time of less than ten microseconds after the end of the rf pulse.

11. The method of claim 1, wherein applying to the sample magnetic field gradients comprises applying to the sample magnetic field gradients configured such that the plurality of projection angles defined by each group are uniformly distributed in the spatial frequency domain from zero radians to $2\pi$ radians.

12. The method of claim 1, wherein the group of radial projections associated with the given echo time comprises a plurality of data points that sparsely sample the spatial frequency domain.

13. The method of claim 12, wherein a physical feature of the sample defines a Nyquist sampling criterion for imaging the feature, and the plurality of data points sample the spatial frequency domain below the Nyquist sampling criterion.

14. The method of claim 1, wherein each of the projections comprises a plurality of data points ranging from a first radius in a low spatial frequency region of the domain to a second radius in a high spatial frequency region of the domain, and the image associated with a given echo time is based at least in part on:
all of the data points in a first group of radial projections associated with the given echo time, the first group defining projection angles uniformly distributed from zero radians to $2\pi$ radians; and
a subset of the data points in a second group of radial projections associated with an echo time other than the given echo time, the subset of data points comprising data points ranging from a third radius in the domain to the second radius, wherein the third radius represents a higher spatial frequency than the first radius and a lower spatial frequency than the second radius, the second group defining projection angles uniformly distributed from zero radians to $2\pi$ radians.

15. The method of claim 1, wherein generating a plurality of images of the sample based on the acquired magnetic resonance signals comprises applying a tornado filter to suppress streak artifacts in the images.

16. The method of claim 1, each radial projection comprising a radial half projection defining a projection angle through the domain from proximate a radial origin of the domain to a radial perimeter of the domain.

17. An article comprising a machine-readable medium storing instructions for causing a magnetic resonance imaging apparatus to perform operations comprising:
applying to a sample a pulse sequence comprising radio frequency (rf) pulses and magnetic field gradients, the pulse sequence configured to produce a plurality of magnetic resonance echo signals from the sample at a plurality of echo times;
acquiring data based on the magnetic resonance echo signals, the data comprising a plurality of groups of radial projections in a spatial frequency domain of the sample, each group comprising radial projections acquired at a different one of the echo times, the groups interleaved to reduce streak artifacts in spectroscopic images associated with a resonance frequency; and
generating a plurality of images of the sample based on the acquired data, each image associated with one of the echo times, an image associated with a given echo time based at least in part on low spatial frequency components of the group of radial projections acquired at the given echo time and high spatial frequency components of at least one other group of radial projections.

18. The article of claim 17, wherein the machine-readable medium stores instructions for causing magnetic resonance imaging apparatus to perform further operations comprising generating spectroscopic images of the sample based on the plurality of images, wherein each of the plurality of spectroscopic images is associated with one of a plurality of temporal frequencies.

19. The article of claim 18, wherein the machine-readable medium stores instructions for causing magnetic resonance imaging apparatus to perform further operations comprising estimating a transverse relaxation rate of nuclear spins in the sample based at least in part on the spectroscopic images.

20. The article of claim 18, wherein the machine-readable medium stores instructions for causing magnetic resonance imaging apparatus to perform further operations comprising estimating a T2 of nuclear spins in the sample based at least in part on the spectroscopic images, wherein the estimated T2 comprises a value less than one millisecond.

21. A magnetic resonance imaging system comprising:
an rf module that acquires magnetic resonance echo signals from a sample and generates radio frequency (rf) pulses configured to produce a plurality of magnetic resonance echo signals from the sample, each echo signal corresponding to one of a plurality of echo times;
a gradient module that applies to the sample magnetic field gradients configured to select for acquisition components of each of the magnetic resonance echo signals, each selected component corresponding to a group of radial projections in a two-dimensional spatial frequency domain of the sample, each group associated with one of the plurality of echo times and defining a different plurality of projection angles in the spatial frequency domain, the groups interleaved to reduce streak artifacts in spectroscopic images associated with a resonance frequency; and
a processor that generates a plurality of images of the sample based on the acquired magnetic resonance signals, each image associated with one of the plurality of echo times, the image associated with a given echo time based at least in part on low spatial frequency components of the group associated with the given echo time and high spatial frequency components of at least one other group.

22. The system of claim 21, wherein the rf module and the gradient module are configured to acquire an echo signal having an echo time less than ten microseconds.

23. The system of claim 21, wherein the rf module is configured to implement fast switching between an rf signal transmit mode and an rf signal receive mode.

24. The system of claim 21, wherein the rf module is configured to apply to the sample an rf half pulse for producing magnetic resonance echo signals having ultrashort echo times.

25. The system of claim 21, wherein each group defines a different group of projection angles uniformly distributed in the spatial frequency domain from zero radians to $2\pi$ radians.

26. The system of claim 21, wherein the processor is configured to apply a tornado filter to suppress streak artifacts in the images.

27. The system of claim 21, wherein the image associated with the given echo time is additionally based on high spatial frequency components of the group associated with the given echo time.

28. A magnetic resonance imaging system comprising:
a means for applying to a sample radio frequency (rf) pulses configured to produce a plurality of magnetic resonance echo signals from the sample, each echo signal corresponding to one of a plurality of echo times;
a means for applying to the sample magnetic field gradients configured to select for acquisition components of each of the magnetic resonance echo signals, each selected component corresponding to a radial projection in a two-dimensional spatial frequency domain of the sample, each group associated with one of the plurality of echo times and defining a different plurality of projection angles in the spatial frequency domain, the groups interleaved to reduce streak artifacts in spectroscopic images associated with a resonance frequency;
a means for acquiring magnetic resonance echo signals from the sample; and
a means for generating a plurality of images of the sample based on the acquired magnetic resonance signals, each image associated with one of the plurality of echo times, the image associated with a given echo time based at least in part on the group of radial projections associated with the given echo time.

29. The system of claim 28, further comprising a means for generating spectroscopic images of the sample based on the plurality of images, wherein each of the plurality of spectroscopic images is associated with one of a plurality of temporal frequencies.

30. The system of claim 28, further comprising means for rotating the sample with respect to a principal magnetic field to allow the sample to be imaged at a plurality of angular orientations with respect to a primary axis defined by the principal magnetic field.

* * * * *